(12) United States Patent
Dokania et al.

(10) Patent No.: US 12,190,946 B1
(45) Date of Patent: ***Jan. 7, 2025

(54) READ DISTURB MITIGATION FOR NON-LINEAR POLAR MATERIAL BASED MULTI-CAPACITOR BIT-CELL

(71) Applicant: Kepler Computing Inc., San Francisco, CA (US)

(72) Inventors: Rajeev Kumar Dokania, Beaverton, OR (US); Mustansir Yunus Mukadam, Seattle, WA (US); Tanay Gosavi, Portland, OR (US); James David Clarkson, El Sobrante, CA (US); Neal Reynolds, Bremerton, WA (US); Amrita Mathuriya, Portland, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 17/805,664

(22) Filed: Jun. 6, 2022

Related U.S. Application Data

(63) Continuation of application No. 17/805,438, filed on Jun. 3, 2022.

(51) Int. Cl.
*G11C 11/22* (2006.01)
*G11C 11/401* (2006.01)
*G11C 11/419* (2006.01)

(52) U.S. Cl.
CPC ............ *G11C 11/419* (2013.01); *G11C 11/22* (2013.01); *G11C 11/221* (2013.01); *G11C 11/2275* (2013.01); *G11C 11/401* (2013.01)

(58) Field of Classification Search
CPC ...... G11C 11/419; G11C 11/22; G11C 11/221; G11C 11/2275
See application file for complete search history.

(56) References Cited

U.S. PATENT DOCUMENTS

| 4,809,225 A | 2/1989 | Dimmler et al. |
| 4,853,893 A | 8/1989 | Eaton, Jr. et al. |
| (Continued) | | |

FOREIGN PATENT DOCUMENTS

| JP | H0982907 A | 3/1997 |
| JP | H10242426 A | 9/1998 |
| (Continued) | | |

OTHER PUBLICATIONS

Advisory Action notified Jul. 25, 2022 for U.S. Appl. No. 17/339,850.
(Continued)

*Primary Examiner* — Mushfique Siddique
(74) *Attorney, Agent, or Firm* — MUGHAL GAUDRY & FRANKLIN PC

(57) ABSTRACT

A disturb mitigation scheme is described for a 1TnC or multi-element ferroelectric gain bit-cell where after writing to a selected capacitor of the bit-cell, a cure phase is initiated. Between the cure phase and the write phase, there may be zero or more cycles where the selected word-line, bit-line, and plate-lines are pulled-down to ground. The cure phase may occur immediately before the write phase. In the cure phase, the word-line is asserted again just like in the write phase. In the cure phase, the voltage on bit-line is inverted compared to the voltage on the bit-line in the write phase. By programming a value in a selected capacitor to be opposite of the value written in the write phase of that selected capacitor, time accumulation of disturb is negated.

(Continued)

This allows to substantially zero out disturb field on the unselected capacitors of the same bit-cell and/or other unselected bit-cells.

18 Claims, 30 Drawing Sheets

(56) References Cited

U.S. PATENT DOCUMENTS

| | | | |
|---|---|---|---|
| 5,086,412 A | 2/1992 | Jaffe et al. |
| 5,218,566 A | 6/1993 | Papaliolios |
| 5,270,967 A | 12/1993 | Moazzami et al. |
| 5,307,304 A | 4/1994 | Saito et al. |
| 5,381,364 A | 1/1995 | Chern et al. |
| 5,383,150 A | 1/1995 | Nakamura et al. |
| 5,539,279 A | 7/1996 | Takeuchi et al. |
| 5,541,872 A | 7/1996 | Lowrey et al. |
| 5,638,318 A | 6/1997 | Seyyedy |
| 5,640,030 A | 6/1997 | Kenney |
| 5,760,432 A | 6/1998 | Abe et al. |
| 5,917,746 A | 6/1999 | Seyyedy |
| 5,926,413 A | 7/1999 | Yamada et al. |
| 5,969,380 A | 10/1999 | Seyyedy |
| 6,002,608 A | 12/1999 | Tanabe |
| 6,028,784 A | 2/2000 | Mori et al. |
| 6,031,754 A | 2/2000 | Derbenwick et al. |
| 6,043,526 A | 3/2000 | Ochiai |
| 6,147,895 A | 11/2000 | Kamp |
| 6,274,388 B1 | 8/2001 | Aggarwal et al. |
| 6,301,145 B1 | 10/2001 | Nishihara |
| 6,346,741 B1 | 2/2002 | Buskirk et al. |
| 6,356,475 B1 * | 3/2002 | Tamura .................. G11C 11/22 |
| | | | 365/189.15 |
| 6,358,810 B1 | 3/2002 | Dornfest et al. |
| 6,388,281 B1 | 5/2002 | Jung et al. |
| 6,448,911 B1 | 9/2002 | Somayajula |
| 6,483,737 B2 | 11/2002 | Takeuchi et al. |
| 6,500,678 B1 | 12/2002 | Aggarwal et al. |
| 6,515,957 B1 | 2/2003 | Newns et al. |
| 6,548,343 B1 | 4/2003 | Summerfelt et al. |
| 6,587,367 B1 | 7/2003 | Nishimura et al. |
| 6,590,245 B2 | 7/2003 | Ashikaga |
| 6,610,549 B1 | 8/2003 | Aggarwal et al. |
| 6,635,497 B2 | 10/2003 | Aggarwal et al. |
| 6,643,163 B2 | 11/2003 | Takashima |
| 6,646,906 B2 | 11/2003 | Salling |
| 6,656,301 B2 | 12/2003 | Kirby |
| 6,656,748 B2 | 12/2003 | Hall et al. |
| 6,713,342 B2 | 3/2004 | Celii et al. |
| 6,717,838 B2 | 4/2004 | Hosoi |
| 6,720,600 B2 | 4/2004 | Okita |
| 6,728,128 B2 | 4/2004 | Nishimura et al. |
| 6,734,477 B2 | 5/2004 | Moise et al. |
| 6,795,331 B2 | 9/2004 | Noro |
| 6,798,686 B2 | 9/2004 | Takashima |
| 6,809,949 B2 | 10/2004 | Ho |
| 6,819,584 B2 | 11/2004 | Noh |
| 6,856,534 B2 | 2/2005 | Rodriguez et al. |
| 6,873,536 B2 | 3/2005 | Komatsuzaki |
| 6,906,944 B2 | 6/2005 | Takeuchi et al. |
| 6,924,997 B2 | 8/2005 | Chen et al. |
| 7,029,925 B2 | 4/2006 | Celii et al. |
| 7,173,844 B2 | 2/2007 | Lee et al. |
| 7,405,959 B2 | 7/2008 | Koide et al. |
| 7,426,130 B2 | 9/2008 | Jeon |
| 7,514,734 B2 | 4/2009 | Aggarwal et al. |
| 7,642,099 B2 | 1/2010 | Fukada et al. |
| 7,791,922 B2 | 9/2010 | Doumae et al. |
| 7,812,385 B2 | 10/2010 | Noda |
| 8,129,200 B2 | 3/2012 | Kang |
| 8,177,995 B2 | 5/2012 | Kobayashi et al. |
| 8,300,446 B2 | 10/2012 | Qidwai |
| 8,441,833 B2 | 5/2013 | Summerfelt et al. |
| 8,508,974 B2 | 8/2013 | Clinton et al. |
| 8,665,628 B2 | 3/2014 | Kawashima |
| 8,717,800 B2 | 5/2014 | Clinton et al. |
| 8,865,628 B2 | 10/2014 | Manabe et al. |
| 9,472,560 B2 | 10/2016 | Ramaswamy et al. |
| 9,620,206 B2 | 4/2017 | Nazarian et al. |
| 9,786,348 B1 | 10/2017 | Kawamura et al. |
| 9,812,204 B1 | 11/2017 | Yan et al. |
| 9,818,468 B2 | 11/2017 | Müller |
| 9,830,969 B2 | 11/2017 | Slesazeck et al. |
| 9,899,085 B1 * | 2/2018 | Yan .................... G11C 14/0072 |
| 10,043,567 B2 | 8/2018 | Slesazeck et al. |
| 10,354,712 B2 | 7/2019 | Derner et al. |
| 10,600,808 B2 | 3/2020 | Schröder |
| 10,847,201 B2 | 11/2020 | Manipatruni et al. |
| 10,872,905 B2 | 12/2020 | Müller |
| 10,963,776 B2 | 3/2021 | Mulaosmanovic et al. |
| 10,998,025 B2 | 5/2021 | Manipatruni et al. |
| 11,107,516 B1 | 8/2021 | Rabkin et al. |
| 11,335,391 B1 | 5/2022 | Ocker et al. |
| 11,423,967 B1 | 8/2022 | Dokania et al. |
| 11,482,270 B1 | 10/2022 | Dokania et al. |
| 2002/0079520 A1 | 6/2002 | Nishihara et al. |
| 2002/0125517 A1 | 9/2002 | Nakamura |
| 2002/0153550 A1 | 10/2002 | An et al. |
| 2003/0012984 A1 | 1/2003 | Ueda |
| 2003/0112650 A1 | 6/2003 | Kang |
| 2003/0119211 A1 | 6/2003 | Summerfelt et al. |
| 2003/0129847 A1 | 7/2003 | Celii et al. |
| 2003/0137866 A1 | 7/2003 | Nishihara |
| 2003/0141528 A1 | 7/2003 | Ito |
| 2003/0174553 A1 * | 9/2003 | Saito .................... G11C 11/5657 |
| | | | 257/E27.085 |
| 2004/0027873 A1 | 2/2004 | Nishihara |
| 2004/0089854 A1 | 5/2004 | Chen et al. |
| 2004/0104754 A1 | 6/2004 | Bruchhaus et al. |
| 2004/0129961 A1 | 7/2004 | Araujo et al. |
| 2004/0174731 A1 * | 9/2004 | Saito ...................... G11C 11/22 |
| | | | 257/E27.085 |
| 2004/0233696 A1 | 11/2004 | Kang |
| 2004/0245547 A1 | 12/2004 | Stipe |
| 2005/0012126 A1 | 1/2005 | Udayakumar et al. |
| 2005/0214954 A1 | 9/2005 | Maruyama et al. |
| 2005/0230725 A1 | 10/2005 | Aggarwal et al. |
| 2005/0244988 A1 | 11/2005 | Wang et al. |
| 2006/0001070 A1 | 1/2006 | Park et al. |
| 2006/0002170 A1 | 1/2006 | Kumura et al. |
| 2006/0006447 A1 | 1/2006 | Kim et al. |
| 2006/0073613 A1 | 4/2006 | Aggarwal et al. |
| 2006/0073614 A1 | 4/2006 | Hara |
| 2006/0134808 A1 | 6/2006 | Summerfelt et al. |
| 2006/0138507 A1 | 6/2006 | Kijima et al. |
| 2006/0160300 A1 | 7/2006 | Weis |
| 2006/0258113 A1 | 11/2006 | Sandhu et al. |
| 2007/0275484 A1 | 11/2007 | Mitsui |
| 2007/0298521 A1 | 12/2007 | Obeng et al. |
| 2008/0025063 A1 | 1/2008 | Kang |
| 2008/0073680 A1 | 3/2008 | Wang |
| 2008/0081380 A1 | 4/2008 | Celii et al. |
| 2008/0101107 A1 | 5/2008 | Shiga et al. |
| 2008/0107885 A1 | 5/2008 | Alpay et al. |
| 2008/0191252 A1 | 8/2008 | Nakamura et al. |
| 2009/0003042 A1 | 1/2009 | Lee et al. |
| 2009/0251950 A1 | 10/2009 | Klostermann |
| 2012/0127776 A1 | 5/2012 | Kawashima |
| 2012/0134196 A1 | 5/2012 | Evans, Jr. et al. |
| 2012/0307545 A1 | 12/2012 | McAdams et al. |
| 2012/0313218 A1 | 12/2012 | Fujimori et al. |
| 2013/0147295 A1 | 6/2013 | Shimizu |
| 2014/0063924 A1 | 3/2014 | Nakai et al. |
| 2014/0208041 A1 | 7/2014 | Hyde et al. |
| 2014/0211533 A1 * | 7/2014 | Khanna ................. G11C 11/221 |
| | | | 365/145 |
| 2014/0247642 A1 | 9/2014 | Madhan et al. |
| 2015/0069481 A1 | 3/2015 | Sun et al. |
| 2015/0294702 A1 | 10/2015 | Lee et al. |
| 2017/0069735 A1 | 3/2017 | Oh et al. |
| 2017/0277459 A1 | 9/2017 | Rodriguez et al. |
| 2017/0345831 A1 | 11/2017 | Chavan et al. |
| 2018/0082981 A1 | 3/2018 | Gowda |

(56) References Cited

U.S. PATENT DOCUMENTS

| | | | |
|---|---|---|---|
| 2018/0166453 A1 | 6/2018 | Müller |
| 2018/0226418 A1 | 8/2018 | Morandi et al. |
| 2018/0286987 A1 | 10/2018 | Lee et al. |
| 2018/0323309 A1 | 11/2018 | Ando et al. |
| 2018/0331113 A1 | 11/2018 | Liao et al. |
| 2019/0051642 A1 | 2/2019 | Hyde et al. |
| 2019/0051815 A1 | 2/2019 | Kakinuma et al. |
| 2019/0115353 A1 | 4/2019 | O'Brien et al. |
| 2019/0138893 A1 | 5/2019 | Sharma et al. |
| 2020/0004583 A1 | 1/2020 | Kelly et al. |
| 2020/0051607 A1 | 2/2020 | Pan et al. |
| 2020/0273864 A1 | 8/2020 | Manipatruni et al. |
| 2020/0273865 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0342932 A1 | 10/2020 | Bennett |
| 2020/0357453 A1 | 11/2020 | Slesazeck et al. |
| 2021/0090662 A1 | 3/2021 | Mennenga et al. |
| 2021/0111179 A1 | 4/2021 | Shivaraman et al. |
| 2021/0142837 A1 | 5/2021 | Yu et al. |
| 2021/0193209 A1 | 6/2021 | Swami et al. |
| 2021/0202507 A1 | 7/2021 | Thareja et al. |
| 2021/0398580 A1 | 12/2021 | Yuh |
| 2022/0069131 A1 | 3/2022 | Pesic |
| 2023/0132574 A1 | 5/2023 | Zhao et al. |

FOREIGN PATENT DOCUMENTS

| | | |
|---|---|---|
| JP | H10255484 A | 9/1998 |
| JP | H1174488 A | 3/1999 |
| JP | 2000174224 A | 6/2000 |
| JP | 2001237393 A | 8/2001 |
| JP | 2002026256 A | 1/2002 |
| JP | 2002158339 A | 5/2002 |
| JP | 2003123465 A | 4/2003 |
| JP | 2005057103 A | 3/2005 |
| JP | 2005142322 A | 6/2005 |
| JP | 2005322925 A | 11/2005 |
| JP | 2008210955 A | 9/2008 |
| JP | 2010021544 A | 1/2010 |
| JP | 2011151370 A | 8/2011 |
| JP | 2017518632 A | 7/2017 |
| KR | 20050105695 A | 11/2005 |
| TW | 200718237 A | 5/2007 |
| TW | 200919705 A | 5/2009 |
| TW | 200935151 A | 8/2009 |
| TW | 201227879 A | 7/2012 |
| TW | 201725736 A | 7/2017 |
| WO | 20130147295 | 10/2013 |
| WO | 2013147295 A4 | 7/2014 |
| WO | 2015167887 A1 | 11/2015 |
| WO | 2021112247 A1 | 6/2021 |

OTHER PUBLICATIONS

Final Office Action notified Aug. 15, 2022 for U.S. Appl. No. 17/346,083.
Final Office Action notified Sep. 12, 2022 for U.S. Appl. No. 17/367,217.
Non-Final Office Action notified Aug. 16, 2022 for U.S. Appl. No. 17/367,217.
Non-Final Office Action notified Jun. 15, 2022 for U.S. Appl. No. 17/367,101.
Non-Final Office Action notified Mar. 7, 2022 for U.S. Appl. No. 17/339,850.
Non-Final Office Action notified Mar. 30, 2022 for U.S. Appl. No. 17/346,083.
Non-Final Office Action notified Mar. 31, 2022 for U.S. Appl. No. 17/346,087.
Non-Final Office Action notified Oct. 12, 2022 for U.S. Appl. No. 17/530,365.
Non-Final Office Action notified Oct. 26, 2022 for U.S. Appl. No. 17/531,577.
Non-Final Office Action notified Sep. 1, 2022 for U.S. Appl. No. 17/339,850.
Non-Final Office Action notified Sep. 7, 2022 for U.S. Appl. No. 17/530,360.
Notice of Allowance notified Apr. 20, 2022 for U.S. Appl. No. 17/359,311.
Notice of Allowance notified Aug. 8, 2022 for U.S. Appl. No. 17/529,258.
Notice of Allowance notified Aug. 17, 2022 for U.S. Appl. No. 17/346,087.
Notice of Allowance notified Aug. 22, 2022 for U.S. Appl. No. 7/390,791.
Notice of Allowance notified Aug. 25, 2022 for U.S. Appl. No. 17/367,101.
Notice of Allowance notified Aug. 31, 2022 for U.S. Appl. No. 17/359,325.
Notice of Allowance notified Jun. 15, 2022 for U.S. Appl. No. 17/367,083.
Notice of Allowance notified Jun. 23, 2022 for U.S. Appl. No. 17/367,172.
Notice of Allowance notified Jun. 23, 2022 for U.S. Appl. No. 17/367,210.
Notice of Allowance notified Oct. 20, 2022 for Taiwan Patent Application No. 110129115.
Notice of Allowance notified Sep. 13, 2022 for U.S. Appl. No. 17/530,364.
Notice of Allowance notified Sep. 14, 2022 for U.S. Appl. No. 17/530,360.
Notice of Allowance notified Sep. 21, 2022 for U.S. Appl. No. 17/530,366.
Notice of Allowance notified Sep. 23, 2022 for U.S. Appl. No. 17/339,850.
Notice of Allowance notified Sep. 26, 2022 for U.S. Appl. No. 17/367,217.
Notice of Allowance notified Sep. 27, 2022 for U.S. Appl. No. 17/346,083.
Restriction Requirement notified Aug. 5, 2022 for U.S. Appl. No. 17/359,325.
Restriction Requirement notified Aug. 26, 2022 for U.S. Appl. No. 17/390,796.
Non-Final Office Action notified Sep. 15, 2022 for U.S. Appl. No. 17/315,111.
Non-Final Office Action notified Sep. 27, 2023 for U.S. Appl. No. 17/654,383.
Notice of Allowance notified Apr. 4, 2023 for U.S. Appl. No. 17/532,552.
Notice of Allowance notified Jan. 5, 2024 for Korean Patent Application No. 10-2021-7027261.
Notice of Allowance notified Jan. 10, 2024 for U.S. Appl. No. 17/654,379.
Notice of Allowance notified Jan. 12, 2021 for U.S. Appl. No. 16/287,876.
Notice of Allowance notified Jan. 18, 2024 for U.S. Appl. No. 17/654,383.
Notice of Allowance notified Jan. 20, 2023 for U.S. Appl. No. 17/532,657.
Notice of Allowance notified Jan. 30, 2023 for U.S. Appl. No. 17/531,535.
Notice of Allowance notified Jul. 3, 2023 for U.S. Appl. No. 17/532,647.
Notice of Allowance notified Jul. 6, 2023 for U.S. Appl. No. 17/654,560.
Notice of Allowance notified Jul. 27, 2020 for U.S. Appl. No. 16/287,927.
Notice of Allowance notified Jun. 9, 2022 for U.S. Appl. No. 16/288,006.
Notice of Allowance notified Jun. 10, 2022 for U.S. Appl. No. 16/288,004.
Notice of Allowance notified Jun. 13, 2022 for U.S. Appl. No. 16/287,953.
Notice of Allowance notified Jun. 16, 2023 for U.S. Appl. No. 17/532,652.

(56) References Cited

OTHER PUBLICATIONS

Notice of Allowance notified Jun. 26, 2023 for U.S. Appl. No. 18/061,270.
Notice of Allowance notified Mar. 13, 2023 for U.S. Appl. No. 17/516,577.
Notice of Allowance notified Mar. 15, 2023 for U.S. Appl. No. 17/516,293.
Notice of Allowance notified Mar. 17, 2023 for U.S. Appl. No. 17/532,545.
Notice of Allowance notified May 2, 2023 for U.S. Appl. No. 17/532,556.
Notice of Allowance notified Nov. 17, 2022 for U.S. Appl. No. 17/530,363.
Notice of Allowance notified Nov. 22, 2022 for U.S. Appl. No. 17/530,362.
Notice of Allowance notified Nov. 25, 2022 for U.S. Appl. No. 17/531,577.
Notice of Allowance notified Nov. 27, 2023 for U.S. Appl. No. 17/654,802.
Notice of Allowance notified Nov. 29, 2023 for U.S. Appl. No. 17/654,908.
Notice of Allowance notified Oct. 31, 2022 for U.S. Appl. No. 17/390,796.
Notice of Allowance notified Sep. 25, 2023 for U.S. Appl. No. 17/654,526.
Notice of Grant notified May 18, 2021 for Taiwan Patent Application No. 109106095.
Notice of Preliminary Rejection notified Oct. 28, 2022 for Korean Patent Application No. 10-2021-7027303.
Notice of Reasons for Rejection notified Dec. 6, 2022 for Japanese Patent Application No. 2021-546823.
Notice of Reasons for Rejection notified Nov. 22, 2022 for Japanese Patent Application No. 2021-546864.
Office Action notified May 16, 2023 for Japanese Patent Application No. 2021-546864.
Official Communication notified Jun. 22, 2023 for German Patent Application No. 112020000956.4.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.
Restriction Requirement notified Apr. 15, 2022 for U.S. Appl. No. 17/315,111.
Restriction Requirement notified Apr. 15, 2022 for U.S. Appl. No. 17/315,139.
Restriction Requirement notified Mar. 23, 2022 for U.S. Appl. No. 17/315,143.
Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps.187701. 6 pages.
Second Office Action notified Jul. 26, 2022 for Taiwan Patent Application No. 110129115.
Shim et al., "Process-property relationship in high-k ALD SrTiO3 and BaTiO3: a review", Journal of Materials Chemistry C. Issue 32, 2017. 8000-8013.
Song et al., "Oxidation Behavior of TiAlN Barrier Layers with and without Thin Metal Overlayers for Memory Capacitor Applications", Journal of Materials Research, vol. 17 Issue 7 Jul. 2002, pp. 1789-1794.
Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.
Wu et al., "Multiferroic Bismuth Ferrite-based Materials for Multifunctional Applications: Ceramic Bulks, Thin Films and Nanostructures", Progress in Materials Science 84 (2016) 335-402(29)DOI:10.1016/j.pmatsci.2016.09.001.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.
1st Office Action notified Dec. 11, 2020 for Taiwan Patent Application No. 109106095.
1st Taiwan Office Action notified Mar. 3, 2022 for Taiwan Patent Application No. 110129115.
Advisory Action notified Nov. 16, 2021 for U.S. Appl. No. 16/287,953.
Advisory Action notified Nov. 16, 2021 for U.S. Appl. No. 16/288,004.
Advisory Action notified Nov. 16, 2021 for U.S. Appl. No. 16/288,006.
Chandler, T. "An adaptive reference generation scheme for 1T1C FeRAMs", 2003 Symposium on VLSI Circuits. Digest of Technical Papers (IEEE Cat. No. 03CH37408), Kyoto, Japan, 2003, pp. 173-174.
Decision of Rejection notified Feb. 1, 2024 for Taiwan Patent Application No. 111150380.
Du et al., "Microstructure and thermal stability of Ti1—xAlxN coatings deposited by reactive magnetron co-sputtering", Physics Procedia vol. 18, 2011, pp. 222-226.
Final Office Action notified Apr. 25, 2022 for U.S. Appl. No. 16/287,953.
Final Office Action notified Feb. 5, 2024 for U.S. Appl. No. 17/654,564.
Final Office Action notified Feb. 5, 2024 for U.S. Appl. No. 17/654,905.
Final Office Action notified Jun. 13, 2022 for U.S. Appl. No. 17/339,850.
Final Office Action notified Mar. 12, 2024 for U.S. Appl. No. 17/654,764.
Final Office Action notified May 11, 2022 for U.S. Appl. No. 16/288,004.
Final Office Action notified May 11, 2022 for U.S. Appl. No. 16/288,006.
Final Office Action notified Oct. 7, 2021 for U.S. Appl. No. 16/287,953.
Final Office Action notified Oct. 7, 2021 for U.S. Appl. No. 16/288,004.
Final Office Action notified Oct. 7, 2021 for U.S. Appl. No. 16/288,006.
International Preliminary Report on Patentability notified Sep. 10, 2021 for PCT Patent Application No. PCT/US2020/018870.
International Preliminary Report on Patentability notified Sep. 10, 2021 for PCT Patent Application No. PCT/US2020/066963.
International Search Report & Written Opinion notified Jun. 19, 2020 for U.S. Patent Application No. PCT/US2020/018879.
International Search Report & Written Opinion notified Jun. 24, 2020 for PCT Patent Application No. PCT/US2020/018870.
Jung, D. et al., "Highly manufacturable 1T1C 4 Mb FRAM with novel sensing scheme," International Electron Devices Meeting 1999. Technical Digest (Cat. No. 99CH36318), Washington, DC, USA, 1999, pp. 279-282., International Electron Devices Meeting 1999. Technical Digest (Cat. No. 99CH36318), Washington, DC, USA, 1999, pp. 279-282.
Kim et al., "Anti-oxidation properties of TiAlN film prepared by plasma-assisted chemical vapor deposition and roles of Al", Thin Solid Films vol. 307, Issues 1-2, Oct. 10, 1997, pp. 113-119.
Koo et al., "Study on the characteristics of TiAlN thin film deposited by atomic layer deposition method", Journal of Vacuum Science & Technology A 19, 2831 (2001); https://doi.org/10.1116/1.1409375.
Leach, "Size and Texture Effects on Ferroelectrics", Purdue e-Pubs Open Access Dissertations Theses and Dissertations. Jan. 2014. 112 pages.
Man et al., "Microstructure, oxidation and H2-permeation resistance of TiAlN films deposited by DC magnetron Sputtering technique", Surface and Coatings Technology, vols. 180-181, Mar. 1, 2004, pp. 9-14.
Non-Final Office Action notified Aug. 5, 2020 for U.S. Appl. No. 16/287,953.
Non-Final Office Action notified Aug. 5, 2020 for U.S. Appl. No. 16/288,004.

(56) References Cited

OTHER PUBLICATIONS

Non-Final Office Action notified Aug. 5, 2020 for U.S. Appl. No. 16/288,006.
Non-Final Office Action notified Aug. 28, 2023 for U.S. Appl. No. 17/653,811.
Non-Final Office Action notified Aug. 30, 2023 for U.S. Appl. No. 17/654,526.
Non-Final Office Action notified Dec. 20, 2021 for U.S. Appl. No. 16/288,004.
Non-Final Office Action notified Dec. 28, 2023 for U.S. Appl. No. 17/805,665.
Non-Final Office Action notified Feb. 12, 2024 for U.S. Appl. No. 17/805,438.
Non-Final Office Action notified Jan. 2, 2024 for U.S. Appl. No. 17/653,811.
Non-Final Office Action notified Jan. 18, 2022 for U.S. Appl. No. 16/287,953.
Non-Final Office Action notified Jan. 19, 2022 for U.S. Appl. No. 16/288,006.
Non-Final Office Action notified Jun. 13, 2022 for U.S. Appl. No. 17/346,083.
Non-Final Office Action notified Jun. 26, 2020 for U.S. Appl. No. 16/287,876.
Non-Final Office Action notified Jun. 27, 2022 for U.S. Appl. No. 17/315,143.
Non-Final Office Action notified May 9, 2023 for U.S. Appl. No. 18/061,270.
Non-Final Office Action notified May 16, 2023 for U.S. Appl. No. 17/532,647.
Non-Final Office Action notified Nov. 4, 2022 for U.S. Appl. No. 17/530,362.
Non-Final Office Action notified Nov. 21, 2022 for U.S. Appl. No. 7/532,657.
Non-Final Office Action notified Nov. 28, 2022 for U.S. Appl. No. 17/532,552.
Non-Final Office Action notified Oct. 4, 2023 for U.S. Appl. No. 17/654,905.
Non-Final Office Action notified Oct. 12, 2023 for U.S. Appl. No. 17/654,564.
Non-Final Office Action notified Oct. 31, 2023 for U.S. Appl. No. 17/654,764.
Non-Final Office Action notified Sep. 14, 2023 for U.S. Appl. No. 17/654,379.

* cited by examiner

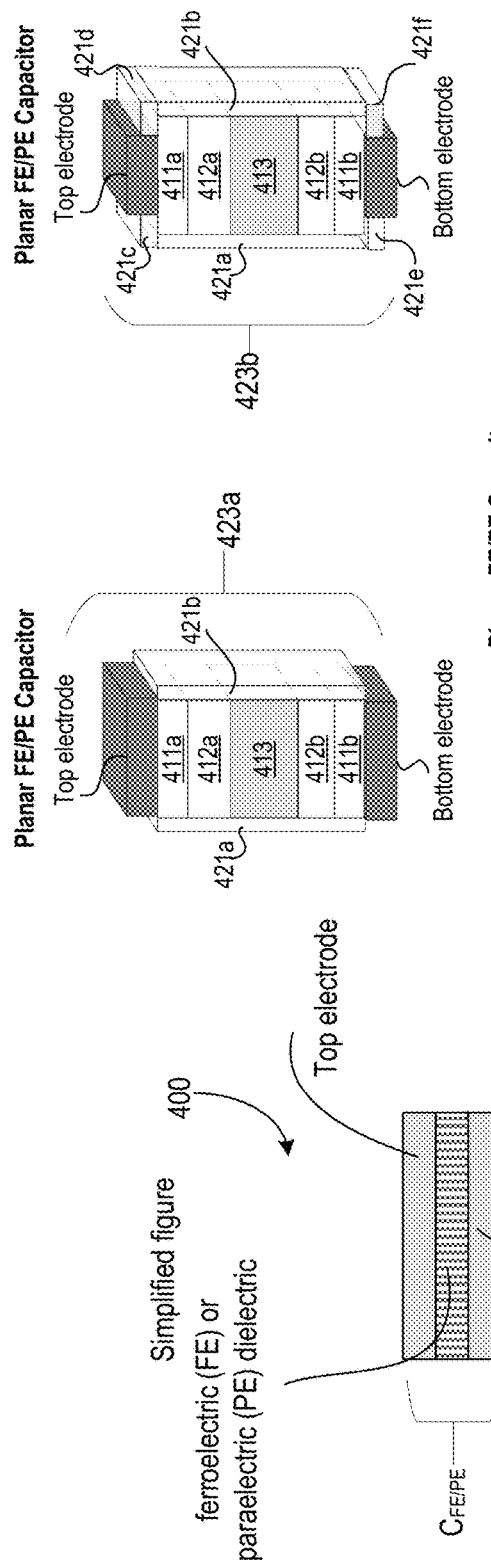
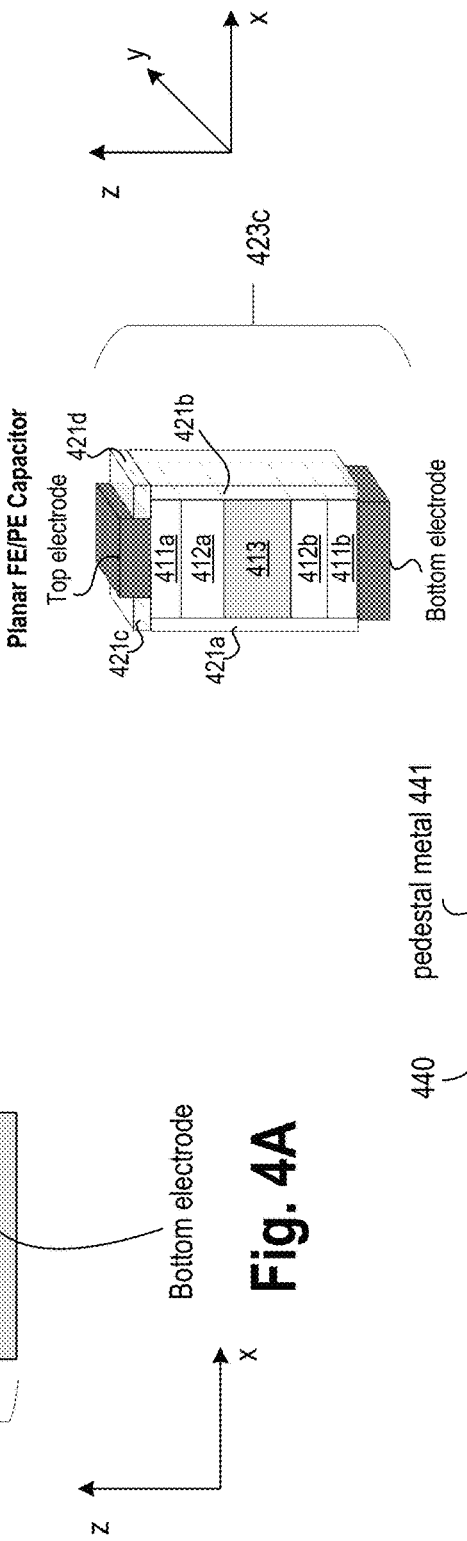
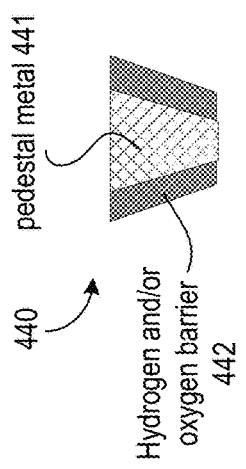
Fig. 4A
Fig. 4B
Fig. 4C

730

Plate-lines parallel to word-lines

Write Operation 1TnC bit-cell

READ DISTURB MITIGATION FOR NON-LINEAR POLAR MATERIAL BASED MULTI-CAPACITOR BIT-CELL

CLAIM FOR PRIORITY

This application is a continuation of, and claims the benefit of priority to U.S. patent application Ser. No. 17/805,438, filed on Jun. 3, 2022, titled "WRITE DISTURB MITIGATION FOR NON-LINEAR POLAR MATERIAL BASED MULTI-CAPACITOR BIT-CELL", and which is incorporated by reference in its entirety.

BACKGROUND

The standard memory used in processors is static random-access memory (SRAM) or dynamic random-access memory (DRAM), and their derivatives. These memories are volatile memories. For example, when power to the memories is turned off, the memories lose their stored data. Non-volatile memories are now commonly used in computing platforms to replace magnetic hard disks. Non-volatile memories retain their stored data for prolonged periods (e.g., months, years, or forever) even when power to those memories is turned off. Examples of non-volatile memories are magnetic random-access memory (MRAM), NAND, or NOR flash memories. These memories may not be suitable for low power and compact computing devices because these memories suffer from high write energy, low density, and high-power consumption.

Some memory bit-cells of a memory array may use multiple capacitors. Read and/or write operations on a selected capacitor of a bit-cell may disturb voltage on unselected capacitors of the same bit-cell. One way to mitigate disturb is to frequently refresh the data or charge on the capacitors. However, such frequent refresh consumes power and limits the availability of the memory array for servicing read and write request operations.

The background description provided here is for the purpose of generally presenting the context of the disclosure. Unless otherwise indicated here, the material described in this section is not prior art to the claims in this application and is not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates a planar ferroelectric or paraelectric capacitor structure, in accordance with some embodiments.

FIG. 4B illustrates three planar ferroelectric or paraelectric capacitor structures, respectively, in accordance with some embodiments.

FIG. 4C illustrates a pedestal that connects to the top and/or bottom electrodes of the planar ferroelectric or paraelectric capacitor.

DETAILED DESCRIPTION

Figure 1:
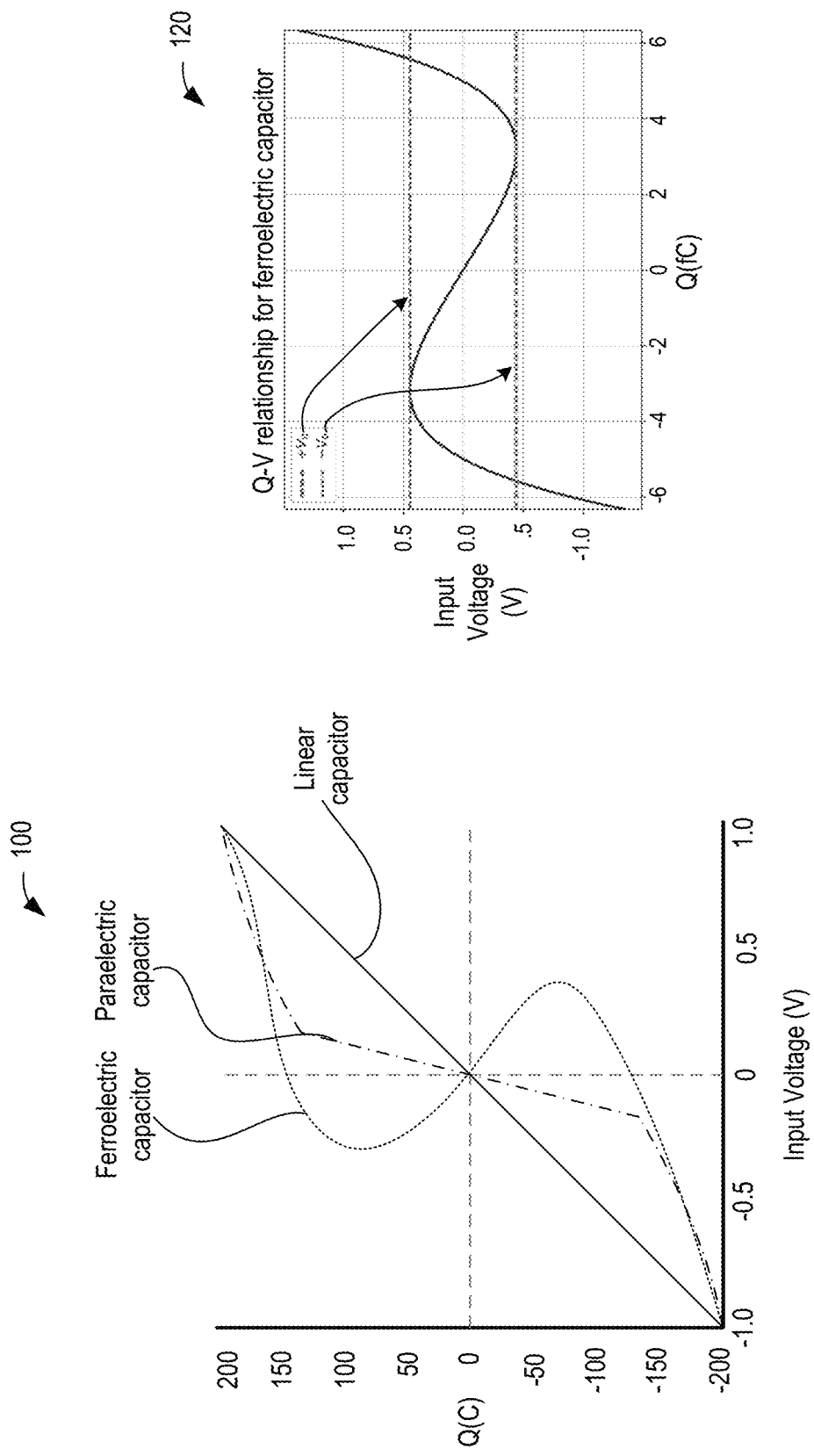
FIG. 1 illustrates a set of plots that show behavior of a ferroelectric capacitor, a paraelectric capacitor, and a linear capacitor.

Some embodiments describe a mechanism to mitigate disturb effect on unselected capacitors of a 1TnC bit-cell confirmation and a multi-element ferroelectric gain bit-cell configuration. In a 1TnC configuration, a bit cell comprises one select transistor and a plurality of capacitors. The transistor is controllable by a word-line and is coupled to a bit-line, while individual capacitors of the plurality of capacitor is coupled to an individual plate-line. A multi-element ferroelectric gain bit-cell is like a 1TnC cell but with an additional gain transistor which is biased and coupled to a select line. The gate of this additional transistor is coupled to the plurality of capacitors. In some embodiments, the capacitors of 1TnC and the multi-gain element bit-cell include ferroelectric or paraelectric material.

While memory with memory bit-cells comprising ferroelectric material provides a new class of non-volatile memories, traditional ferroelectric memories suffer from charge degradation over time, for example, during read operations. Such memories also suffer from charge disturbance when neighboring bit-cells are accessed. Such disturbance may be a function of routing configuration of plate-line(s), relative to bit-lines and word-lines. Further, leakage from transistors coupled to ferroelectric capacitor(s) may further degrade charge on a storage node connected to the capacitor.

Consider the case for an unselected memory bit-cell where word-line, which is coupled to a gate of an n-type transistor of the bit-cell, is at logic low. Continuing with this example, the plate-line is coupled to the capacitor while a bit-line is coupled to a source terminal or a drain terminal of the n-type transistor. In this case, transitions from logic low to logic high on the plate line results in a field across the ferroelectric capacitor of this unselected memory bit-cell. This field causes polarization decay for a ferroelectric material in the ferroelectric capacitor. The polarization decay causes the charge on the storage node to rise, which in turn weakens the disturb electric field across the ferroelectric material of the unselected bit-cell. The weakened disturb electric field causes the n-type transistor to leak, which in turn causes the disturb field to increase. As such, the unselected bit-cell suffers from charge disturb. Depending on the charge stored in the ferroelectric capacitor, this disturb field can either disturb or reinforce the stored value in the ferroelectric capacitor.

Parasitic capacitance (Cp) from the transistor (herein also referred to as the access transistor) and a dielectric component (Cdc) of the ferroelectric capacitor results in a capacitor divider. This capacitor divider causes a voltage drop across the ferroelectric capacitor of the unselected bit-cell. The voltage drop across the unselected ferroelectric capacitor can be approximately one-third to one-fourth of a voltage on the plate-line. In one example, when the plate-line voltage is twice the coercive voltage (Vc) of the ferroelectric capacitor, the disturb voltage can be two-thirds to one-half of the Ve for the unselected cell. Depending on the charge stored in the ferroelectric capacitor, this disturb voltage can either disturb or reinforce the stored value in the ferroelectric capacitor.

To mitigate such charge disturbance, the memory bit-cells may be refreshed, in accordance with some embodiments. For example, ferroelectric based random access memory (FeRAM) may apply a refresh scheme to make sure the contents in its capacitor remain valid. The refresh may be applied periodically or on an as needed basis. For instance, refresh may be applied every 1 second, or applied when a sensor determines that the contents on a storage node may have been disturbed. Refreshing the bit-cell is an operation that consumes power. It is desirable to reduce the number of refresh operations or separate them by a large time (e.g., several seconds) to reduce power consumption.

Continuing with the example of a ferroelectric-based memory bit-cell where the memory bit-cell is coupled to plate-lines, a word-line, and a bit-line, and/or a select or sense line. The routing of the plate-line(s) relative to the word-line or the bit-line impacts the performance of the bit-cell. Some embodiments describe a read and write scheme (herein referred to as a pulsing scheme) for memory arrays where plate-line(s) is/are parallel to a word-line. The pulsing schemes described with reference to various embodiments depend on a structure or configuration of a memory bit-cell. Some embodiments describe a pulsing scheme for a one-transistor, n-capacitors (1TnC) bit-cell configuration. Some embodiments describe a pulsing scheme for multi-element FE gain bit-cell configuration.

In some embodiments, the memory comprises one or more circuitries to boost the word-line above a voltage supply level (Vdd) during a write operation and a read operation. The boost level may range from 5% to 30% of Vdd, in some examples. In some embodiments, the boost is provided to offset the threshold (Vt) drop account the n-type device (e.g., NMOS) access transistor when the n-type device is to pass a signal close to Vdd signal. In some embodiments, the one or more circuitries generate a first pulse on the bit-line after the word-line is boosted and before an end of the boost on the word-line during a first write operation (e.g., Write 1). In some embodiments, to write a zero (e.g., a second write operation) to a selected capacitor of the 1TnC bit-cell, the bit-line is kept to logic low. These one or more circuitries can be circuitries on the periphery of the memory. In some embodiments, the one or more circuitries generate a second pulse on the plate-line after the word-line is boosted and before the end of the boost on the word-line. This second pulse is applied on the selected capacitor of the 1TnC bit-cell. The unselected plate-lines of the same bit-cell are set to half Vdd, while the word-line is boosted. The unselected plate-lines and word-lines of other different 1TnC bit-cells are set to 0V.

In some embodiments, after writing to a selected capacitor of a 1TnC bit-cell, a cure phase (e.g., a second phase) is initiated. In some embodiments, the cure phase can also be initiated before writing to the selected capacitor. Here, the writing to the selected capacitor is referred to as the write phase (e.g., a first phase). In some embodiments, between the cure phase and the write phase, there may be zero or more cycles (or asynchronous duration) where the selected word-line, bit-line, and plate-lines are pulled-down to ground. In some embodiments, in the cure phase, the word-line is asserted again just like in the write phase. In the cure phase, the voltage on bit-line is inverted compared to the voltage on the bit-line in the write phase. In various embodiments, in the cure phase, the plate-line of the selected bit-cell capacitor is set to half Vdd (or substantially half Vdd). In various embodiments, the plate-lines coupled to the unselected capacitors of the same bit-cell are also set to half Vdd (or substantially half Vdd). In various embodiments, the word-lines and the plate-lines of other unselected bit-cells are set to 0V during the cure phase.

By programming a value in a selected capacitor to be opposite of the value written in the write phase of that selected capacitor, time accumulation of disturb is negated. This allows to substantially zero out any disturb field on the unselected capacitors of the same bit-cell and/or other unselected bit-cells over the full write phase, thereby allowing for much longer duration between refresh requirements. A full write phase includes the actual write and cure phases. The same concept is applicable to a multi-element ferroelectric memory bit-cell. In some embodiments, the cure phase occurs immediately before the write phase. Other technical effects will be evident from the various figures and embodiments.

While various embodiments are described with reference to an FeRAM, the embodiments are applicable to other non-volatile memories (NVMs) such as magnetic random-access memory (MRAM), resistive RAM (ReRAM), ferroelectric RAM (FeRAM), paraelectric RAM (PeRAM), phase-change memory (PCM), etc.

In some embodiments, the NVM is integrated on a die which includes compute logic. In some embodiments, the NVM is a separate die which is packaged in a single package with a compute die. In some embodiments, the NVM is on a different package than the compute die. Here, examples of compute die include a die that is used for computations such as an inference logic, graphics processing unit (GPU), central processing unit (CPU), application specific integrated circuit (ASIC), digital signal processor (DSP), etc. In some embodiments, features of endurance mechanisms (e.g., randomizing mechanisms) are applicable to volatile memories such as static random-access memory (SRAM), and dynamic random-access memory (DRAM).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots showing behavior of a ferroelectric capacitor, a ferroelectric capacitor, and a linear capacitor. Plot 100 compares the transfer function for a linear capacitor, a ferroelectric (PE) capacitor (a nonlinear capacitor) and a ferroelectric (FE) capacitor (a nonlinear capacitor). Here, the x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly nonlinear transfer function in the polarization vs. voltage response. The threshold is related to a) nonlinearity of switching transfer function; and b) the squareness of the FE switching. The nonlinearity of switching transfer function is the width of the derivative of the polarization vs. voltage plot. The squareness is defined by the ratio of the remnant polarization to the saturation polarization, perfect squareness will show a value of 1. The squareness of the FE switching can be suitably manipulated with chemical substitution. For example, in $PbTiO_3$ a P-E (polarization-electric field) square loop can be modified by La or Nb substitution to create an S-shaped loop. The shape can be systematically tuned to ultimately yield a nonlinear dielectric. The squareness of the FE switching can also be changed by the granularity of an FE layer. A perfectly epitaxial, single crystalline FE layer will show higher squareness (e.g., ratio is closer to 1) compared to a polycrystalline FE. This perfect epitaxial can be accomplished using lattice matched bottom and top electrodes. In one example, BiFcO (BFO) can be epitaxially synthesized using a lattice matched $SrRuO_3$ bottom electrode yielding P-E loops that are square. Progressive doping with La will reduce the squareness.

Plot 120 shows the charge and voltage relationship for a ferroelectric capacitor. A capacitor with ferroelectric material (also referred to as a FEC) is a nonlinear capacitor with its potential VF (QF) as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100\ nm)^2$ and thickness 30 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or lanthanides). In some embodiments, the FE material is perovskite, which includes one or more of: La, Sr, Co, Sr, Ru, Y, Ba, Cu, Bi, Ca, and Ni. For example, metallic perovskites such as: (La,Sr) $CoO_3$, $SrRuO_3$, (La,Sr) $MnO_3$, $YBa_2Cu_3O_7$, $Bi_2Sr_2CaCu_2O_8$, $LaNiO_3$, $BaTiO_3$, $KNbO_3$, $NaTaO_3$, etc. may be used for the FE material. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted $BiFeO_3$, $BrCrO_3$, $BuCoO_3$ class of materials, La or rare earth substitution into the Bi site can tune the spontaneous distortion. In some embodiments, the FE material is contacted with a conductive metal oxide that includes one of the conducting perovskite metallic oxides exemplified by: La—Sr—$CoO_3$, $SrRuO_3$, La—Sr—$MnO_3$, $YBa_2Cu_3O_7$, $Bi_2Sr_2CaCu_2O_8$, and $LaNiO_3$.

In some embodiments, the FE material comprises a stack of layers including low voltage FE material between (or sandwiched between) conductive oxides. In various embodiments, when FE material is a perovskite, the conductive oxides are of the type AA'BB'$O_3$. A' is a dopant for atomic site A, it can be an element from the lanthanides series. B' is a dopant for atomic site B, it can be an element from the transition metal elements, especially Sc, Ti, V, Cr, Mn, Fe, Co, Ni, Cu, Zn. A' may have the same valency as site A, with a different ferroelectric polarizability. In various embodiments, when metallic perovskite is used for the FE material, conductive oxides can include one or more of: $IrO_2$, $RuO_2$, $PdO_2$, $OsO_2$, or $ReO_3$. In some embodiments, the perovskite is doped with La or lanthanides. In some embodiments, thin layer (e.g., approximately 10 nm) perovskite template conductors such as $SrRuO_3$ coated on top of $IrO_2$, $RuO_2$, $PdO_2$, $PtO_2$, which have a non-perovskite structure but higher conductivity to provide a seed or template for the growth of pure perovskite ferroelectric at low temperatures, are used as conductive oxides. In some embodiments, the conductive oxides include one or more of: Ir, In, Fe, Ru, Pd, Os, or Re.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: $SrTiO_3$, $Ba_{(x)}Sr_{(y)}TiO_3$ (where x is –0.05 or 0.5, and y is 0.95), $HfZrO_2$, Hf—Si—O, La-substituted $PbTiO_3$, PMN-PT based relaxor ferroelectrics.

In some embodiments, the FE material comprises one or more of: hafnium (Hf), zirconium (Zr), aluminum (Al), silicon (Si), their oxides or their alloyed oxides. In some embodiments, FE material includes one or more of: $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, y doped $HfO_2$, where x includes one of: Al, Ca, Ce, Dy, Er, Gd, Ge, La, Sc, Si, Sr, Sn, or Y, wherein 'x' is a fraction. In some embodiments, FE material includes one or more of: bismuth ferrite (BFO), lead zirconate titanate (PZT), BFO with doping material, or PZT with doping material, wherein the doping material is one of Nb or La; and relaxor ferroelectrics such as PMN-PT.

In some embodiments, the FE material includes bismuth ferrite (BFO) with a doping material where in the doping material is one of lanthanum, or any element from the lanthanide series of the periodic table. In some embodiments, FE material includes lead zirconium titanate (PZT), or PZT with a doping material, wherein the doping material is one of La, Nb. In some embodiments, FE material includes a relaxor ferro-electric including one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In some embodiments, the FE material includes Hafnium oxides of the form, Hf1–x Ex Oy where E can be Al, Ca, Ce, Dy, Er, Gd, Ge, La, Sc, Si, Sr, Sn, or Y. In some embodiments, the FE material includes Niobate type compounds $LiNbO_3$, $LiTaO_3$, lithium iron tantalum oxy fluoride, barium strontium niobate, sodium barium niobate, or potassium strontium niobate.

In some embodiments, the FE material comprises multiple layers. For example, alternating layers of $[Bi_2O_2]2+$, and pseudo-perovskite blocks ($Bi_4Ti_3O_{12}$ and related Aurivillius phases), with perovskite layers that are 'n' octahedral layers in thickness can be used. In some embodiments, the FE material comprises organic material. For example, polyvinylidene fluoride or polyvinylidene difluoride (PVDF).

In some embodiments, the FE material comprises hexagonal ferroelectrics of the type h-$RMnO_3$, where R is a rare earth element viz. cerium (Ce), dysprosium (Dy), erbium (Er), curopium (Eu), gadolinium (Gd), holmium (Ho), lanthanum (La), lutetium (Lu), ncodymium (Nd), prascodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In some embodiments, hexagonal FE includes one of: $YMnO_3$ or $LuFe3_3$. In various embodiments, when the FE material comprises hexagonal ferroelectrics, the conductive oxides are of $A_2O_3$ (e.g., $In_2O_3$, $Fe_2O_3$) and $ABO_3$ type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are $LuFeO_3$ class of materials or super lattice of ferroelectric and paraelectric materials $PbTiO_3$ (PTO) and $SnTiO_3$ (STO), respectively, and $LaAlO_3$ (LAO) and STO, respectively. For example, a super lattice of [PTO/STO]n or [LAO/STO]n, where 'n' is between 1 to 100. In some embodiments, the paraelectric material includes one of: $SrTiO_3$, $Ba_{(x)}Sr_{(y)}TiO_3$ (where x is –0.5, and y is 0.95), $BaTiO_3$, $HfZrO_2$, Hf—Si—O, La-substituted $PbTiO_3$, or PMN-PT based relaxor ferroelectrics.

Figure 2:
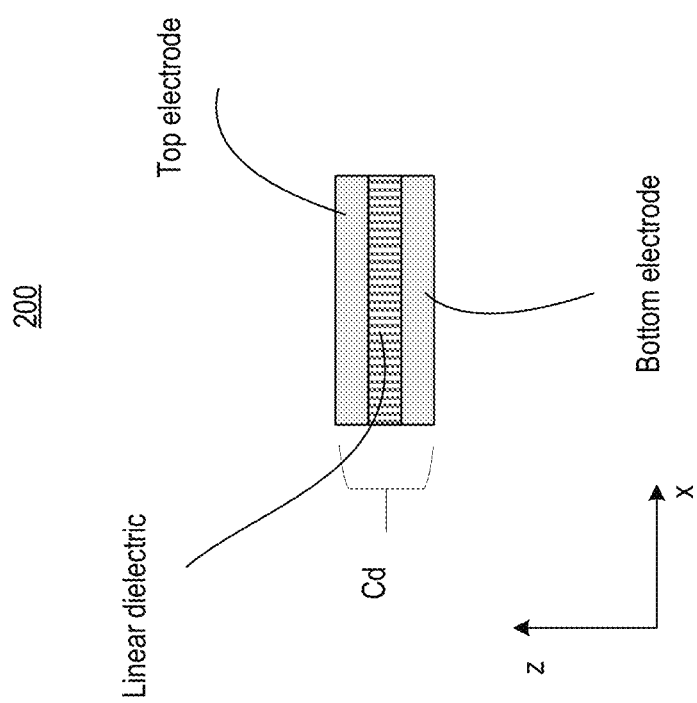
FIG. 2 illustrates a planar linear capacitor structure, in accordance with some embodiments.

FIG. 2 illustrates a planar linear capacitor structure 200, in accordance with some embodiments. In some embodiments, capacitors for the multi-input capacitive structures are linear capacitors. These capacitors can take any planar form. One such form is illustrated in FIG. 2. Here, planar capacitor structure 200 is a metal-insulator-metal (MIM) capacitor comprising a bottom electrode, a top electrode, and a linear dielectric between the top electrode and the bottom electrode as shown. In some embodiments, conductive oxide layer(s) are formed between the bottom electrode and the linear dielectric. In some embodiments, conductive oxide layer(s) are formed between the top electrode and the linear dielectric. Examples of conductive oxides include: $IrO_2$, $RuO_2$, $PdO_2$, $OsO_2$, or $ReO_3$. In some examples, conductive oxides are of the form $A_2O_3$ (e.g., $In_2O_3$, $Fe_2O_3$) and $ABO_3$ type, where 'A' is a rare earth element and B is Mn.

In some embodiments, the dielectric layer includes one or more of: $SiO_2$, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

Figure 3A:
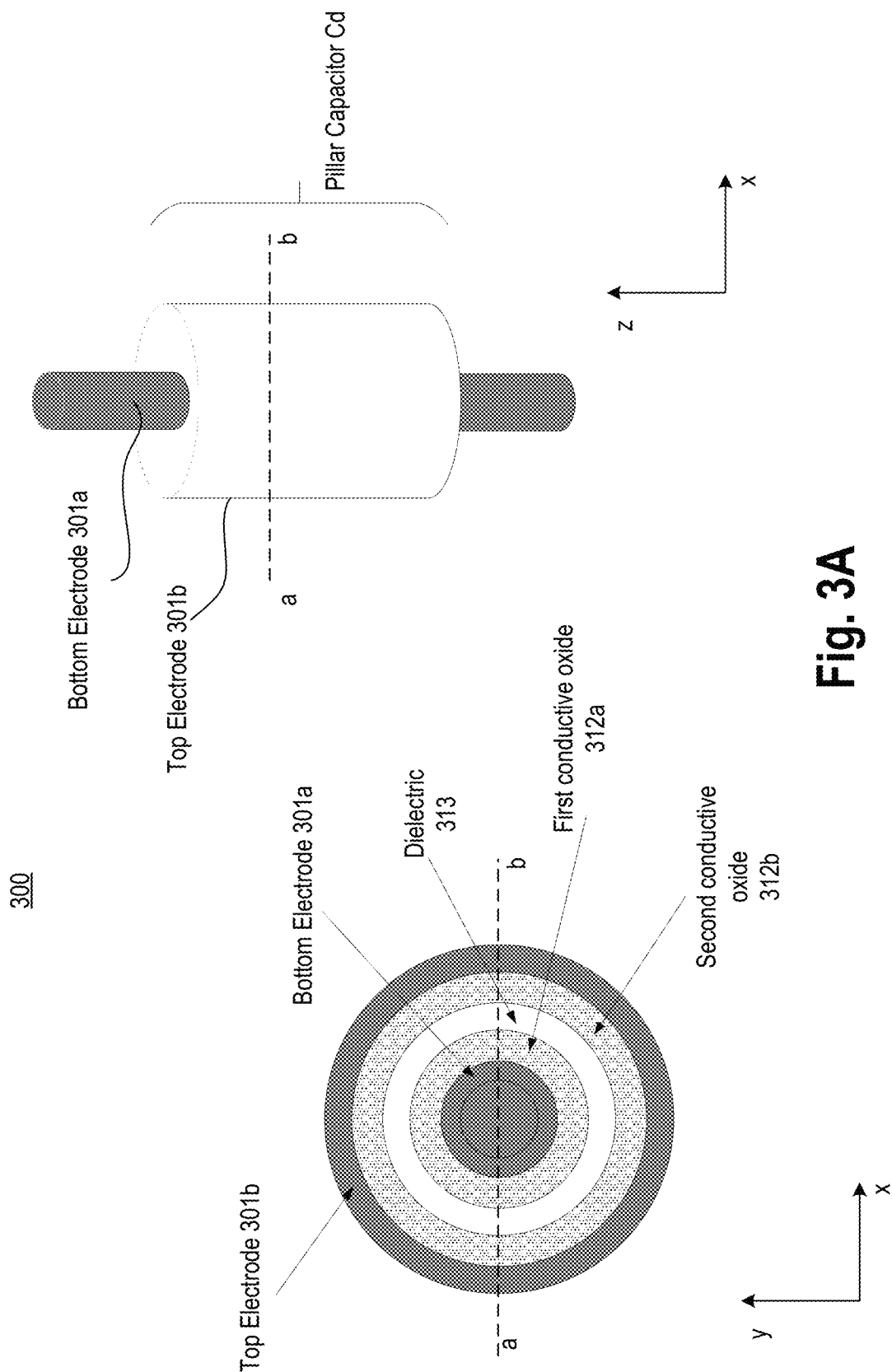
FIG. 3A illustrates a non-planar linear capacitor structure, in accordance with some embodiments.

FIG. 3A illustrates a non-planar linear capacitor structure 300, in accordance with some embodiments. In some embodiments, non-planar capacitor structure 300 is rectangular in shape. Taking the cylindrical shaped case for example, in some embodiments, the layers of non-planar capacitor structure 300 from the center going outwards include bottom electrode 301a, first conductive oxide 312a, linear dielectric material 313, second conductive oxide 312b, and top electrode 301b. A cross-sectional view along the "ab" dashed line is illustrated in the middle of FIG. 3A. In some embodiments, conducting oxides are removed and the linear dielectric is directly connected to top electrode 301b and bottom electrodes 301a. In some embodiments, linear dielectric material 313 can include any suitable dielectric, where the thickness of dielectric film is a range of 1 nm to 20 nm. In some embodiments, linear dielectric material 313 comprises a higher-K dielectric material. In some embodiments, linear dielectrics include one of: $SiO_2$, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include one or more of: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide.

In some embodiments, first conductive oxide 312a is conformally deposited over bottom electrode 301a. In some embodiments, dielectric material 313 is conformally deposited over first conductive oxide 312a. In some embodiments, second conductive oxide 312b is conformally deposited over dielectric material 313. In some embodiments, top electrode 301b is conformally deposited over second conductive oxide 312b. In some embodiments, bottom electrode 301a is in the center, while top electrode 301b is on an outer circumference of non-planar capacitor structure 300.

In some embodiments, material for bottom electrode 301a may include one or more of: Cu, Al, Ag, Au, W, or Co, or their alloys. In some embodiments, material for first conductive oxide 312a includes: $IrO_2$, $RuO_2$, $PdO_2$, $OsO_2$, or $ReO_3$. In some examples, conductive oxides are of the form $A_2O_3$ (e.g., $In_2O_3$, $Fe_2O_3$) and $ABO_3$ type, where 'A' is a rare earth element and B is Mn. In some embodiments, material for second conductive oxide 312b may be same as the material for first conductive oxide 312a. In some embodiments, material for top electrode 301b may include one or more of: Cu, Al, Ag, Au, W, Co, or their alloys.

In some embodiments, a first refractive inter-metallic layer (not shown) is formed between dielectric material 313 and first conductive oxide 312a. In some embodiments, a second refractive inter-metallic layer (not shown) is formed between dielectric capacitor material 313 and second conductive oxide 312b. In these cases, the first and second refractive inter-metallic layers are directly adjacent to their respective conductive oxide layers and to dielectric capacitor material 313. In some embodiments, refractive inter-metallic maintains the capacitive properties of the dielectric capacitor material 313. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as $Ti_3Al$, TiAl, $TiAl_3$; Ni—Al such as $Ni_3Al$, $NiAl_3$, NiAl; Ni—Ti, Ni—Ga, $Ni_2MnGa$; FeGa, $Fe_3Ga$; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+$α_2$($Ti_3Al$). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. The thicknesses of the layers of capacitor 300 in the x-axis are in the range of 1 nm to 30 nm. In some embodiment, refractive inter-metallic layers are not used for non-planar capacitor structure 300.

Figure 3B:
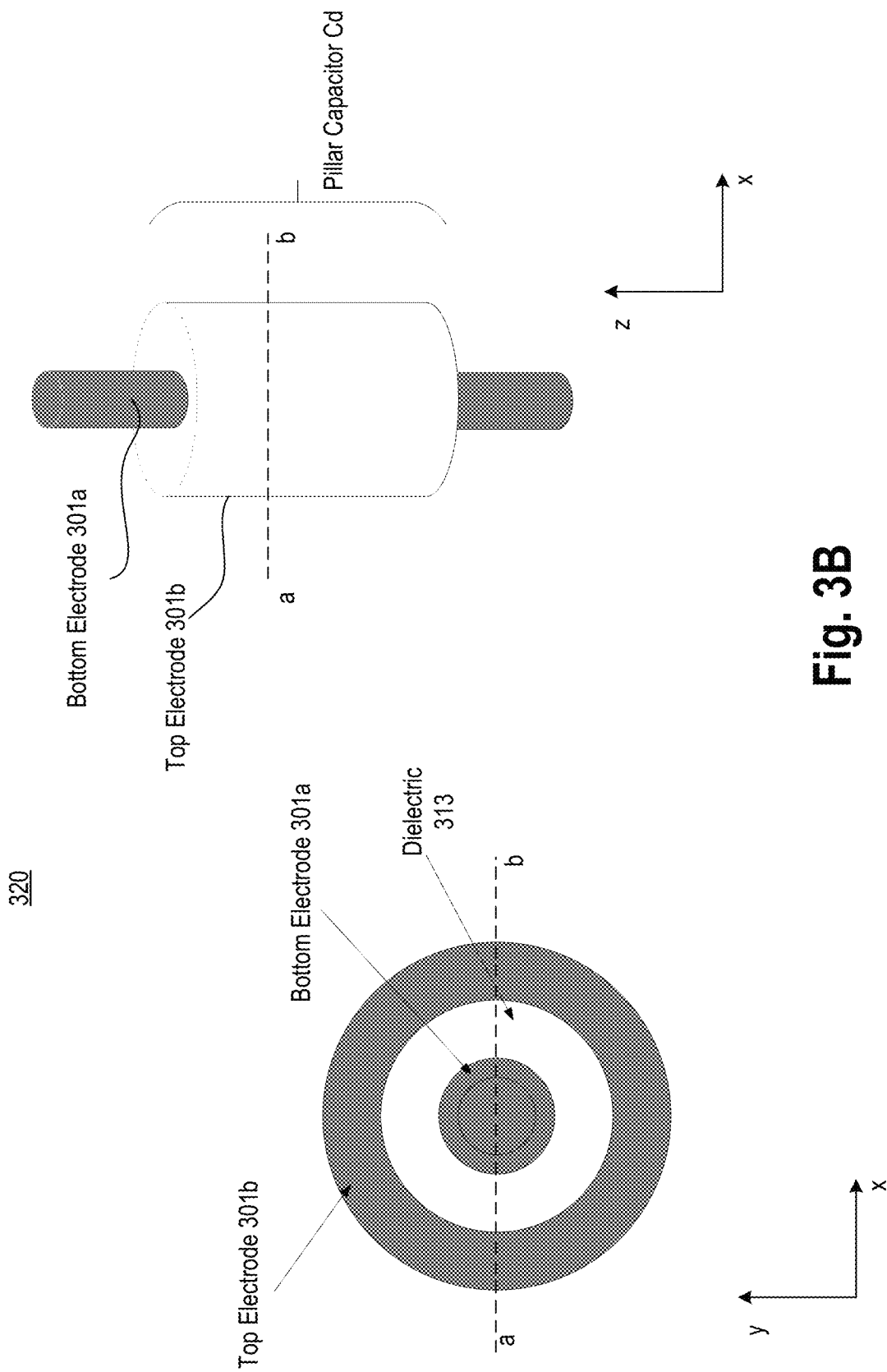
FIG. 3B illustrates a non-planar linear capacitor structure without conductive oxides, in accordance with some embodiments.

FIG. 3B illustrates a non-planar linear capacitor structure 320 without conductive oxides, in accordance with some embodiments. Compared to FIG. 3A, here the linear dielectric is adjacent to the top electrode and the bottom electrode.

FIG. 4A illustrates a planar ferroelectric or paraelectric capacitor structure, in accordance with some embodiments. FIG. 4B illustrates three planar ferroelectric or paraelectric capacitor structures, respectively, in accordance with some embodiments. In some embodiments, capacitors are ferroelectric or paraelectric capacitors.

These capacitors can take any planar form. One such simplified form is illustrated in FIG. 4A. Here, planar capacitor structure 400 is a metal-insulator-metal (MIM) capacitor comprising a bottom electrode, a top electrode, and a ferroelectric dielectric between the top electrode and the bottom electrode as shown. In some embodiments, conductive oxide layer(s) are formed between the bottom electrode and the ferroelectric dielectric.

In some embodiments, planar capacitor 423a includes encapsulation portions 421a and 421b (also referred to as sidewall barrier seal) that are adjacent to the side walls of the plurality of layers of the planar capacitor. In some embodiments, planar capacitor 423b includes encapsulation portions 421c and 421d that are partially adjacent to sidewall barrier seal 421a and 421b, and refractive inter-metallic layers 411a. In some embodiments, sidewall barrier seals 421a and 421b extend in the z-plane. In various embodiments, encapsulation portions 421c and 421d terminate into a via (not shown). The material for encapsulation portions 421c and 421d is the same as those for sidewall barrier seal 421a and 421b. In some embodiments, the barrier material includes one or more of an oxide of: Ti, Al, or Mg.

In some embodiments, planar capacitor 423c includes encapsulation portions 421c and 421f that are partially adjacent to sidewall barrier seal 421a and 421b, and refractive inter-metallic layers 411b. In various embodiments, encapsulation portions 421e and 421f terminate into a via (not shown). In some embodiments, encapsulation portions 421e and 421f extend in an x-plane. The material for encapsulation portions 421e and 421f is the same as those for sidewall barrier seal 421a and 421b. Material for 421a and 421b includes one or more of: Ti—Al—O, $Al_2O_3$, MgO, or nitride. Material for 421a and 421b is a sidewall barrier (e.g., insulative material) that protects the stack of layers from hydrogen and/or oxygen diffusion. In various embodiments, the sidewall barrier material is not an interlayer dielectric (ILD) material. In some embodiments, the lateral thickness (along x-axis) of the sidewall barrier seal 421a/b (insulating material) is in a range of 0.1 nm to 20 nm. In some embodiments, sidewall barriers are in direct contact with ILD.

In some embodiments, planar capacitors 423a, 423b, and 423c comprise a number of layers stacked together to form a planar capacitor. These layers may extend in an x-plane when the capacitor is a planar capacitor. In some embodiments, the stack of layers includes refractive inter-metallic 411a/b as a barrier material; conductive oxides 412a/b, and FE material 413. FE material 413 can be any of the FE materials discussed herein. In some embodiments, refractive inter-metallic 411a/b are removed, and electrodes are in direct contact with conductive oxides 412a/b.

In some embodiments, refractive inter-metallic 411a/b maintains the FE properties of the FE capacitor. In the absence of refractive inter-metallic 411a/b, the ferroelectric material 413 of the capacitor may lose its potency. In some embodiments, refractive inter-metallic 411a/b comprises Ti and Al (e.g., TiAl compound). In some embodiments, refractive inter-metallic 411a/b comprises one or more of Ta, W, and/or Co. For example, refractive inter-metallic 411a/b includes a lattice of Ta, W, and Co.

In some embodiments, refractive inter-metallic 411a/b is part of a barrier layer which is a super lattice of a first material and a second material, wherein the first material includes Ti and Al (e.g., TiAl) and the second material includes Ta, W, and Co (e.g., layers of Ta, W, and Co together). In various embodiments, the lattice parameters of the barrier layer are matched with the lattice parameters of the conductive oxides and/or FE material 413.

In some embodiments, refractive inter-metallic 411a/b includes one of: Ti—Al such as $Ti_3Al$, TiAl, $TiAl_3$; Ni—Al such as $Ni_3Al$, $NiAl_3$, NiAl; Ni—Ti, Ni—Ga, $Ni_2MnGa$; FeGa, $Fe_3Ga$; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2($Ti_3Al$). Single-phase y alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B, and Mg can markedly enhance other properties. In some embodiments, barrier layer 411a is coupled to a top electrode. In some embodiments, sidewall barrier seal 421a/b (insulating material) is placed around layers 411a, 412a, 413, 412b, and 411b along, while the top and bottom surfaces of 411a and 411b are exposed for coupling to metal layers, vias, or a metallic pedestal.

In some embodiments, conductive oxide layer(s) are formed between the top electrode and the ferroelectric dielectric. Examples of conductive oxides include: $IrO_2$, $RuO_2$, $PdO_2$, $OsO_2$, or $ReO_3$. In some examples, conductive oxides are of the form $A_2O_3$ (e.g., $In_2O_3$, $Fe_2O_3$) and $ABO_3$ type, where 'A' is a rare earth element and B is Mn.

Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

FIG. 4C illustrates pedestal 440 that connects to the top and/or bottom electrodes of the planar ferroelectric or paraelectric capacitor, in accordance with some embodiments. In some embodiments, pedestal 440 comprises pedestal metal 441 and sidewall barrier 442. In some embodiments, barrier 442 includes materials to protect hydrogen and/or oxygen from interacting with pedestal metal 441. In some embodiments, barrier 442 comprises Ti—Al—O, $Al_2O_3$, MgO, or nitride. In some embodiments, pedestal metal 441 includes one of Cu, Al, Ag, Au, W, or Co.

Figure 5A:
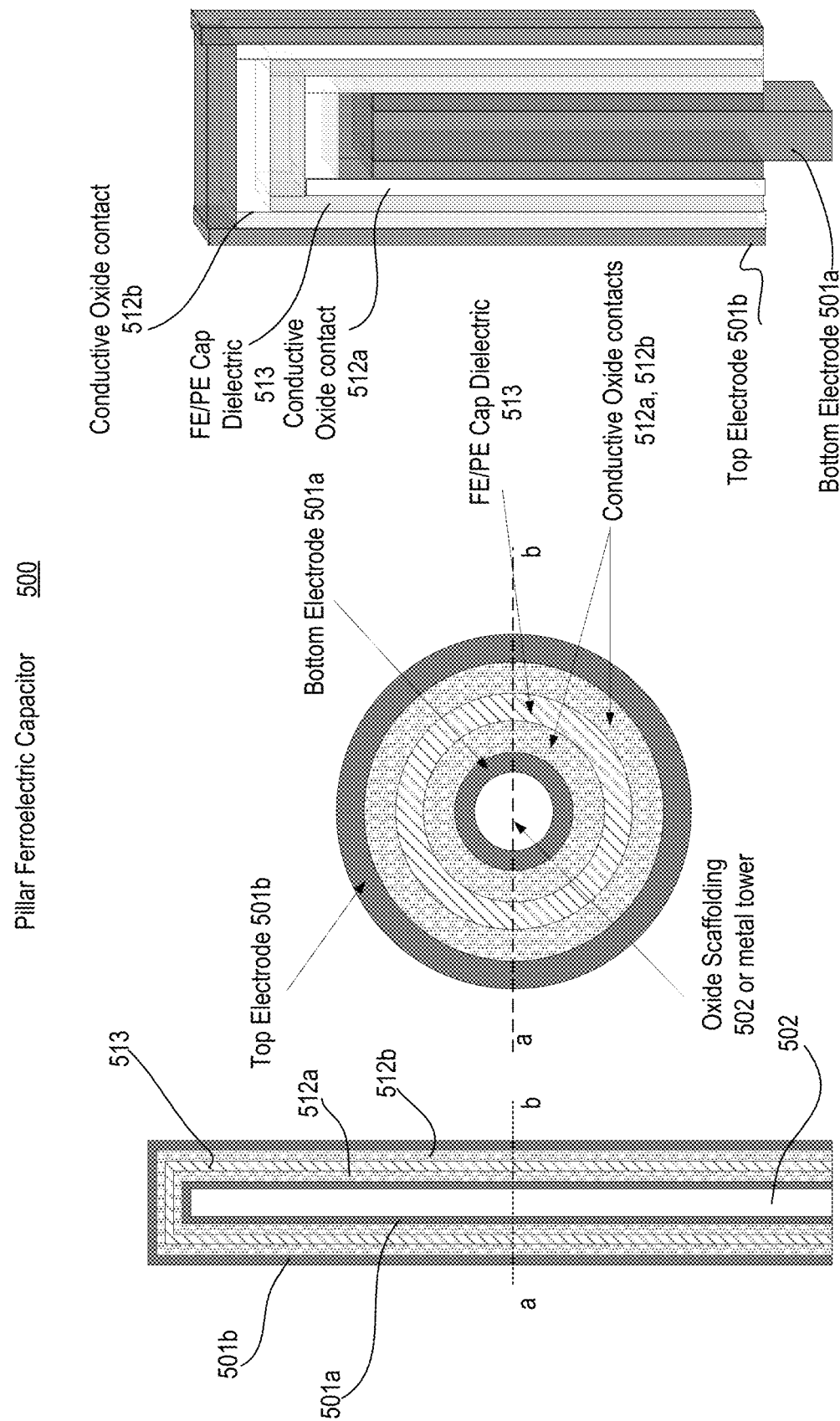
FIG. 5A illustrates a non-planar ferroelectric or paraelectric capacitor structure, in accordance with some embodiments.

FIG. 5A illustrates a non-planar ferroelectric (FE) or paraelectric (PE) capacitor structure, in accordance with some embodiments. In some embodiments, non-planar capacitor structure 500 is rectangular in shape. Taking the cylindrical shaped case for example, in some embodiments, the layers of non-planar capacitor structure 500 from the center going outwards include bottom electrode 501a, first conductive oxide 512a, ferroelectric (FE) or paraelectric (PE) dielectric material 513, second conductive oxide 512b, and top electrode 501b. In some embodiments, conducting oxides are removed and the FE/PE dielectric is directly connected to top electrode 501b and bottom electrode 501a. In some embodiments, ferroelectric dielectric material 513 can include any suitable dielectric, where the thickness of FE/PE dielectric film is a range of 1 nm to 20 nm. In some embodiments, FE/PE dielectric material 513 includes any one of the materials discussed herein for ferroelectrics or paraelectric. In some embodiments, a central region 502 of capacitor 500 is filled with oxide or an insulative material. In some embodiments, central region 502 is filled with metal that abuts with bottom electrode 501a to form a thicker bottom electrode.

In some embodiments, first conductive oxide 512a is conformally deposited over bottom electrode 501a. In some embodiments, FE/PE dielectric material 513 is conformally deposited over first conductive oxide 512a. In some embodiments, second conductive oxide 512b is conformally deposited over FE/PE dielectric material 513. In some embodiments, top electrode 501b is conformally deposited over second conductive oxide 512b. In some embodiments, bottom electrode 501a is in the center, while top electrode 501b is on an outer circumference of non-planar capacitor structure 500.

In some embodiments, material for bottom electrode 501a may include one or more of: Cu, Al, Ag, Au, W, or Co, or their alloys. In some embodiments, material for first conductive oxide 512a include: $IrO_2$, $RuO_2$, $PdO_2$, $OsO_2$, or $ReO_3$. In some examples, conductive oxides are of the form $A_2O_3$ (e.g., $In_2O_3$, $Fe_2O_3$) and $ABO_3$ type, where 'A' is a rare earth element and B is Mn. In some embodiments, material for second conductive oxide 512b may be same as the material for first conductive oxide 512a. In some embodiments, material for top electrode 501b may include one or more of: Cu, Al, Ag, Au, W, or Co, or their alloys.

In some embodiments, a first refractive inter-metallic layer (not shown) is formed between dielectric material 513 and first conductive oxide 512a. In some embodiments, a second refractive inter-metallic layer (not shown) is formed between FE/PE dielectric capacitor material 513 and second conductive oxide 512b. In these cases, the first and second refractive inter-metallic layers are directly adjacent to their respective conductive oxide layers and to FE/PE dielectric capacitor material 513. In some embodiments, refractive inter-metallic maintains the capacitive properties of the dielectric capacitor material 513. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as $Ti_3Al$, TiAl, $TiAl_3$; Ni—Al such as $Ni_3Al$, $NiAl_3$, NiAl; Ni—Ti, Ni—Ga, $Ni_2MnGa$; FeGa, $Fe_3Ga$; borides, carbides, or nitrides. In some embodiments, TiAl material comprises Ti-(45-48)Al-(1-10)M (at X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2($Ti_3Al$). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. The thicknesses of the layers of capacitor 500 in the x-axis are in the range of 1 nm to 30 nm. In some embodiments, refractive inter-metallic layers are not used for non-planar capacitor structure 500.

Figure 5B:
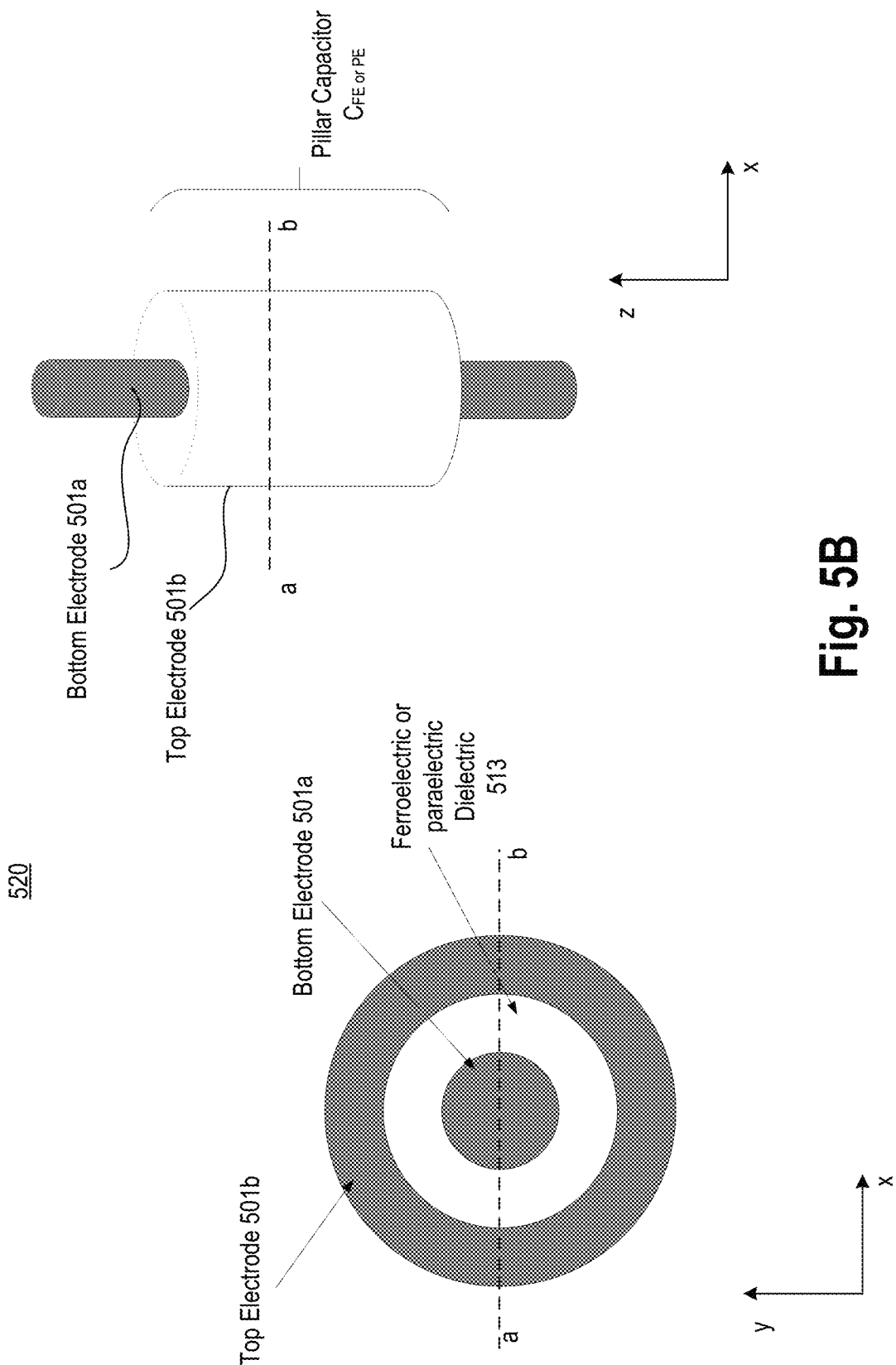
FIG. 5B illustrates a non-planar ferroelectric or paraelectric capacitor structure without conductive oxides, in accordance with some embodiments.

FIG. 5B illustrates a non-planar ferroelectric or paraelectric capacitor structure 520 without conductive oxides, in accordance with some embodiments. Compared to non-planar capacitor structure 500, here first conductive oxide 512a and second conductive oxide 512b are removed and ferroelectric material 513 is adjacent to top electrode 501b and bottom electrode 501a as shown.

The various embodiments illustrated here for ferroelectric material can replace ferroelectric material with anti-ferroelectric material. Examples of anti-ferroelectric (AFE) material include lead zirconate titanate (PZT) with high Zr doping, La-doped PZT with high Zr doping, $HfSiO_2$ with high Si doping, $HfZrO_2$ (HZO) with high Zr doping, $ZrO_2$, $PbZrO_3$ (lead zirconate), $NH_4H_2PO_4$ (ammonium dihydrogen phosphate (ADP)), $NaNbO3_3$ (sodium niobate), and K doped $NaNbO_3$, etc. Table 1 also describes some bulk anti-ferroelectric materials, with various physical/chemical modifications for enhancing energy storage density.

TABLE 1

| Material name | Physical/ Chemical Modifications | Energy Density ($J/cm^3$) | Electric Field (kV/cm) |
|---|---|---|---|
| (Pb0.97La0.02)(Zr0.97Ti0.03)$O_3$ | 3 wt % glass (PbO-$B_2O_3$-$SiO_2$-ZnO) | 3.1 | 581 |
| (Pb0.97La0.02)(Zr0.97Ti0.03)$O_3$ | without glass | 1.4 | 581 |
| Pb0.99Nb0.02[(Zr0.57Sn0.43)1-yTiy]0.98$O_3$ | with half electrode | 1.30 | 70 |
| Pb0.99Nb0.02[(Zr0.57Sn0.43)1-yTiy]0.98$O_3$ | with full electrode | 1.19 | 70 |
| (Pb0.94-xLa0.04Bax)[(Zr0.60Sn0.40)0.841Ti0.16]$O_3$ | x = 0 (0 MPa) | 0.35 | 30 |
| (Pb0.94-xLa0.04Bax)[(Zr0.60Sn0.40)0.841Ti0.16]$O_3$ | x = 0.02 (20 MPa) | 0.38 | 30 |
| Pb0.99Nb0.02[(Zr0.60Sn0.40)0.95Ti0.05]$O_3$ | — | 0.62 | 56 |
| Pb0.97La0.02(Zr0.56Sn0.35Ti0.09)$O_3$ | 4 wt % glass (CdO-$Bi_2O_3$-PbO-ZnO-$Al2_2O3_3$-$B_2O_3$-$SiO_2$) | 3.3 | 150 |
| Pb0.97La0.02(Zr0.56Sn0.35Ti0.09)$O_3$ | Without glass | 1.9 | 110 |
| (Pb0:97La0:02)(Zr0:92Sn0:05Ti0:03)$O_3$ | 3% glass (0.8PbO-0.2$B_2O_3$) | 7.4 | 475 |
| (Pb0:97La0:02)(Zr0:92Sn0:05Ti0:03)$O3_3$ | Without glass | 4.5 | 320 |
| Pb0.97La0.02(Zr0.95Ti0.05)$O_3$ | — | 12.4 | 1120 |
| (Pb0.85Ba0.08Sr0.03La0.03)(Zr0.74Sn0.22Ti 0.04) | — | 1.2 | 100 |
| (Bi1/2Na1/2)0.94Ba0.06]La0.8Zr0.2Ti$O_3$ | — | 1.58 | 85 |
| (Ba0.1La0.02)(Zr0.675Sn0.275Ti0.05)$O_3$ | — | 2.05 | 70 |
| 0.75(0.80Bi1/2Na1/2Ti$O_3$-0.20Bi1/2K1/2Ti$O_3$)-0.25SrTi$O_3$ | — | 0.84 | 100 |
| Pb0.97La0.02(Zr0.50Sn0.45Ti0.05)$O_3$ | — | 5.6 | 400 |
| (Pb0.858Ba0.1La0.02Y0.008)(Zr0.65Sn0.3Ti 0.05)$O_3$-(Pb0.97La0.02)(Zr0.9Sn0.05Ti0.05)$O_3$ | — | 4.65 | 200 |
| 0.89Bi0.5Na0.5Ti$O_3$-0.06BaTi$O_3$-0.05K0.5Na0.5Nb$O_3$ | double stage sintering | 0.90 | 100 |
| (Pb0.858Ba0.1La0.02Y0.008)(Zr0.65Sn0.3Ti 0.05)$O_3$-(Pb0.97La0.02)(Zr0.9Sn0.05Ti0.05)$O_3$ | spark plasma sintering | 6.40 | 275 |
| (Pb0.858Ba0.1La0.02Y0.008)(Zr0.65Sn0.3Ti0.05)$O_3$-(Pb0.97La0.02)(Zr0.9Sn0.05Ti0.05)$O_3$ | conventional sintering | 4.65 | 200 |
| (Na1 xCax)(Nb1 xZrx)$O_3$ x = 0.04 | conventional sintering | 0.91 | 130 |
| (Pb0.92La0.04Ba0.02)[(Zr0.60Sn0.40)0.84Ti 0.16]$O_3$ | at 90 MPa | 0.91 | 60 |
| 0.91(Bi0.5Na0.5)Ti$O_3$-0.07BaTi$O_3$-0.02(K0.5Na0.5)Nb$O_3$ | at 100 MPa | 0.387 | 60 |
| (Pb0.96La0.04)(Zr0.90Ti0.10)$O_3$ | at 100 MPa | 0.698 | 60 |

Figure 6A:
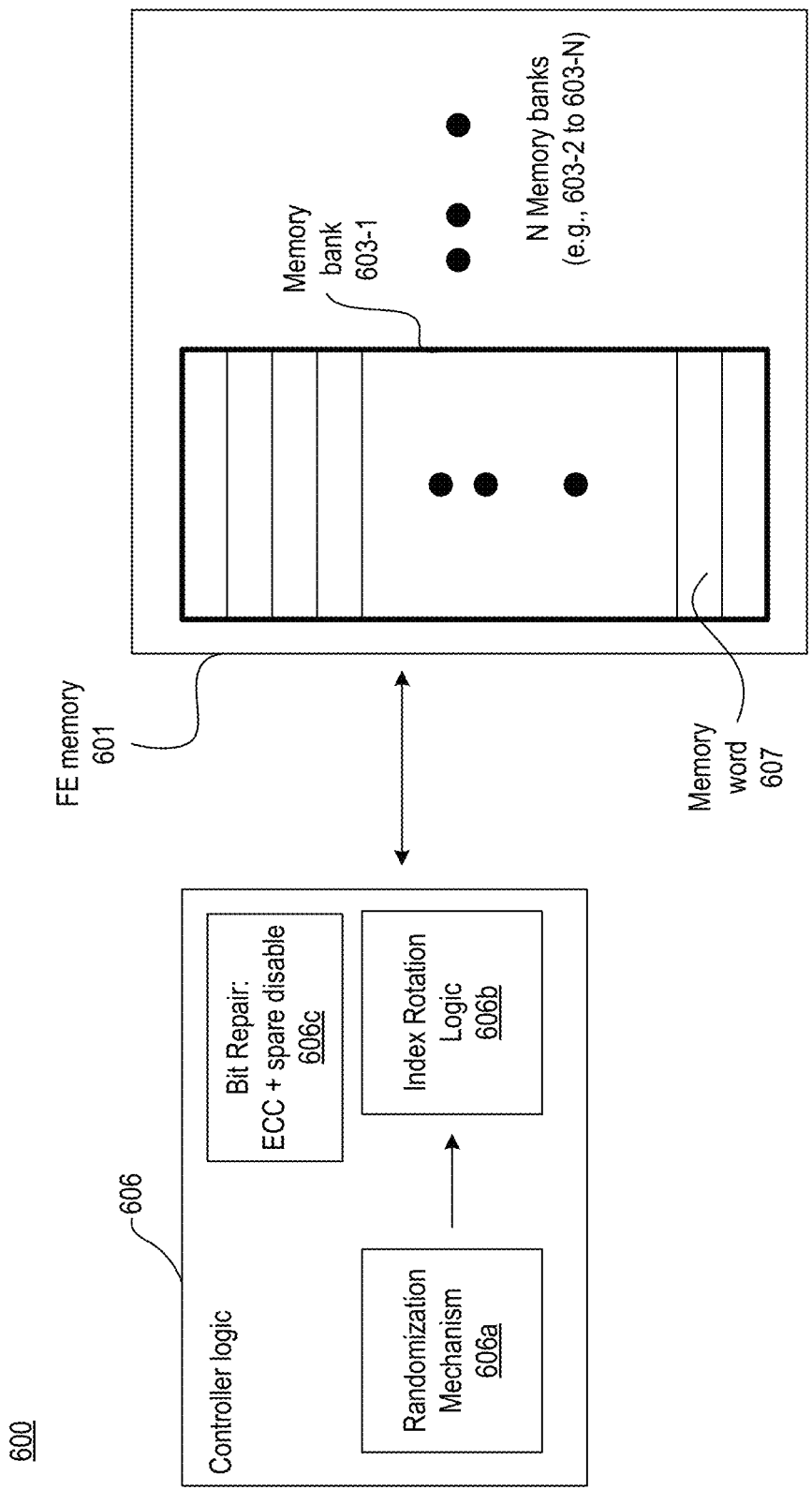
FIG. 6A illustrates a high-level endurance enhancement architecture for a paraelectric (PE) or ferroelectric (FE) memory, in accordance with some embodiments.

FIG. 6A illustrates a high-level endurance enhancement architecture 600 for a paraelectric (PE) or ferroelectric (FE) memory, in accordance with some embodiments. Architecture 600 comprises memory array 601 and controller logic 606. In various embodiments, memory array 601 is memory with non-linear polar material. For example, memory array 601 includes bit-cells that comprise at least one transistor and at least one capacitor coupled to it, where the capacitor has non-linear polar material. Examples of non-linear material include ferroelectric (FE) material, paraelectric (PE) material, and non-linear dielectric material.

In some embodiments, FE memory array 601 includes a plurality of memory banks (e.g., 603-1 through 603-N, where 'N' is a number). Each memory bank (e.g., 603-1) includes a plurality of memory words (e.g., memory word 607). Each memory word includes a plurality of memory bit-cells. For the sake of simplicity, other memory components are not shown such as write drivers, column multiplexers, sense-amplifiers, etc.

In various embodiments, controller logic 606 comprises endurance hardware and/or software to provide memory endurance to memory array 601. In general, memory endurance is needed to ensure write and/or read operations from memory array 601 are reliable. Write endurance is a number of programs and erase cycles that, when applied to a memory block, bank, or word before the memory block, bank, or word, becomes unreliable. The endurance mechanisms of some embodiments include a wear leveling scheme that uses index rotation, outlier compensation to handle weak bits, and random swap injection to mitigate wear out attacks. For the sake of simplicity, memory banks are generally referred to their reference 603 instead of a particular memory bank reference (e.g., 603-1, 603-2, etc.). Embodiments described to the general reference are applicable to an individual particular reference. For example, description of memory bank 603 is applicable for memory banks 603-1, 603-2, through 603-N.

In some embodiments, controller logic 606 (also referred to as refresh logic) comprises random invertible bit matrix 606a, index rotation logic 606b, and bit repair logic 606c. In some embodiments, index rotation logic 606b enables random swap injection which randomizes index rotation to obfuscate the mapping from addresses to rotated indexes. In some embodiments, index rotation logic 606b randomizes the rotation of gap words in memory bank 603. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some embodiments provide a facility to make tracking of the physical lines difficult. This facility makes a random decision (e.g., using an externally generated random number) to either swap or not each time a swap opportunity arises. Over time the randomness injected into the swapping process makes tracking cache lines more difficult.

In some embodiments, index rotation logic 606b is used for implementing the wear leveling scheme. In some embodiments, index rotation logic 606b rotates the addresses throughout memory bank 603 to perform a wear leveling function. In various embodiments, index rotation logic 606b ensures that memory requests are spread across memory locations rather than a single memory location.

In some embodiments, bit repair logic 606c includes double error correcting, or triple error detecting error correction code (ECC) to discover new bit errors and spare disable which eliminate memory words with particularly high error rates. Spare disable involves having a buffer of spare cache lines. When cache lines are particularly unreliable, spare disable can swap out unreliable cache lines for the reliable spares. In some embodiments, the spares may be implemented with a memory technology other than FE memory such as static random-access memory (SRAM). In various embodiments, bit repair logic 606c addresses the problem of weak memory bits. In some embodiments, each cache line or word 607 in memory bank 603 includes a valid bit. The valid bit indicates whether the data associated with that line/word is stored in the memory or the redundant word array. The redundant word array comprises spares that can be used to compensate for defective words in memory. When accessing memory, controller 606 checks the valid bit, if the valid bit is set then the data is stored in the redundant memory rather than the memory array or bank 603. In various embodiments, ECC is used to identify and/or correct bit errors in both the memory array and the redundant memory. As the ECC discovers bit errors, additional lines may be marked valid, and the data stored in the redundant memory location rather than the memory. The various endurance mechanisms discussed herein can be used in any combination or order. Some memory products may select one or more of the endurance mechanisms instead of all three discussed herein. Some memory products may apply all three endurance mechanisms to achieve most endurance for FE memory array 601. These endurance mechanisms are applied to FE memory array 601 to maximize usage of such memory.

Figure 6B:
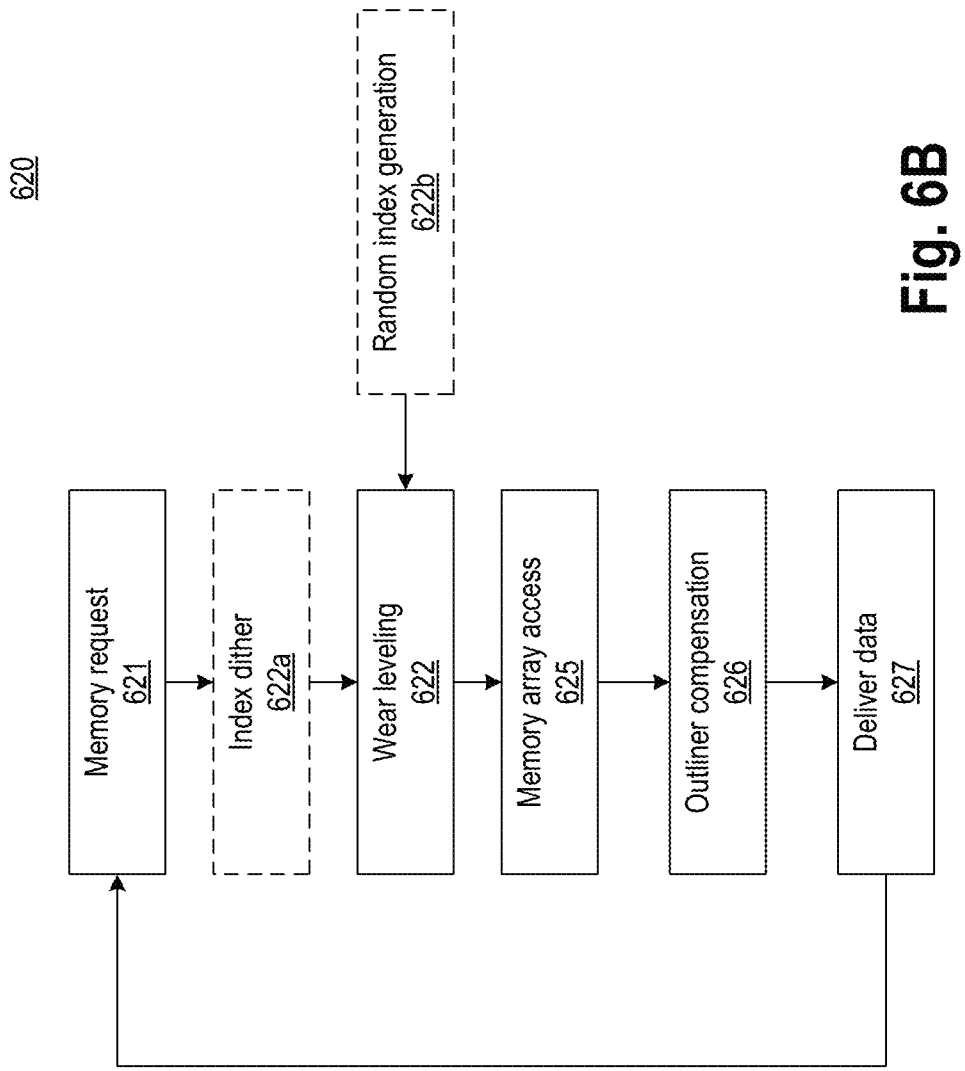
FIG. 6B illustrates a flowchart of memory endurance for PE and FE memory, in accordance with some embodiments.

FIG. 6B illustrates flowchart 620 of memory endurance for PE and FE memory, in accordance with some embodiments. While the blocks in flowchart 620 are illustrated in a particular order, the order can be modified. For example, some blocks may be performed before others based on whether read or write operations are being performed. As described herein, the various blocks can be implemented in hardware, software, or a combination of them.

At block 621, controller 606 sends a memory request to memory array 601. This request may be a read request or a write request. If it is a write request, controller 606 applies the wear leveling scheme at block 622. In some embodiments, the wear leveling scheme is linear in that a gap word or gap cache line is swapped with an adjacent word or cache line. In some embodiments, wear leveling is dithered as indicated by block 622a. In one such embodiment, the index or pointer to gap word or gap cache line is used to swap the gap word or gap cache line with either an adjacent cell with one higher index or address or with an adjacent cell with one lower index or address. As such, wear leveling is dithered.

In some embodiments, wear leveling is randomized. In one such embodiment, a random index is generated at block 622b. This random index is then used to swap the gap word or gap cache line with an adjacent or a non-adjacent word or cache line. In some embodiments, the random index is dithered. This dithered random index is then used for wear leveling.

In some embodiments, if the memory request is a read access (as indicated by block 625), outlier compensation is applied as indicated by block 626. At block 626, controller 606 addresses the problem of weak memory bits by checking a valid bit for the memory word being addressed or accessed. The valid bit indicates whether the data associated with that line or word is stored in the memory or the redundant word array. The redundant word array comprises spares that can be used to compensate for defective words in memory. When accessing memory, controller 606 checks the valid bit, if the valid bit is set then the data is stored in the redundant memory rather than the memory array or bank 603. In various embodiments, ECC is used to identify and/or correct bit errors in both the memory array and the redundant memory. As the ECC discovers bit errors, additional lines may be marked valid, and the data stored in the redundant memory location rather than the memory. After ECC is applied, the requested data is provided to controller 606 as indicated by block 627. The memory endurance for nonlinear polar material based memory is enhanced by the endurance mechanisms of various embodiments. This allows more read and writes to memory before any memory block, bank, or word becomes unreliable. In various embodiments, the capacitors for each bit-cell in FE memory 601 (which can also be a PE memory) are arranged in a stack and fold manner.

Figure 7A:
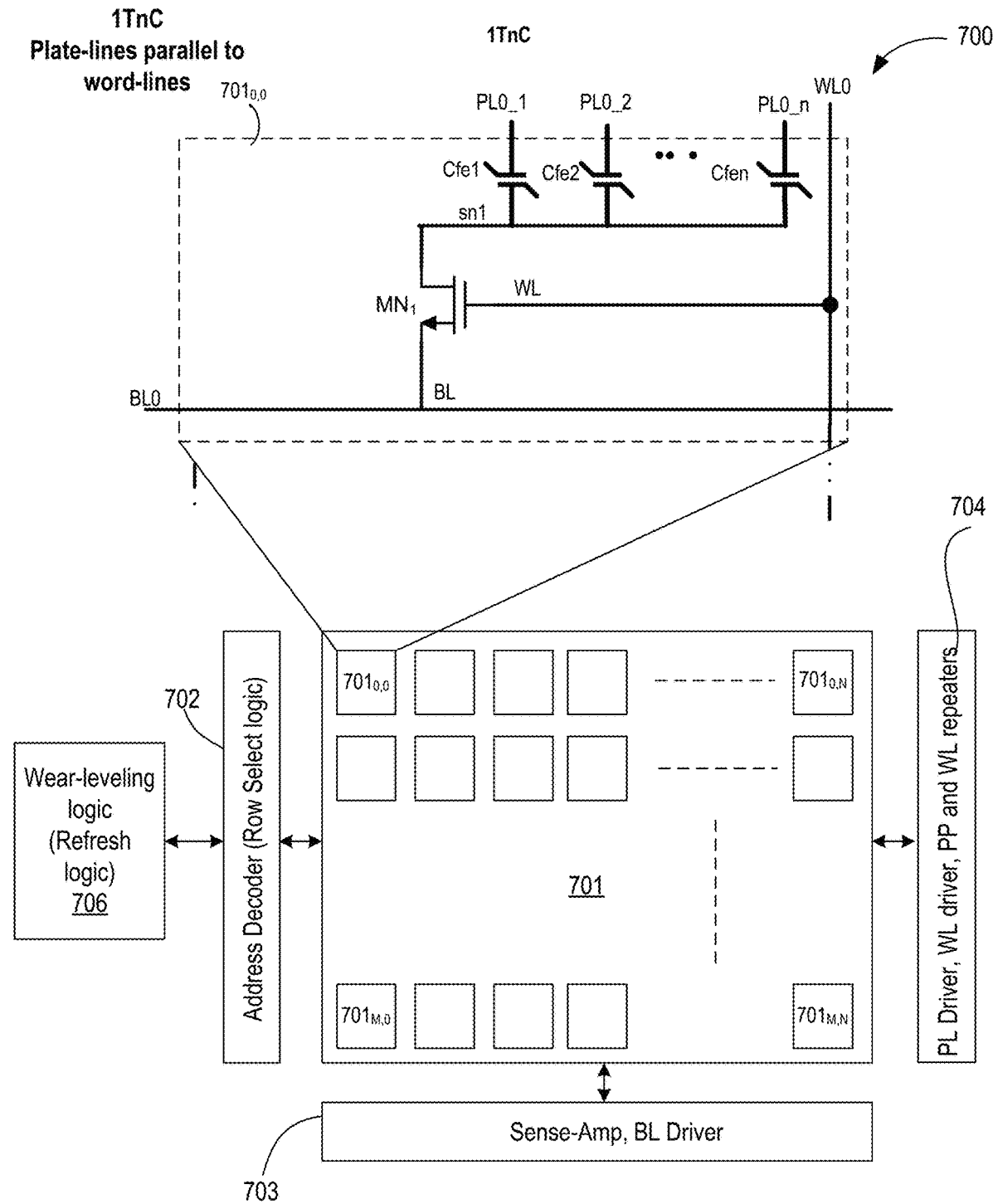
FIG. 7A illustrates an apparatus comprising memory and corresponding logic, wherein the memory comprises FE or PE memory bit-cells, where an individual memory bit-cell includes one transistor and multiple capacitors (1TnC) with circuitry to mitigate disturb field on unselected capacitors, in accordance with some embodiments.

FIG. 7A illustrates apparatus 700 comprising memory and corresponding logic, wherein the memory comprises FE or PE memory bit-cells, where an individual memory bit-cell includes one transistor and multiple capacitors (1TnC) with PLs parallel to the WL, in accordance with some embodiments. Apparatus 700 comprises M×N memory array 701 of bit-cells, logic circuitry 702 for address decoding, and logic circuitry 703 for sense amplifier, write drivers, and plate-line (PL) drivers 704. Plate-lines PL0, PL1 through PLN are parallel to word-lines WL0, WL1, through WLM, while bit-lines BL0, BL1 through BLN orthogonal to the plate-lines and the bit-lines, where 'N' is a number greater than 1.

In some embodiments, each memory bit-cell in memory array 701 is organized in rows and columns. For example, memory bit-cells 701$_{0,0}$ through 701$_{M,N}$ are organized in an array. In some embodiments, memory bit-cell 701 (e.g., 701$_{0,0}$) comprises one select transistor MN$_1$ and a plurality of capacitors Cfe1, Cfe2, through Cfen (where 'n' is a number greater than 1) comprising non-linear polar material (e.g., ferroelectric, paraelectric, or non-linear dielectric). The capacitors can be a planar or non-planar capacitor as described with reference to various embodiments. In some embodiments, the plurality of capacitors Cfe1, Cfe2, through Cfen are stacked and folded capacitors.

The gate terminal of transistors MN$_1$ is controllable by WL. In some embodiments, BL is coupled to a source or drain terminal of transistor MN$_1$. In some embodiments, an individual PL of a plurality of PLs is coupled to an individual capacitor. For example, capacitor Cfe1 is coupled to plate-line PL0_1, capacitor Cfe2 is coupled to plate_line PL0_2, and capacitor Cfen is coupled to plate_line PL0_*n*. In some embodiments, the plurality of capacitors is coupled to storage node sn1, which is coupled to a drain or source terminal of transistor MN$_1$. For example, a first terminal of capacitor Cfe1 is coupled to PL0_1 and a second terminal of capacitor Cfe1 is coupled to storage node sn1. In some embodiments, apparatus 700 has n-number of PLs (e.g., PL0_1 through PL0_*n*) per column which are parallel to a BL for that column.

While the various embodiments are illustrated with reference to an n-type transistor, the embodiments are also applicable to a p-type transistor or a combination of n-type or p-type transistors. A person skilled in the art would appreciate that when a transistor of a different conductivity type is used, than what is shown in FIG. 7A, then driving logic for BL, PLs, and/or WL may also change for proper read and/or write operations. In various embodiments, PLs are parallel to WL. For example, PL0_1, PL0_2, PL0_*n* are parallel to WL. In some embodiments, transistor MN$_1$ is fabricated on the frontend of the die and capacitors are stacked over the transistor. For example, the capacitors are stacked along the z-direction and folded along the x-axis. The capacitors can be planar or non-planar capacitors. As such, a taller and wider bit-cell is formed with a footprint comparable to the footprint of the transistor MN$_1$. In some embodiments, the x-y footprint is determined by the size of transistor MN$_1$ and its connections to BL, WL, and storage node sn1.

In some embodiments, PL (e.g., PL0_1, PL0_2, . . . PL0_*n*) controls which capacitor of the bit-cell is programmed, and the value of programming. In some embodiments, BL acts as a sense-line. The voltage on BL (e.g., sense voltage) can create disturbance on other bit-lines during read operation. To mitigate such disturbances, in some embodiments, the 1TnC bit-cell is periodically refreshed (e.g., every 1 second). In some embodiments, periodic refresh is minimized by refreshing in active mode of operation. In some embodiments, in standby mode (e.g., low power mode), the 1TnC bit-cell is not refreshed as there is no disturb mechanism during standby. In some embodiments, wear-leveling logic 706 provides one or more endurance mechanisms for the 1TnC memory bit-cells. One of the endurance mechanisms involves refreshing of the data content in the capacitor(s). In some embodiments, the number of refresh events in the lifetime of the memory array 701 is reduced by using a cure phase before or after a write phase as discussed herein.

In the 1TnC bit-cell case (e.g., bit-cell 701$_{0,0}$) with PL parallel to WL, the activities seen on an unselected or unintended bit-cell, while performing read/write operations on the same column as that of the selected bit-cell can have large disturb effects on the unselected or unintended bit-cells. This may be true if the PL within the same column toggles (during read or write) a particular value to the desired bit-cell. This signal on the PL of that column, which is shared with other unselected or unintended cells, can create a field across the non-linear polar material based capacitors or devices of the unselected cells. The field across the unselected non-linear polar material based capacitors or devices is a function of the dielectric component of individual non-linear polar material based capacitors or devices and the total capacitance on the storage node sn1 of those bit-cells. Since in the 1TnC bit-cells the storage capacitor have much larger capacitance load, the activity seen on the unselected bit-line can result into almost all voltage getting dropped across the ferroelectric capacitors (e.g., Vfe=Vpl* (Cp/(Cfed+Cp), which creates a disturb effect, which in turn causes unintentional modification of the polarization stage of the ferroelectric capacitor.

Figure 7B:
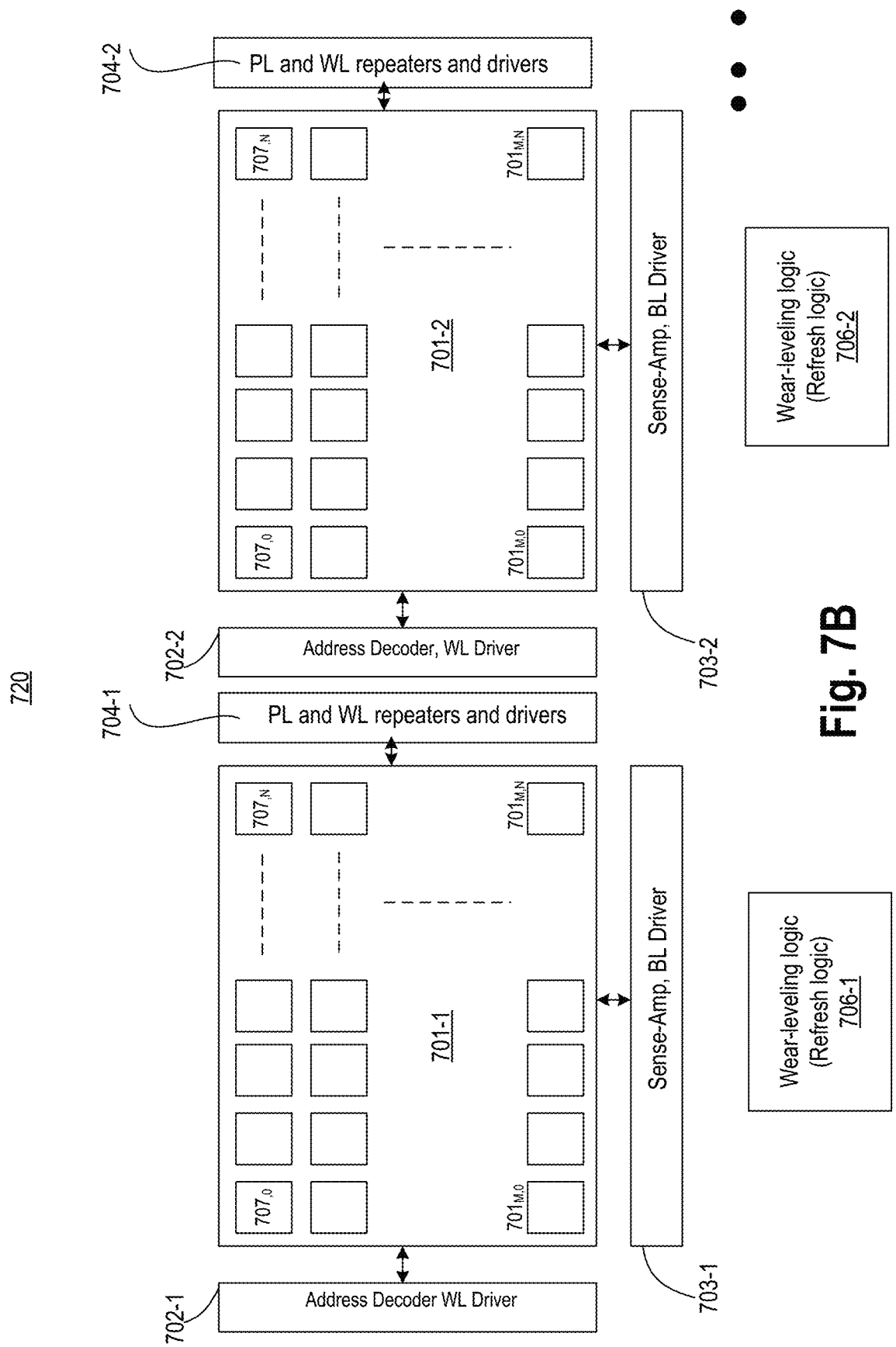
FIG. 7B illustrates an FE or PE memory with word-line repeaters, wherein memory arrays of FE or PE memory have 1TnC bit-cells, in accordance with some embodiments.

FIG. 7B illustrates FE or PE memory apparatus 720 with word-line repeaters, wherein memory arrays of FE or PE memory have 1TnC bit-cells, in accordance with some embodiments. Apparatus 720 illustrates two instances of apparatus 700. The two instances include first memory array 701-1, logic circuitry 702-1 having first address decoder and/or WL driver, and logic circuitry 703-1 having first sense amplifier, BL driver, PL driver and WL repeaters 705-1; and second memory array 701-2, logic circuitry 702-2 having address decoder and/or WL driver, and logic circuitry 703-2 having first sense amplifier, BL driver, PL driver, and WL repeaters 704-2. In some embodiments, an individual instance of apparatus 700 includes a corresponding wear-leveling logic 706 (e.g., wear-leveling logic 706-1 and wear-leveling logic 706-2). In some embodiments, wear-leveling logic 706 is shared by multiple instances of apparatus 700. In some embodiments, when the pulsing scheme described herein is combined with the refresh function by wear-leveling logic 706-1 and wear-leveling logic 706-2, disturb issues on unselected bit-cells are mitigated. In some embodiments, the number of refresh events in the lifetime of the memory array 701 is reduced by using a cure phase before or after a write phase as discussed herein.

While two memory arrays are shown (e.g., array 701-1 and 701-2), any number of arrays may be part of apparatus 720. With PL parallel to the WL and orthogonal to the BL, WL repeaters 704-1, 704-2, etc., are added to improve the driving strength of the word-line signals. In some embodiments, WL repeaters 704-1 and 704-2 operate on a higher power supply level (e.g., Vdd+Vboost) to implement WL boosting.

Timing diagrams of various embodiments here show timepoints t1, t2, t3, t4, and onwards. These time points are shown as equally spaced. However, the time points can be separated by any time period.

Figure 7C:
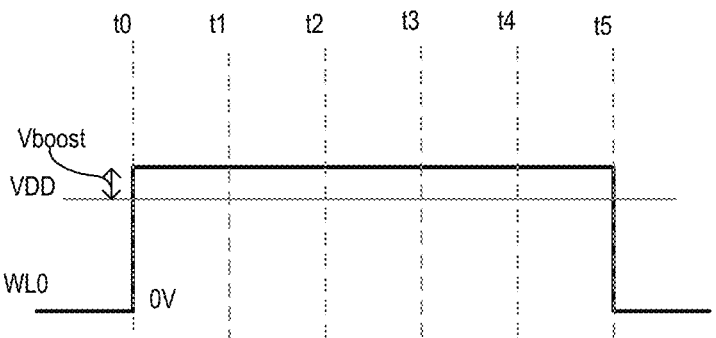
FIG. 7C illustrates a timing diagram for write operation for 1TnC FE or PE memory bit-cells with plate-lines parallel to the word-line, where the write operation involves word-line boosting, in accordance with some embodiments.
Figure 7C:
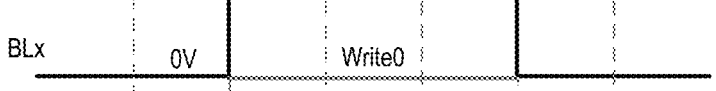
Figure 7C:
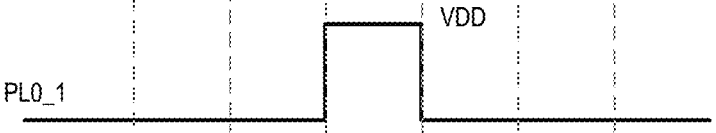
Figure 7C:
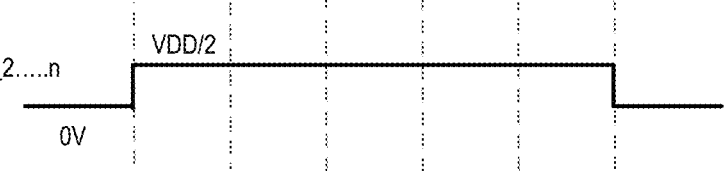
Figure 7C:
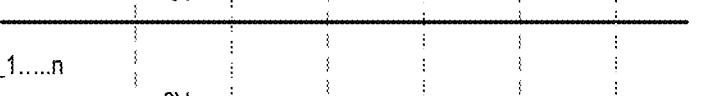
Figure 7C:
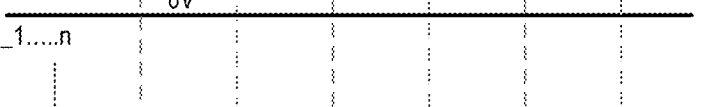
Figure 7C:
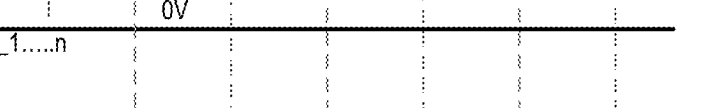

FIG. 7C illustrates timing diagram 730 for write operation for 1TnC FE or PE memory bit-cells with plate-lines parallel to the word-line, where the write operation involves word-line boosting, in accordance with some embodiments. In this case, PLs are parallel to the WL. Depending on whether logic 1 (Write 1) or logic 0 (Write 0) is being written to the selected capacitor with non-linear polar material, BL, or PL (e.g., BLx and PL0_1) associated with that capacitor of the bit-cell (e.g., $701_{0,0}$) is asserted from 0V to Vdd (power supply level). Other WLs or PLs not part of the bit-cell are forced to 0V. In some embodiments, other PLs (e.g., PL0_2, PL0_3, .... PL0_n) of the selected bit-cell (e.g., $701_{0,0}$) are set between 0 and Vdd (e.g., Vdd/2). In some embodiments, PL of the unselected bit-cells (e.g., PL1_0, .... PL1_n to PLm_0, .... PLm_n) are set to 0V. In some embodiments, the WLs for the unselected bit-cells (e.g., WL1, WL2, .... WLm) are set to 0V.

In various embodiments, write operation begins when WL is asserted and boosted above Vdd. The boost level is Vboost which may be 10-50% of Vdd. In one example, Vboost is about 1× to 1.5× of a threshold voltage (Vt) of transistor MN of the 1T1C bit-cell. Since the select transistor in these configurations is an n-channel device, it is good at passing the 0V and signals closer to it. The signal applied through the BL however, when it is at Vdd, may not pass through the transistor $MN_1$ in completeness. As such, there is a Vt drop across the n-type transistor $MN_1$ if the WL is driven to Vdd. To help get the full range of signaling across the FE capacitor Cfe1, WL-boosting helps negate the Vt drop across the transistor such that BL when driven to Vdd, internal node will also see Vdd, as opposed to Vdd-Vt.

For the bit-cell topology with PL parallel to the WL, the word-line boosting is used as otherwise it can lead to a buildup of a voltage level of approximately 2× Vdd on the storage node sn1, when BL line is at Vdd, and PL goes from 0V to Vdd. Since with WL at Vdd, the transistor $MN_1$ can be off with BL at Vdd, the storage node sn1 will sit at Vdd-Vt when PL is at 0V. After that when PL goes from 0V to Vdd, the internal node can jump to 2Vdd-Vt level. When WL is voltage boosted, and the PL voltage rises from 0V to Vdd, the storage node or internal node may not see the voltage spike, as the transistor $MN_1$ may still be in the on condition. This helps with the reliability aspect of the transistor $MN_1$. Note, a large voltage buildup on the storage node or internal node of the transistor can cause lifetime degradation and correspondingly yield issues.

When a particular bit-cell (e.g., $701_{0,0}$) is being written to, the WL for unselected bit-cells (e.g., WL0 through WLm) remains at 0. Same is done for unselected PLs as illustrated. Timing diagram 730 is a first order diagram without column multiplexing. A person skilled in the art would appreciate that column multiplexing is used for accessing memory bit-cells in an array. Here, all BLs within an active array are toggled according to what is being written. Since the BLs are orthogonal to the WL, and PL is being toggled, BLs are driven either 0 or 1, depending on what is being written. In some embodiments, when column multiplexing is implemented, the corresponding BL lines of inactive bit-cells are set to Vdd/2 to minimize the disturb effect on those bit-cells. Column multiplexing may reduce an overhead of the peripheral circuitry (not shown). In some embodiments, column multiplexing may not be used to avoid any disturb effect on unselected bit-cells.

In various embodiments, the BL and PL for the selected bit-cell capacitor are asserted and de-asserted within a pulse width of the boosted WL. In some embodiments, the voltage swing for BL and PL is between 0 to Vdd. In some embodiments, the selected PL (PL1_0) is asserted and de-asserted within the pulse width of BLx (e.g., BL0). In some embodiments, unselected PLs of the selected bit-cells are parked at a lower voltage (e.g., Vdd/2) to limit the disturb effect on those capacitors due to voltage on the internal node sn1 being either Vdd or 0. This limits the disturbance as seen by other ferroelectric capacitors of the selected bit-cells. The pulse width of the unselected PLs (e.g., PL0_2, PL0_3, .... PL0_n), of the selected bit-cell is substantially the same as the pulse width of the boosted WL (e.g., WL0), in accordance with some embodiments.

In some embodiments, the BL or PL pulse is generated after a predetermined or programmable time from when WL boost starts, and the BL or PL pulse ends within the WL pulse. In one example, to write a logic 1 to all capacitors Cfe1 through Cfen, BL pulse is generated within the pulse width of the boosted WL. All other PLs for the unselected bit-cell are set to 0V (e.g., PL1_1, PL1_2, through PL1_n are forced to 0V, and likewise PL2_1, PL2_2, through PL2_n are forced to 0V, and so on).

PLs (e.g., PL0_2 through n) within the same selected bit-cell (e.g., $701_{0,0}$) are charged to Vdd/2, in accordance with various embodiments. In some embodiments, PL for unselected bit-cells remains at 0V while PL0_1 is being used to program Cfe1. Word-lines of unselected bit-cells are set to 0V (e.g., WL1, 2, through M are set to 0V when WL0 is selected).

Figure 7D:
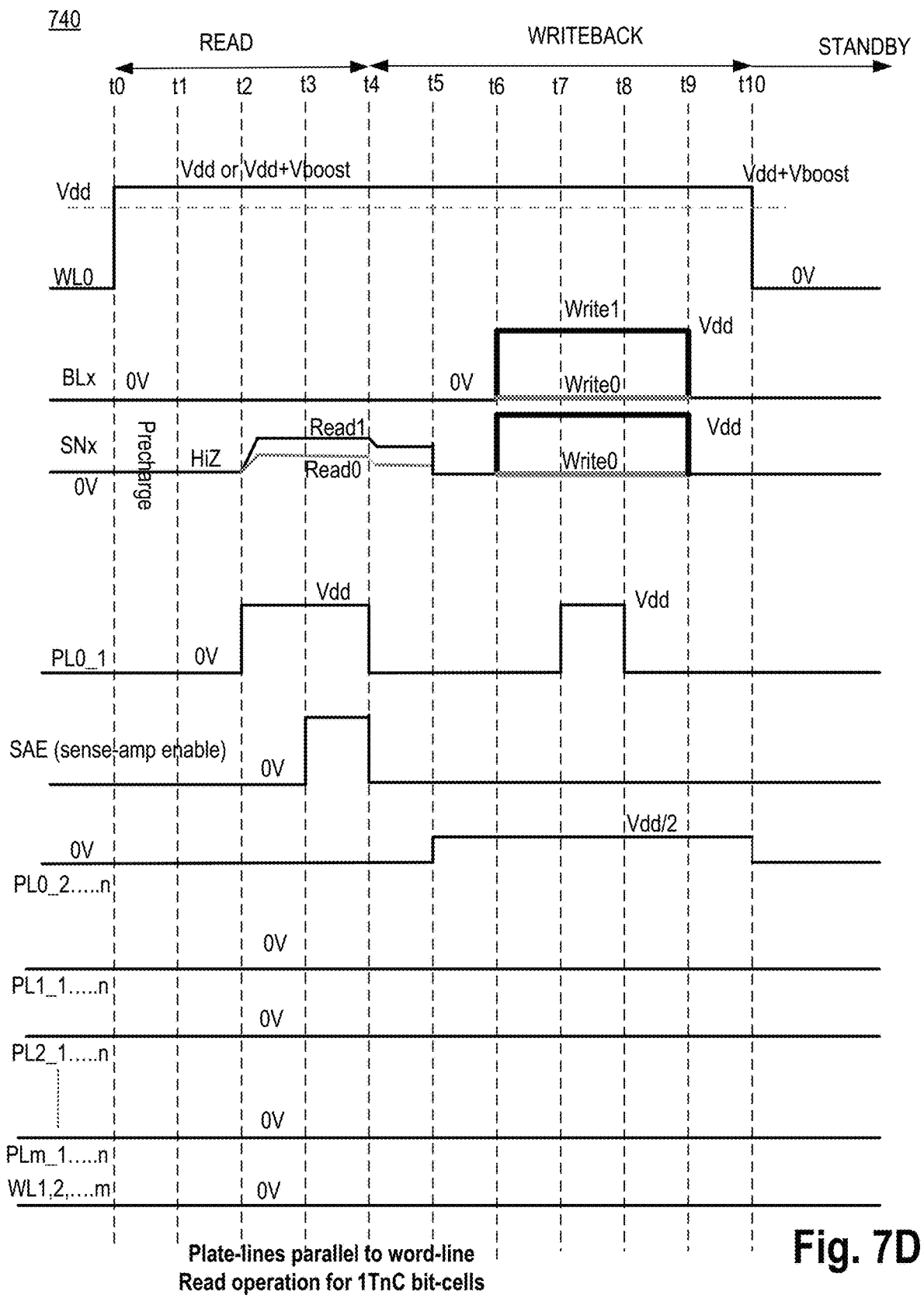
FIG. 7D illustrates a timing diagram for read operation for 1TnC FE or PE memory bit-cells with plate-lines parallel to the word-line, where the read operation involves word-line boosting, in accordance with some embodiments.

FIG. 7D illustrates timing diagram 740 for read operation for 1TnC FE or PE memory bit-cells with plate-lines parallel to the word-line, where the read operation involves word-line boosting, in accordance with some embodiments. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL is asserted for the bit-cell which is being read.

In some embodiments, PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BL is set or forced to zero volts. In some embodiments, storage node SN of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch. SLx is then driven to a high impedance state Z.

At that point, the PL for the desired FE capacitor is toggled, which results in voltage buildup on the SNx node. The voltage build-up on the SNx node may be different voltage levels depending upon whether the FE capacitor state was logic 0 or logic 1. The time-sampling of this voltage relative to a reference expected value results in detection of the state in which the FE capacitor was programmed. After reading the value, a write-back operation can be done to get the value restored to the FE capacitor, as reads are destructive read in this configuration, in accordance with some embodiments.

In the write-back process, the selected bit-cell BL (e.g., BLx) is charged to Vdd or set to 0V depending upon whether a logic 1 or a logic 0 is written back to the selected bit-cell. The value written back to the bit-cell is the same value that the sense amplifier detects when reading the voltage on the BL. The write-back mechanism is like the write operation described with reference to FIG. 7C. Here, here, 'x' in PLx_n indicates the same orientation as WL. For example, plate-lines PL0_1, PL0_2, and PL0_3 are parallel to WL0. Likewise, plate-lines PL1_1, PL1_2, and PL1_3 are parallel to WL1, and so on.

While various embodiments are described with reference to select transistors (or access transistors) as being n-type transistors, the n-type transistors may be replaced with p-type transistors. In one such case, the logic associated with the transistors may be modified to achieve the correct polarity of the signals for proper function of the bit-cells.

Figure 8:
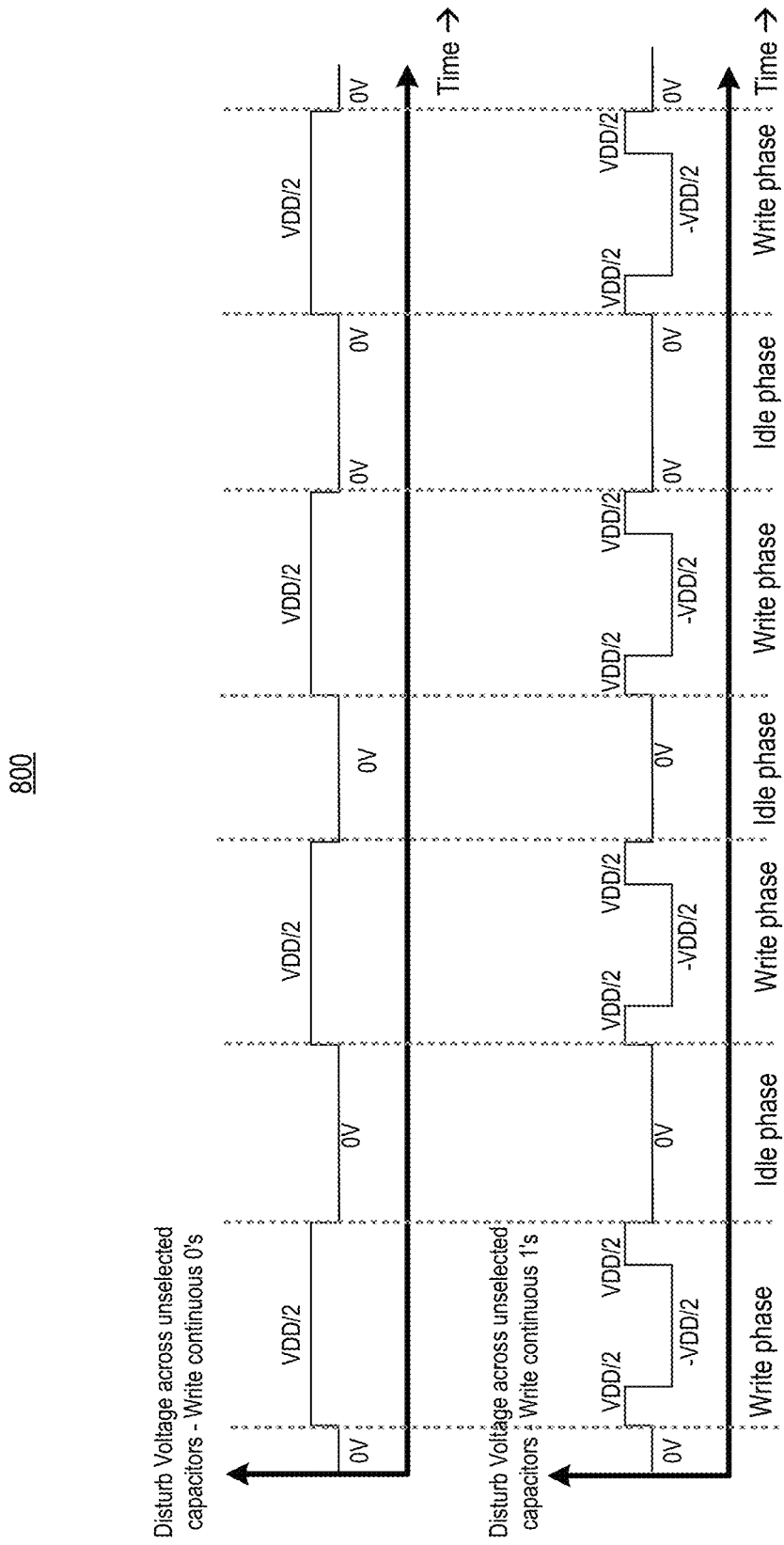
FIG. 8 illustrates plots showing worst case write operation scenarios that result in time accumulative disturb error on unselected capacitors of bit-cell.

FIG. 8 illustrates plot 800 showing worst case write operation scenarios that results in time accumulative disturb error on unselected capacitors of bit-cell, in accordance with some embodiments. For each waveform, the x-axis is time, and the y-axis is voltage, where Vdd is the voltage on a power supply rail, and 0V is voltage on a ground supply rail. In some embodiments, a voltage divider or an analog multiplexer is used to provide other voltages including Vdd/2 and −Vdd/2. Note, Vdd/2 and −Vdd/2 are the effective voltages across the capacitive devices, and not absolute (e.g., the difference between 0 and Vdd/2 is −Vdd/2 and same way the difference between Vdd/2 and 0 is +Vdd/2).

The top plot shows disturb voltage on unselected capacitors of the same bit-cell (e.g., 1TnC bit-cell) when a selected capacitor of the bit-cell is continuously written with logic zero values (i.e., Vss). The top plot shows that the average disturb voltage on the unselected capacitors of the same bit-cell is not zero and is time accumulative. The bottom plot shows disturb voltage on unselected capacitors of the same bit-cell (e.g., 1TnC bit-cell) when a selected capacitor of the bit-cell is continuously written with logic one values (i.e., Vdd). The bottom plot shows that the average disturb voltage on the unselected capacitors of the same bit-cell is not zero and is time accumulative. The idle phase between the write phases can be 0 or more cycles. For example, the write phases can be back-to-back without any idle duration.

To mitigate the disturb voltage on the unselected capacitors, the charge on the unselected capacitors is refreshed by the refresh logic, in accordance with some embodiments. The process of refreshing consumes power, and it is desired to reduce the number of refresh events during a life cycle of a memory. In some embodiments, the number of refresh events in the lifetime of the memory array 701 is reduced by using a cure phase before or after a write phase as discussed herein. As such, power is reduced. For example, number of refreshes may be reduced by orders of magnitude compared to write pulsing scheme without the cure phase.

Figure 9A:
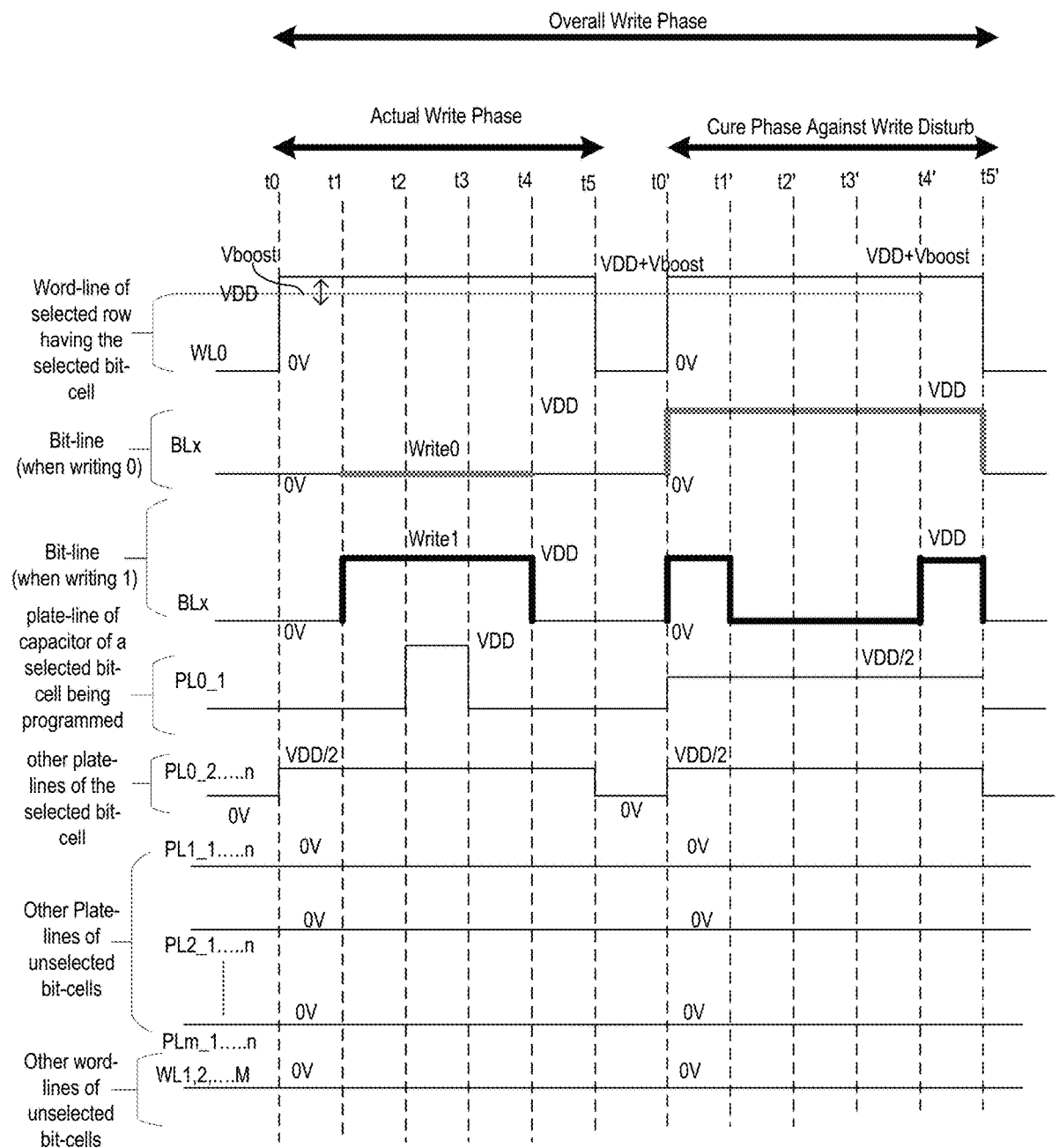
FIG. 9A illustrates a timing diagram of a write operation with a cure phase after a write phase for the bit-cell of FIG. 7A, in accordance with some embodiments.

FIG. 9A illustrates timing diagram 900 of write operation with a cure phase after a write phase for the bit-cell of FIG. 7A, in accordance with some embodiments. In some embodiments, after writing to a selected capacitor of a 1TnC bit-cell, a cure phase (e.g., second phase) is initiated. Here, the writing to the selected capacitor is referred to as the write phase (e.g., first phase). In some embodiments, between the cure phase and the write phase, there may be zero or more cycles (or asynchronous duration) where the selected word-line, bit-line, and plate-lines are pulled-down to ground. In some embodiments, in the cure phase, the word-line is asserted again just like in the write phase. In the cure phase, the voltage on bit-line is inverted compared to the voltage on the bit-line in the write phase. In various embodiments, in the cure phase, the plate-line of the selected bit-cell capacitor is set to half Vdd (or substantially half Vdd). In various embodiments, the plate-lines coupled to the unselected capacitors of the same bit-cell are also set to half Vdd (or substantially half Vdd). While the embodiments here are described with reference to setting the plate-line at half Vdd, the voltage of the plate-line can be set to other than half Vdd based on actual silicon data to calibrate the voltage of plate-line to effectively negate disturb accumulation voltage over time. In some embodiments, the calibration may be a feedback system integrated in the memory logic that monitors the disturb accumulation voltage over time and adjusts the plate-line voltage during that phase to effectively negate disturb accumulation voltage or disturb field to zero or substantially zero over time.

In various embodiments, the word-lines and the plate-lines of other unselected bit-cells are set to 0V during the cure phase. By programming a value in a selected capacitor to be opposite of the value written in the write phase of that selected capacitor, time accumulation of disturb is negated. This allows to substantially zero out any disturb field on the unselected capacitors of the same bit-cell and/or other unselected bit-cells. In some embodiments, the duration of the cure phase can be adjusted compared to the write phase if there is asymmetric behavior. Here, the term "asymmetric behavior" may generally refer to non-zero time accumulation of disturb voltage on a node (e.g., plate-line coupled or connected to a capacitor) over an entire duration of the write and cure phases.

Figure 9B:
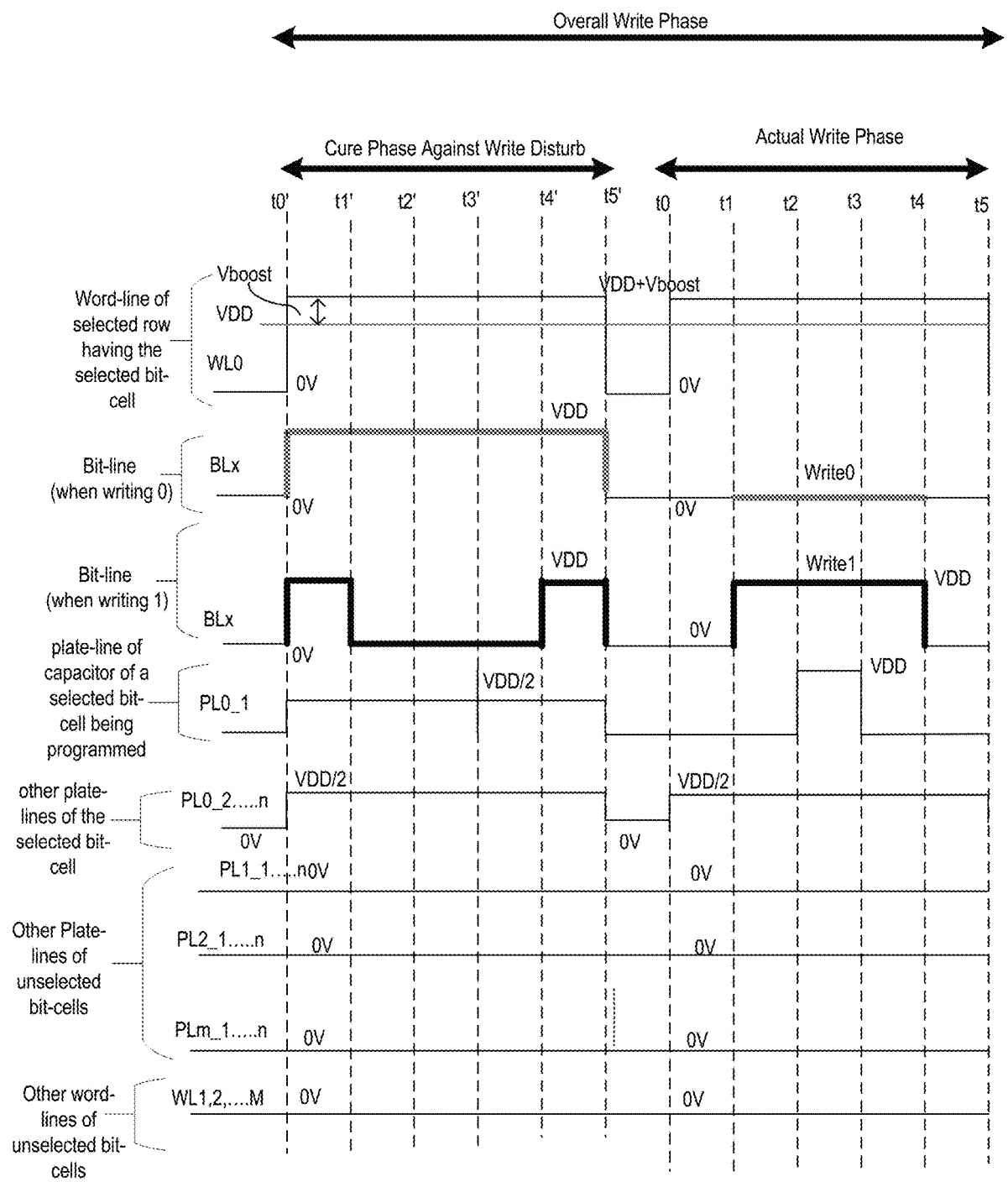
FIG. 9B illustrates a timing diagram of a write operation with a cure phase before a write phase for the bit-cell of FIG. 7A, in accordance with some embodiments.

FIG. 9B illustrates timing diagram 920 of write operation with a cure phase before a write phase for the bit-cell of FIG. 7A, in accordance with some embodiments. Timing diagram 920 is like timing diagram 900 but for the cure phase occurring immediately before the write phase. In various embodiments, a memory controller or the circuities driving data to memory know what will be written to the memory. Knowing that information a priori allows to perform the cure phase prior to the actual write phase. In some embodiments, between the cure phase and the write phase, there may be zero or more cycles (or asynchronous duration) where the selected word-line, bit-line, and plate-lines are pulled-down to ground.

In some embodiments, in the cure phase, the word-line is asserted just like in the write phase. In the cure phase, the voltage on bit-line is inverted compared to the voltage on the bit-line in the write phase. Since the voltage or pulse configuration on the bit-line is known a priori for the write phase, that same pulse is used to generate the bit-line pulse for the cure phase. For example, an inverter is used to invert the voltage or pulse configuration on the bit-line for the write phase to generate the voltage or pulse configuration on the bit-line in the cure phase.

In various embodiments, in the cure phase, the plate-line of the selected bit-cell capacitor is set to half Vdd (or substantially half Vdd). In various embodiments, the plate-lines coupled to the unselected capacitors of the same bit-cell are also set to half Vdd (or substantially half Vdd). In various embodiments, the word-lines and the plate-lines of other unselected bit-cells are set to 0V during the cure phase.

By programming a value in a selected capacitor to be opposite of the value written in the write phase of that selected capacitor, time accumulation of disturb is negated. This allows to substantially zero out any disturb field on the unselected capacitors of the same bit-cell and/or other unselected bit-cells.

Figure 10:
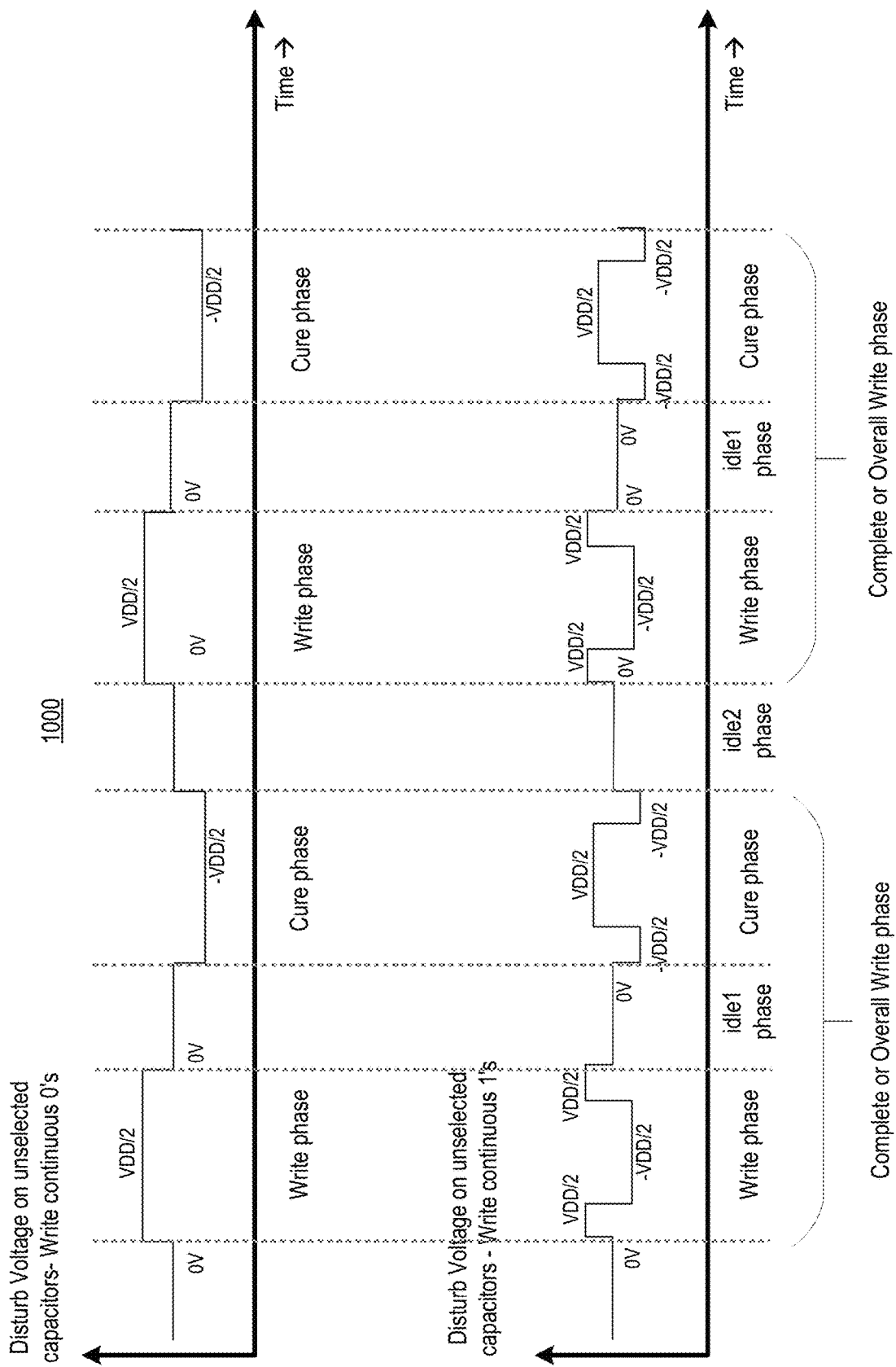
FIG. 10 illustrates plots showing worst case write operation scenario that result in substantially zero time accumulative disturb error on unselected capacitors of bit-cell using the schemes of FIG. 9A or FIG. 9B, in accordance with some embodiments.

FIG. 10 illustrates plot 1000 showing worst case write operation scenario that results in substantially zero time accumulative disturb error on unselected capacitors of bit-cell using the schemes of FIG. 9A or FIG. 9B, in accordance with some embodiments. For each waveform, the x-axis is time, and the y-axis is voltage, where Vdd is the voltage on a power supply rail, and 0V is voltage on a ground supply rail. In some embodiments, a voltage divider or an analog multiplexer is used to provide other voltages includes Vdd/2 and −Vdd/2.

The top plot shows disturb voltage on unselected capacitors of the same bit-cell (e.g., 1TnC bit-cell) when a selected capacitor of the bit-cell is continuously written with logic zero values (i.e., Vss). The top plot shows that the average disturb voltage on the unselected capacitors of the same bit-cell is substantially zero and so it is not time accumulative. The bottom plot shows disturb voltage on unselected capacitors of the same bit-cell (e.g., 1TnC bit-cell) when a selected capacitor of the bit-cell is continuously written with logic one values (i.e., Vdd). The bottom plot shows that the average disturb voltage on the unselected capacitors of the same bit-cell is substantially zero and so it is not time accumulative. In some cases, there may be a residual half-cycle effect for Vdd/2 on the unselected capacitors of the same bit-cell, but there is no time accumulative write disturb. By applying a cure phase before or after the write phase, the write disturb is negated on the unselected bit-cells. The same plots are also illustrative for multi-element FE gain bit-cell.

In various embodiments, the idle phase (idle2 phase) between the overall write phases can be 0 or more cycles or durations (e.g., asynchronous duration). For example, the overall write phases can be back-to-back without any idle duration. In some embodiments, the idle phase (idle1 phase) between the write phase and cure phase can be 0 or more cycles or durations (e.g., asynchronous duration). For example, the write and cure phases can be back-to-back without any idle duration.

Figure 11:
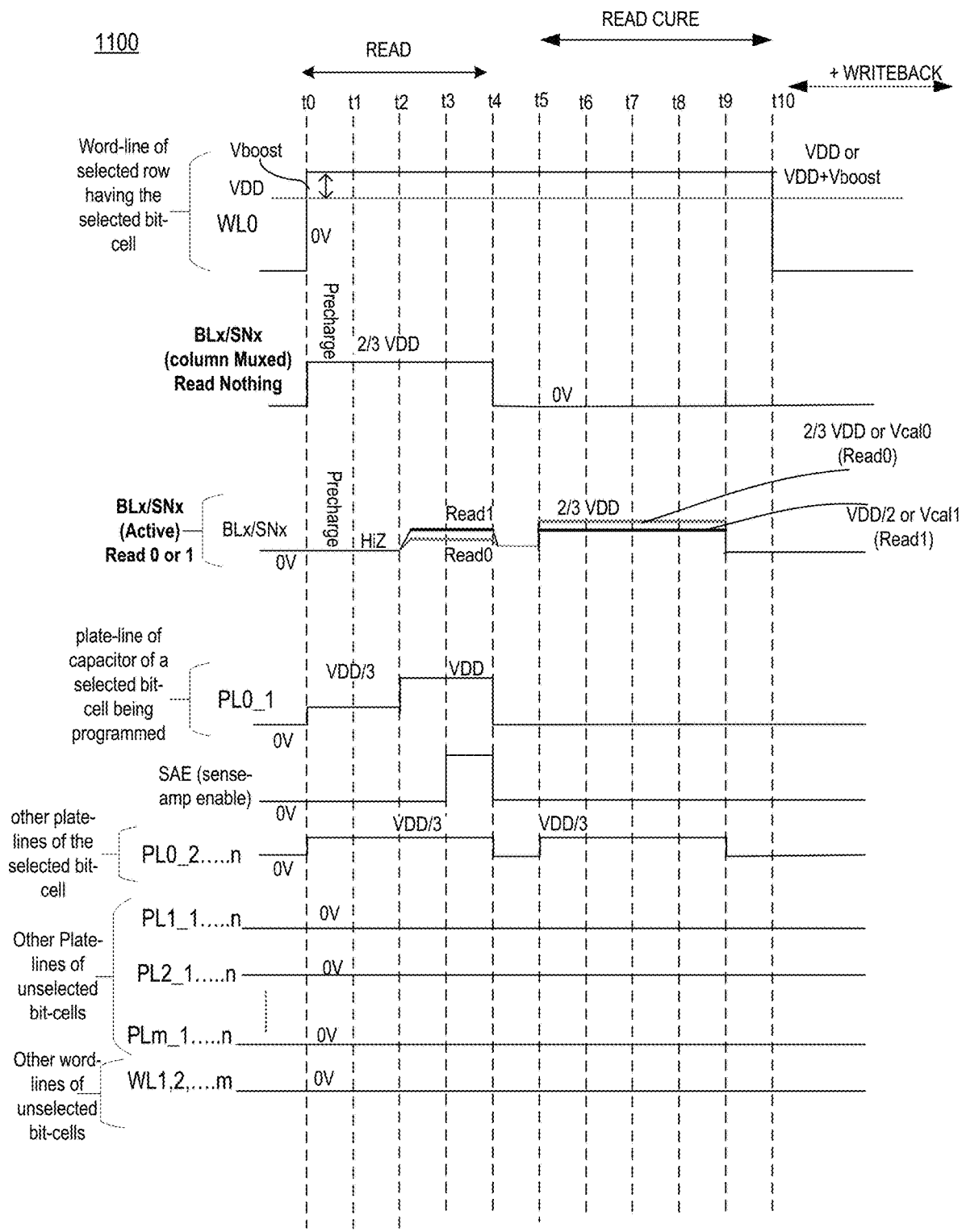
FIG. 11 illustrates a timing diagram of a read operation with a read cure phase after a read phase for 1TnC bit-cell, in accordance with some embodiments.

FIG. 11 illustrates timing diagram 1100 of a read operation with read cure phase after a read phase for 1TnC bit-cell, in accordance with some embodiments. The read operation comprises three phases. The first phase is a read phase. The second phase is a read cure phase. The third phase is a writeback phase. In this illustration, data is being read from storage node SN (here SNx) of a 1TnC bit-cell. The read phase in this example is from t0 to t4. The read cure phase is from t5 to t10. The writeback phase is after t10. In various embodiments, the writeback phase is same as the write operation discussed herein which includes a write phase and a cure phase. In some embodiments, the duration of the read cure phase can be adjusted compared to the read phase if there is asymmetric behavior. For example, the read cure phase can be made longer or shorter than shown based on the asymmetric behavior.

From time t0 to t4, the read operation (herein the read phase) is similar as that described with reference to FIG. 7D but with column multiplexing. Column multiplexing is a technique that allows memory address signals to select a portion of memory from a memory array, memory section, or memory bank as final output.

In some embodiments, PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BL is set or forced to zero volts. In some embodiments, storage node SN of the selected bit-cell SNx is precharged via BL and then floated. Here, "floating" means that there is no active driver for the node. For example, SN node is in high impedance state (HiZ). In this case, the precharged voltage value acts as the initial bias voltage, which can then go down or up depending upon leakage characteristics at that node, or due to ferroelectric capacitors on the SNx node interacting with the read mechanism associated with PL pulsing.

At that point the PL for the desired FE capacitor is toggled, which results in voltage buildup on the SNx node. The voltage build-up on the SNx node may be different voltage levels depending upon whether the FE capacitor state was logic 0 or logic 1. The time-sampling of this voltage relative to a reference expected value results in detection of the state in which the FE capacitor was programmed.

In some embodiments, the bit-line for the memory bit-cell, which is to be read, is set to 0V while other bit-lines that are column multiplexed (as they are not read) are set to a non-zero voltage such as a ⅔ Vdd during the read phase. As a result, the storage node for the column multiplexed bit-cells is also set to non-zero voltage such as a ⅔ Vdd as it follows the voltage pattern of the column multiplexed bit-lines. In various embodiments, the plate-line coupled to the capacitor being read (e.g., PL0_1) is initially set to Vdd/3 when WL is boosted or set to Vdd. Thereafter, PL0_1 is raised to Vdd and the voltage on SNx is read when SAE is enabled. When the selected plate-line (here PL0_1) is being pulsed from Vdd/3 to Vdd, other plate-lines (e.g., PL0_2, ... n) of the same 1TnC bit-cell are parked at Vdd/3. Other plate-lines of other bit-cells of the memory are forced to 0V as shown. The same is true for unselected word-lines (e.g., WL1, 2, through m).

After reading or sensing the data from the storage node, the read cure phase begins. In some embodiments, between the read phase and the cure phase there may be zero or more cycles (or asynchronous duration) where voltages on BLx (and thus SNx), and plate-lines is set to 0V. In some embodiments, the selected WL remains at Vdd or boosted Vdd during the zero or more cycles (or asynchronous duration) between the read phase and the read cure phase. In some embodiments, when the read cure phase begins (here at t5), selected word-line (here WL0) continues to be at Vdd or boosted Vdd. In various embodiments, the column multiplexed bit-line is set to 0V while the bit-line of the selected bit-cell is set to ⅔ Vdd for read 0 case or Vdd/2 for Read 1 case. In that time (e.g., t5 though t9), the storage node of the selected bit-cell has a voltage level of ⅔ Vdd (for Read 0 case) and Vdd/2 for read 1 case. This voltage on the selected bit-line and thus the storage node SNx can be other than Vdd/2. For example, a voltage level determined during testing or from silicon data that maps to reading a voltage level of logic 1 can be used instead of Vdd/2 for the selected bit-line and thus the storage node. This voltage level is also referred to as the calibration voltage (or Vcal). The voltage on the column multiplexed storage nodes SNx is 0V as it follows the voltage on the column multiplex bit-line BLx. In various embodiments, the selected plate-line PL0_1 is set to 0V in the read cure phase while the other plate-lines of the same bit-cell are set to Vdd/3. Plate-lines and word-lines of non-selected bit-cells remains at 0V during the read cure phase.

In various embodiments, values programmed in the read cure phase are opposite to those in the read phase. The combination of the sequence of signals in both phases results in substantially zero time accumulative disturb on unselected capacitors of bit cells while enabling column multiplexing.

In some embodiments, one cycle before the end of the read cure phase (e.g., between t9 and t10), column multiplexed bit-line, selected plate-line and non-selected plate-lines of the same bit-cell and other bit-cells, and the non-selected word-lines are all set to 0V. Thereafter, the writeback operation begins which follows write phase and a write cure phase as discussed with reference to the write operation for a 1TnC bit-cell. In some embodiments, before the writeback process begins, WL may toggle from Vdd (or boosted Vdd) to 0V and back to Vdd (or boosted Vdd). In some embodiments, the WL continues to remain at Vdd (or boosted Vdd) during the read, read cure, and writeback phases.

Figure 12A:
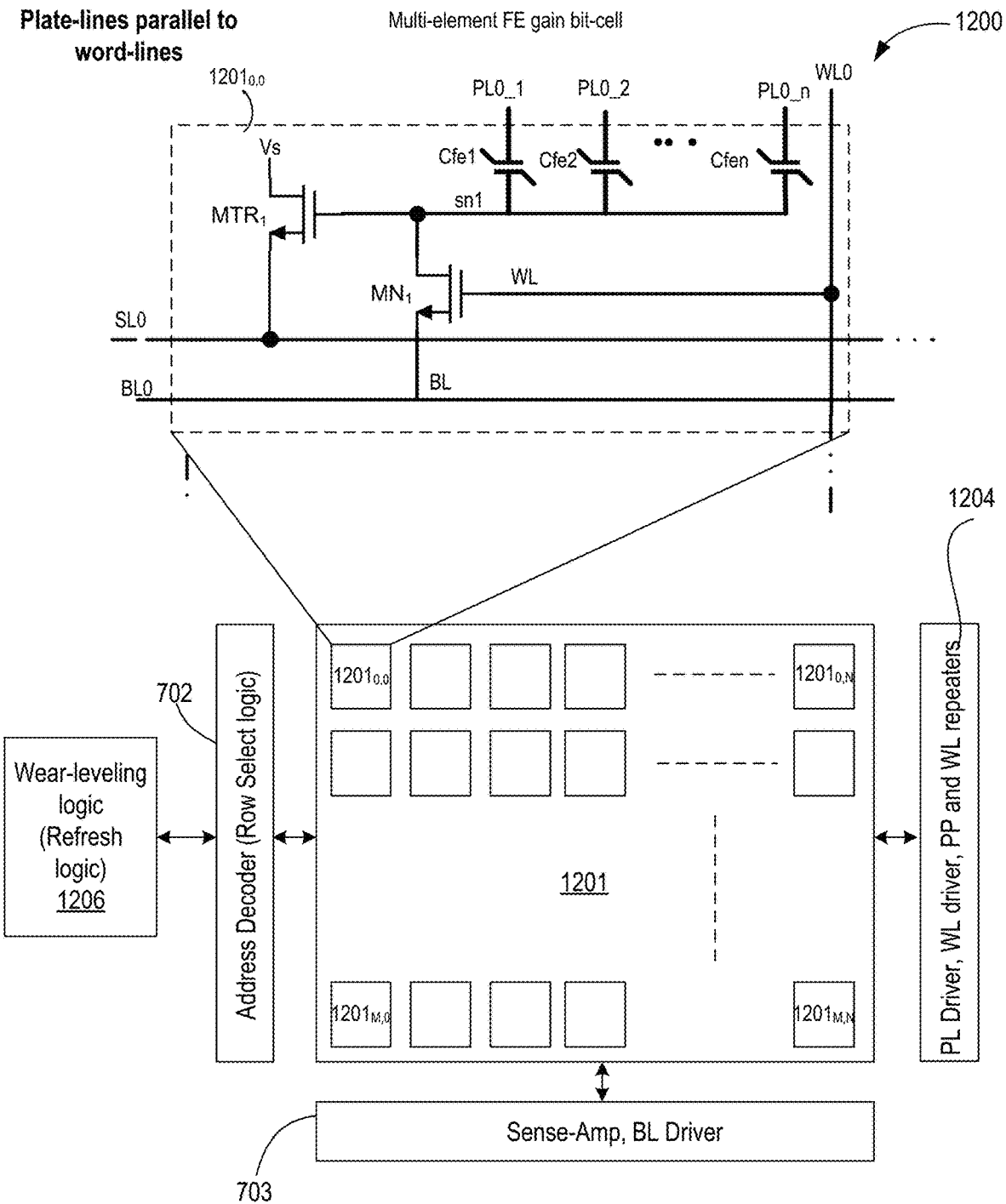
FIG. 12A illustrates an apparatus comprising memory and corresponding logic, wherein the memory comprises FE memory bit-cells, where an individual memory bit-cell is multi-element FE gain bit-cell with plate-lines parallel to a word-line, in accordance with some embodiments.

FIG. 12A illustrates apparatus 1200 comprising memory and corresponding logic, wherein the memory comprises FE memory bit-cells, where an individual memory bit-cell is multi-element FE gain bit-cell with plate-lines parallel to a word-line, in accordance with some embodiments. Apparatus 1200 is like apparatus 700 of FIG. 7A but multi-element FE gain bit-cells instead of 1TnC bit-cells. In some embodiments, each memory bit-cell in memory array 1201 is organized in rows and columns like in apparatus 700. For example, memory bit-cells $1201_{0,0}$ through $1201_{M,N}$ are organized in an array. In some embodiments, PL drivers and WL drivers are lumped in logic 1204 orthogonal to BL drivers in logic circuitry 703, in accordance with some embodiments. Here, wear-leveling logic 706 is labeled as 1206.

In some embodiments, a memory comprises FE memory bit-cell (e.g., $1201_{0,0}$) comprises n-type select transistor $MN_1$, n-type transistor $MTR_1$, bit-line (BL), word-line (WL), sense-line (SL), and 'n' number of ferroelectric (or paraelectric) capacitors Cfe1 through Cfen. In various embodiments, the gate terminal of the n-type transistor $MN_1$ is coupled to WL (e.g., WL1). In some embodiments, the drain or source terminal of the n-type transistor $MN_1$ is coupled to BL. In various embodiments, first terminals of each of the capacitors Cfe1 through Cfen are coupled to a storage node sn1. The storage node sn1 is coupled to a source or drain terminal of n-type transistor $MN_1$ and to a gate of transistor $MTR_1$. In various embodiments, drain or source terminal of $MTR_1$ is coupled to a bias voltage Vs. In some embodiments, Vs is a programmable voltage that can be generated by any suitable source. Vs voltage helps in biasing the gain transistor in conjunction with the sense-voltage that builds at sn1 node. In some embodiments, the source or drain terminal of transistor $MTR_1$ is coupled to SL (e.g., SL1). In some embodiments, a p-type transistor can be used as well for gain.

In some embodiments, second terminals of each of the capacitors Cfe1 through Cfen are coupled to a corresponding plate-line (PL). For example, the second terminal of Cfe1 is coupled to PL0_1, the second terminal of Cfe2 is coupled to PL0_2, and so on. Apparatus 1200 has n-number of PLs (e.g., PL0_1 through PL0_n) per column which are parallel to a BL for that column, in accordance with some embodiments. In some embodiments, the SL is parallel to the PL. In some embodiments, the SL is parallel to the WL.

In some embodiments, ferroelectric (or paraelectric) capacitors Cfe1 through Cfen are planar capacitors such as those discussed with reference to various embodiments herein. In some embodiments, ferroelectric (or paraelectric) capacitors Cfe1 through Cfen are pillar capacitors such as those discussed with reference to various embodiments herein. In some embodiments, the ferroelectric (or paraelectric) capacitors Cfe1 through Cfen are vertically stacked and horizontally folded allowing for tall bit-cells (e.g., higher in the z-direction) but with x-y footprint two transistors. By folding the capacitors, the diffusion capacitance on the BL reduces for a given array size, which improves reading speed. Further, folding the capacitors lowers the effective routing capacitance on the BL. The larger footprint in the x-y direction of multi-element FE gain bit-cell compared to the footprint in the x-y direction of 1TnC bit-cell, vertical height of the capacitor can be reduced as the capacitors can expand in the x-y direction more than before for a given height. As such, capacitors are folded more effectively. For example, n/2 capacitors per metal or via layer can be packed. In various embodiments, more capacitors can be stacked in multi-element FE gain bit-cell because storage node sn1 is decoupled from the BL. The multi-element FE gain bit-cell reduces the thickness scaling requirement for the pillar capacitor. The polarization density requirements are reduced for multi-element FE gain bit-cell compared to 1TnC bit-cell.

In this example, the x-y footprint is determined by the size of transistor $MN_1$ and its connections to BL, WL, and storage node sn1. In some embodiments, the footprint can still be decided by other factors such as: a number of capacitors that connect to the node; how the capacitors are arranged, e.g., more folding on the same node versus stacking; effective size constraints on those capacitors; and number of capacitors that share the same bit-cell. In some embodiments, PL (e.g., PL0_1, PL0_2, . . . . PL_n) controls which cell within the same access transistor gets programmed, and the value of programming. In some embodiments, BL acts as a sense-line. The voltage on BL (e.g., sense voltage) can create disturbance on other bit-lines during read operation.

To mitigate such disturbances, in some embodiments, multi-element FE gain bit-cell (e.g., $1201_{0,0}$) is periodically refreshed (e.g., every 1 second). In some embodiments, periodic refresh is minimized by refreshing in active mode of operation that can be coupled with advance schemes for wear leveling. In standby mode (e.g., low power mode), multi-element FE gain bit-cell (e.g., $1201_{0,0}$) is not refreshed as there is no disturb mechanism during standby. In some embodiments, multi-element FE gain bit-cell (e.g., $1201_{0,0}$) relies on isolating the read mode from BL or SL capacitance by isolating through access transistor $MN_1$, where $MN_1$ transistor facilitates pre-charging the sn1 node, prior to read operation. In some embodiments, the number of refresh events in the lifetime of the memory array 1201 is reduced by using a cure phase before or after a write phase as discussed herein.

In some embodiments, there is a possibility of disturbance at the storage node sn1 during read operation. In some embodiments, PL is toggled for other capacitors to the average value of the disturbance that will be seen on the sn1 node. i.e., when a read pulse of some polarity is applied at PL of the capacitor to be read, a non-zero voltage is applied on other PLs of multi-element FE gain bit-cell (e.g., $1201_{0,0}$), that matches the expected disturbance seen on the shared node. In one such example, the PL driver is configured to support driving different voltage levels on different PLs. In some embodiments, wear-leveling logic 1206 provides one or more endurance mechanisms for the multi-element FE gain bit-cells. One of the endurance mechanisms involves refreshing of the data content in the capacitor(s).

When the plate-line is parallel to the word-line, a write operation without appropriate signaling may inherently mean writing the same value to each bit-cell. For example, writing a value by controlling the plate-line, which is shared across all selected bit-cells since the plate-line is parallel to the word-line, may result in writing the same value to all the bit-cells. To control this effect, in some embodiments, the one or more circuitries carry out a different pulsing scheme for read or write operations when the plate-line is parallel to the word-line.

In some embodiments, the one or more circuitries boost the word-line above a voltage supply level during a write operation and a read operation. In some embodiments, the one or more circuitries generates a first pulse on the bit-line after the word-line is boosted and before an end of the boost on the word-line during a first write operation (Write 1). In some embodiments, the one or more circuitries generates a second pulse on the plate-line after the word-line is boosted and before the end of the boost on the word-line during a second write operation (e.g., Write 0) different from the first write operation. In some embodiments, the one or more circuitries generate a third pulse on the plate-line after the word-line is boosted and after the first pulse begins during the first write operation, wherein the third pulse ends about a time when the first pulse ends. In some embodiments, in the case where the plate-line is parallel to the word-line, the memory comprises a refresh circuitry to refresh charge on the capacitor periodically or at a predetermined time. The refresh circuit can utilize one or more of the endurance mechanisms described herein. In some embodiments, the number of refresh events in the lifetime of the memory array 1201 is reduced by using a cure phase before or after a write phase as discussed herein.

Figure 12B:
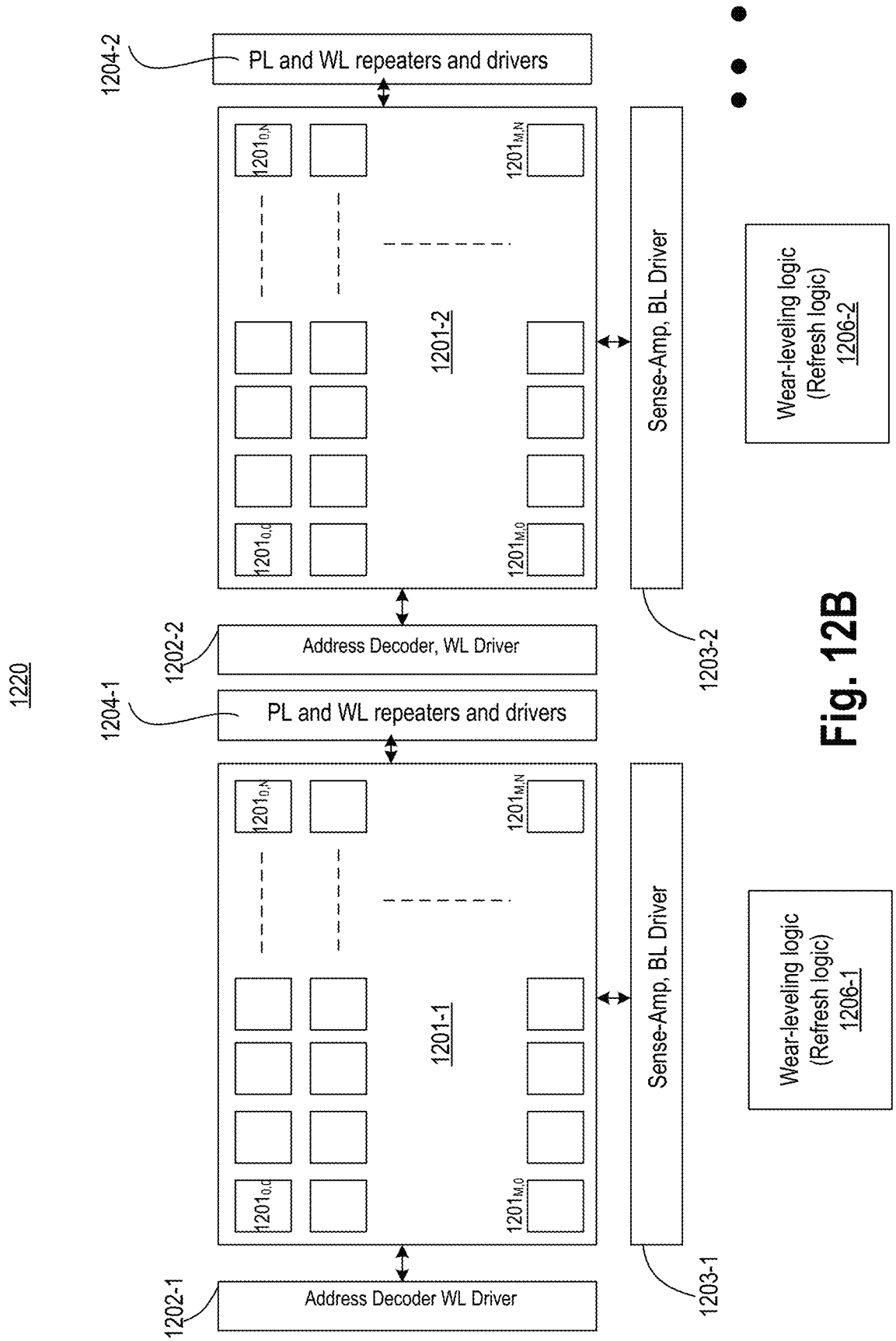
FIG. 12B illustrates an apparatus having FE memory with word-line repeaters, wherein memory arrays of the FE memory having multi-element FE gain bit-cells with the plate-lines parallel to the word-line, in accordance with some embodiments.

FIG. 12B illustrates apparatus 1220 having FE memory with word-line repeaters, wherein memory arrays of the FE memory having multi-element FE gain bit-cells with the plate-lines parallel to the word-line, in accordance with some embodiments. Apparatus 1220 illustrates two instances of apparatus 1200. The two instances include first memory array 1201-1, logic circuitry 1202-1 having first address decoder and/or WL driver, logic circuitry 1203-1 having first sense amplifier and BL driver, logic circuitry 1204-1 having PL and WL repeaters; second memory array 1201-2, logic circuitry 1202-2 having first address decoder and/or WL driver, logic circuitry 1203-2 having first sense amplifier and BL driver, and logic circuitry 1204-2 having PL and WL repeaters. In some embodiments, an individual instance of apparatus 1200 includes a corresponding wear-leveling logic 1206 (e.g., wear-leveling logic 1206-1 and wear-leveling logic 1206-2). In some embodiments, when the pulsing scheme described herein is combined with the refresh function by wear-leveling logic 1206-1 and wear-leveling logic 1206-2, disturbance issues on unselected bit-cells are mitigated. While two memory arrays are shown (e.g., memory arrays 1201-1 and 1201-2), any number of arrays may be part of apparatus 1220. With PL parallel to the WL and orthogonal to logic circuitries 1204-1, 1204-2 etc., having BL, PL and WL repeaters are added to improve the driving strength of the plate-line signals and the word-line signals. In some embodiments, BL repeaters operate on Vdd supply while WL repeaters operate on a higher power supply level (e.g., Vdd+Vboost) to implement WL boosting.

Figure 12C:
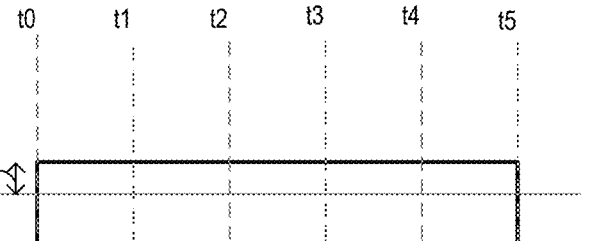
FIG. 12C illustrates a timing diagram for write operation for multi-element FE gain bit-cells with the plate-line parallel to the word-line, in accordance with some embodiments.

FIG. 12C illustrates timing diagram 1230 for write operation for multi-element FE gain bit-cells with the plate-line parallel to the word-line, in accordance with some embodiments. Depending on whether logic 1 (Write 1) or logic 0 (Write 0) is being written to the selected capacitor with non-linear polar material, BL, or PL (e.g., BLx and PL0_1) associated with that capacitor of the bit-cell (e.g., $1201_{0,0}$) is asserted from 0V to Vdd (power supply level). Other WLs or PLs not part of the bit-cell are forced to 0V. In some embodiments, other PLs (e.g., PL0_2, PL0_3, . . . . PL0_n) of the selected bit-cell (e.g., $1101_{0,0}$) are set between 0 and Vdd (e.g., Vdd/2, or any other suitable or programmable voltage between 0 and Vdd). In some embodiments, PL of the unselected bit-cells (e.g., PL1_0, . . . . PL1_n to PLm_0, . . . . PLm_n) are set to 0V. In some embodiments, the WLs for the unselected bit-cells (e.g., WL1, WL2, . . . . WLm) are set to 0V.

In various embodiments, write operation begins when WL is asserted and boosted above Vdd. The boost level is Vboost which may be 10-50% of Vdd. In one example, Vboost is about 1× to 1.5× of a threshold voltage (Vt) of transistor $MN_1$. Since the select transistor in these configurations is an n-channel device, it is good at passing the 0V and signals closer to it. The signal applied through the BL however, when it is at Vdd, may not pass through the transistor $MN_1$ in completeness. As such, there is a Vt drop across the n-type transistor $MN_1$ if the WL is driven to Vdd. To help get the full range of signaling across the FE capacitor Cfe1, WL-boosting helps negate the Vt drop across the transistor such that BL when driven to Vdd, internal node will also see Vdd, as opposed to Vdd-Vt.

For the bit-cell topology with PL parallel to the WL, the word-line boosting is used as otherwise it can lead to a buildup of a voltage level of approximately 2× Vdd on the storage node sn1, when BL line is at Vdd, and PL goes from 0V to Vdd. Since, with WL at Vdd, the transistor $MN_1$ can be off with BL at Vdd, the storage node sn1 will sit at Vdd-Vt when PL is at 0V. After that when PL goes from 0V to Vdd, the internal node can jump to 2Vdd-Vt level. When WL is voltage boosted, and the PL voltage rises from 0V to Vdd, the storage node or internal node may not see the voltage spike, as the transistor $MN_1$ may still be in the on condition. This helps with the reliability aspect of the transistor $MN_1$. Note, a large voltage buildup on the storage node or internal node of the transistor can cause lifetime degradation and correspondingly yield issues.

When a particular bit-cell (e.g., $1201_{0,0}$) is being written to, the WL for unselected bit-cells (e.g., WL0 through WLm) remains at 0. Same is done for unselected PLs as illustrated. Timing diagram 1230 is a first order diagram without column multiplexing. A person skilled in the art would appreciate that column multiplexing is used for accessing memory bit-cells in an array. Here, all BLs within an active array are toggled according to what is being written. Since the BLs are orthogonal to the WL, and PL is being toggled, BLs are driven either 0 or 1, depending on what is being written. In some embodiments, when column multiplexing is implemented, the corresponding BL lines of inactive bit-cells are set to Vdd/2 to minimize the disturb effect on those bit-cells. Column multiplexing may reduce the overhead of the peripheral circuitry (not shown). In some embodiments, column multiplexing may not be used to avoid any disturb effect on unselected bit-cells.

In various embodiments, the BL and PL for the selected bit-cell capacitor are asserted and de-asserted within a pulse width of the boosted WL. In some embodiments, the voltage swing for BL and PL is between 0 to Vdd. In some embodiments, the selected PL (PL1_0) is asserted and de-asserted within the pulse width of BLx (e.g., BL0). In some embodiments, unselected PLs of the selected bit-cells are parked at a lower voltage (e.g., Vdd/2) to limit the disturb effect on those capacitors due to voltage on the internal node sn1 being either Vdd or 0. This limits the disturbance as seen by other ferroelectric capacitors of the selected bit-cells. The pulse width of the unselected PLs (e.g., PL0_2, PL0_3, . . . . PL0_n), of the selected bit-cell is substantially the same as the pulse width of the boosted WL (e.g., WL0), in accordance with some embodiments.

In some embodiments, the BL or PL pulse is generated after a predetermined or programmable time from when WL boost starts, and the BL or PL pulse ends within the WL pulse. In one example, to write a logic 1 to all capacitors Cfe1 through Cfen, BL pulse is generated within the pulse width of the boosted WL. All other PLs for the unselected bit-cell are set to 0V (e.g., PL1_1, PL1_2, through PL1_n are forced to 0V, and likewise PL2_1, PL2_2, through PL2_n are forced to 0V, and so on).

PLs (e.g., PL0_2 through n) within the same selected bit-cell (e.g., $1201_{0,0}$) are charged to Vdd/2, in accordance with various embodiments. In some embodiments, PL for unselected bit-cells remains at 0V while PL0_1 is being used to program capacitor Cfe1. Word-lines of unselected bit-cells are set to 0V (e.g., WL1, 2, through M are set to 0V when WL0 is selected). In various embodiments, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

Figure 12D:
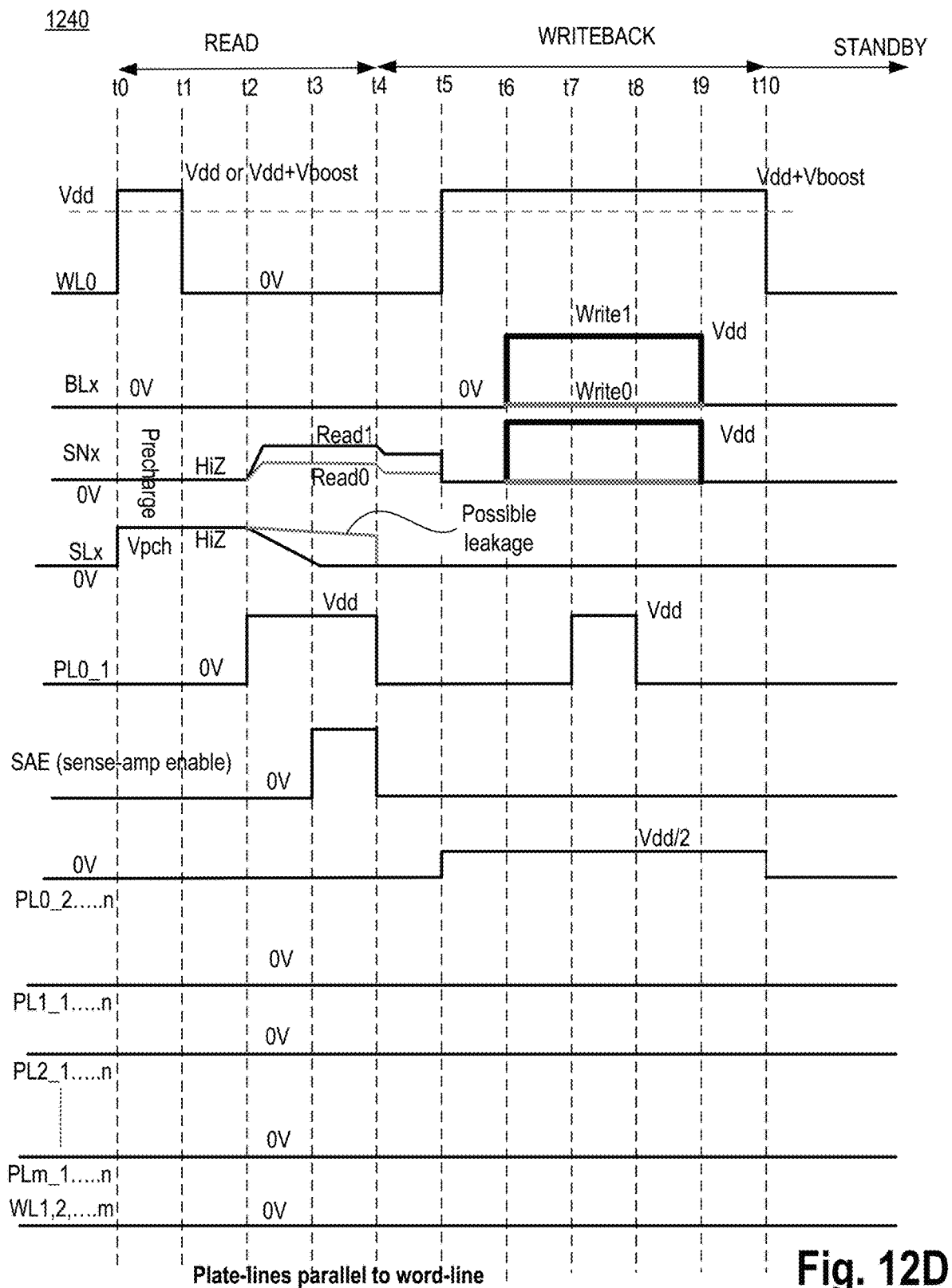
FIG. 12D illustrates a timing diagram for read operation for multi-element FE gain bit-cells with plate-line parallel to the word-line, in accordance with some embodiments.

FIG. 12D illustrates timing diagram 1240 for read operation for multi-element FE gain bit-cells with plate-line parallel to the word-line, in accordance with some embodiments. In some embodiments, read operation begins by asserting the selected WL. In some embodiments, the selected WL is boosted for read operation. WL is boosted above Vdd to Vdd+Vboost level. In some embodiments, a writeback scheme is implemented after the read operation to restore the data value stored in the selected bit-cell due to the destructive nature of the read operation. In one such embodiment, the data which is read is also written back in the writeback time window after the read time window. In some embodiments, PL is asserted for the bit-cell which is being read.

In some embodiments, PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BL is set or forced to zero volts. In some embodiments, storage node SN of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch. SLx is then driven to a high impedance state Z.

At that point the PL for the desired FE capacitor is toggled, which results in voltage buildup on the SNx node. The voltage build-up on the SNx node may be different voltage levels depending upon whether the FE capacitor state was logic 0 or logic 1. Due to different voltage levels on the SNx node, the gain transistor $MTR_1$ may have different conduction properties, which reduces the voltage levels on the SLx node over time with different rates. For example, if SNx node voltage is corresponding to a logic 0 state, the conductance of the gain transistor $MTR_1$ could be lower, and SLx voltage may decay slowly. For a logic 1 state, the conductance of the gain transistor $MTR_1$ could be higher and may result into the SLx voltage going down faster. The time-sampling of this voltage relative to a reference expected value results in detection of the state in which the FE capacitor was programmed. After reading the value, a write-back operation can be done to get the value restored to the FE capacitor, as reads are destructive reads in this configuration, in accordance with some embodiments.

In the write-back process, the selected bit-cell BL (e.g., BLx) is charged to Vdd or set to 0V depending upon whether a logic 1 or a logic 0 is written back to the selected bit-cell. The value written back to the bit-cell is the same value that the sense amplifier detects when reading the voltage on the BL. The write-back mechanism is like the write operation described with reference to FIG. 12C. Here, 'x' in PLx_n indicates the same orientation as WL. For example, plate-lines PL0_1, PL0_2, and PL0_3 are parallel to WL0. Likewise, plate-lines PL1_1, PL1_2, and PL1_3 are parallel to WL1, and so on.

Figure 13A:
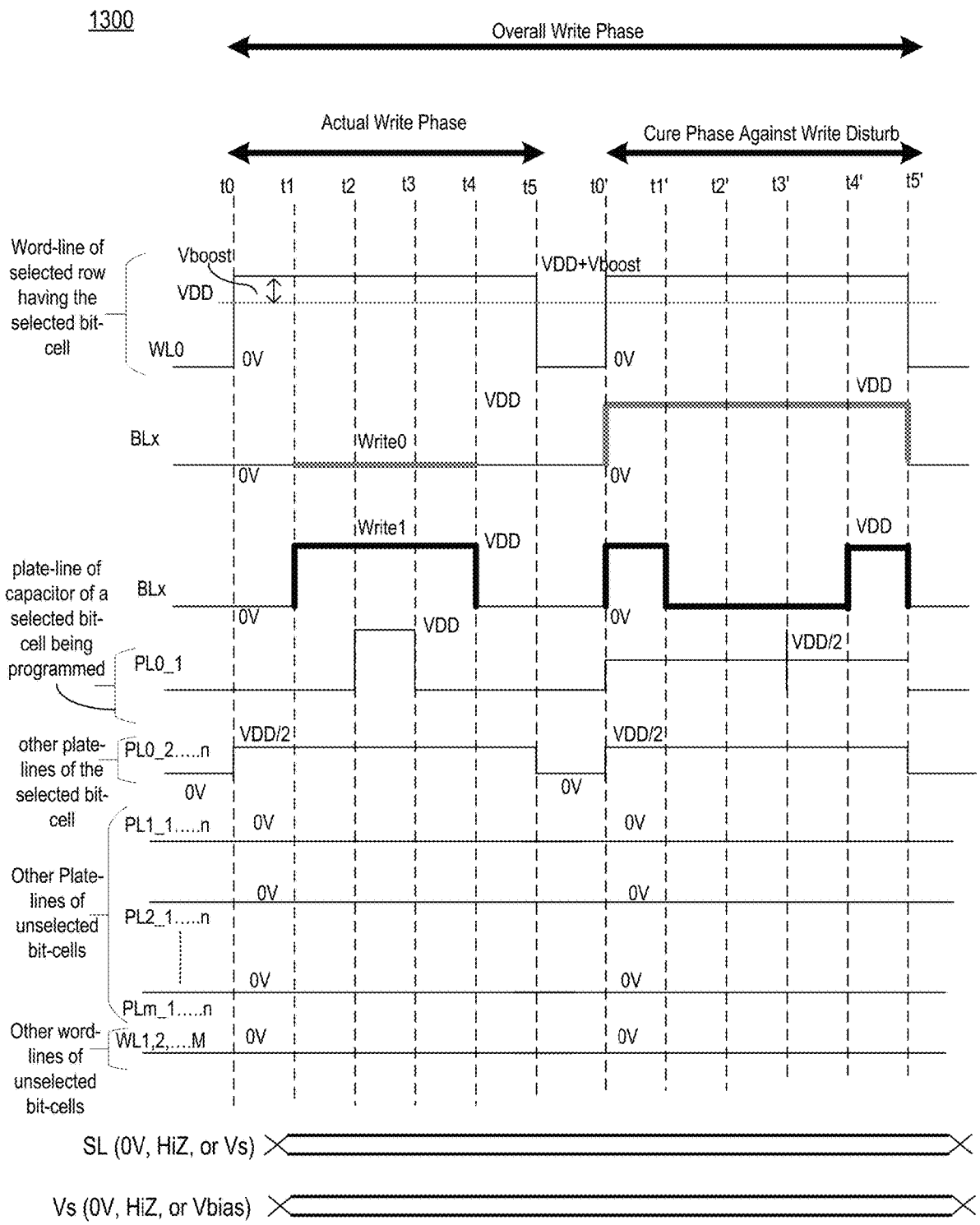
FIG. 13A illustrates a timing diagram of write operation with a cure phase after a write phase for the bit-cell of FIG. 12A, in accordance with some embodiments.

FIG. 13A illustrates timing diagram 1300 of write operation with a cure phase after a write phase for the bit-cell of FIG. 12A, in accordance with some embodiments. Timing diagram 1300 is like timing diagram 900 but for the sense line (SL) and the bias voltage Vs. In various embodiments, during the overall write phase, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

Figure 13B:
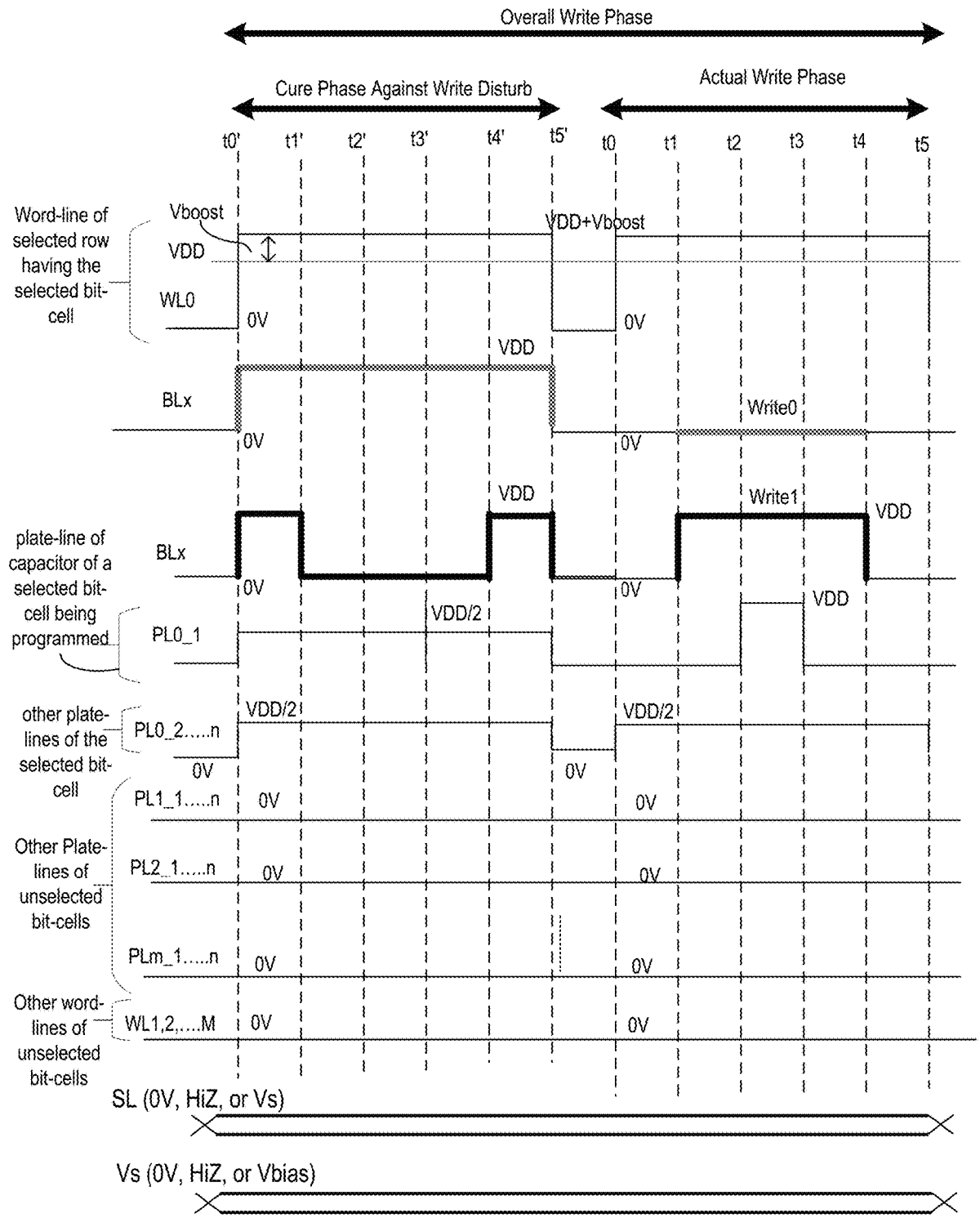
FIG. 13B illustrates a timing diagram of write operation with a cure phase before a write phase for the bit-cell of FIG. 12A, in accordance with some embodiments.

FIG. 13B illustrates timing diagram 1320 of write operation with a cure phase before a write phase for the bit-cell of FIG. 12A, in accordance with some embodiments. Timing diagram 1320 is like timing diagram 920 but for the sense line (SL) and the bias voltage Vs. In various embodiments, during the overall write phase, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

Figure 14:
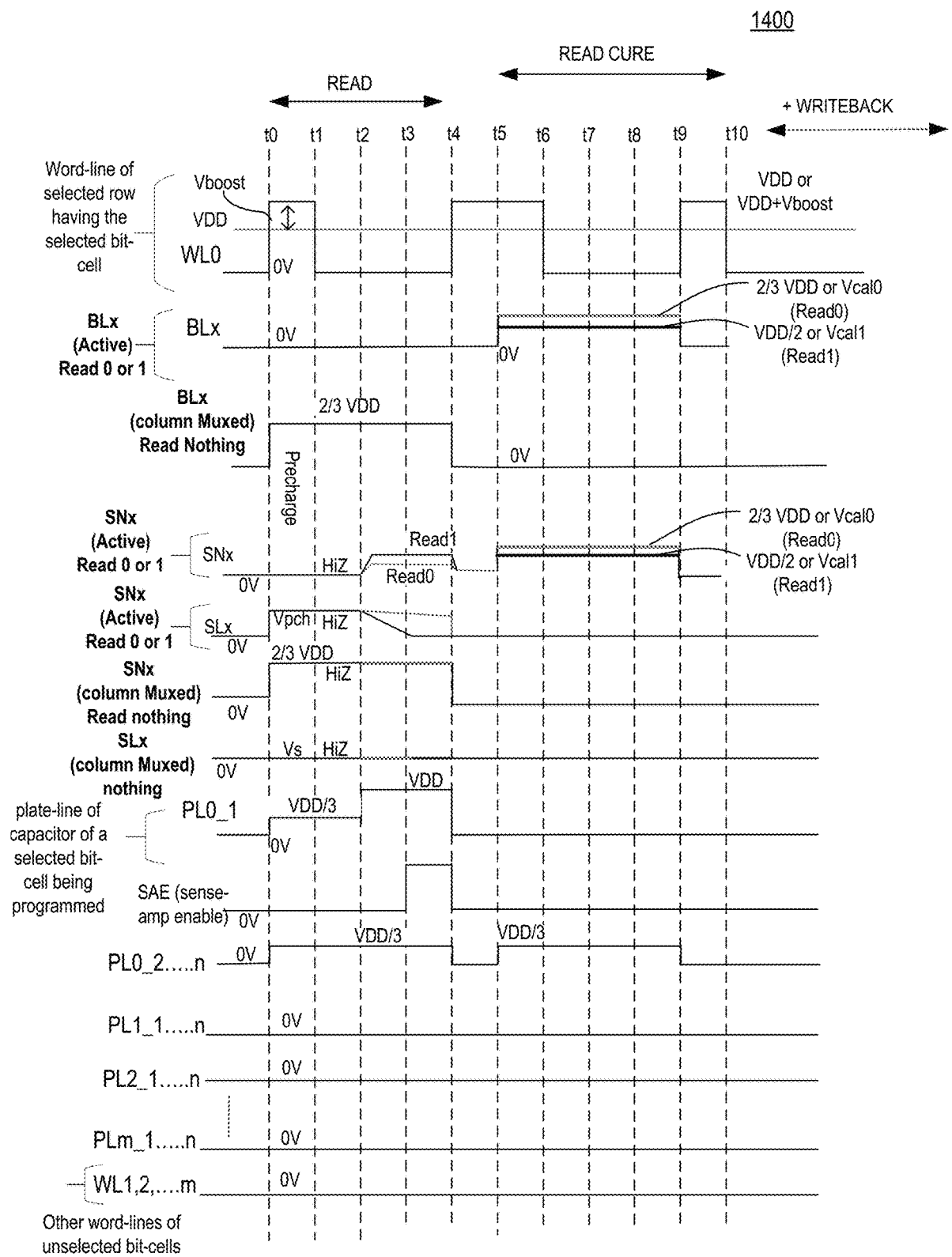
FIG. 14 illustrates a timing diagram of a read operation with a read cure phase after a read phase for multi-element FE gain bit-cell, in accordance with some embodiments.

FIG. 14 illustrates timing diagram 1400 of a read operation with read cure phase after a read phase for multi-element FE gain bit-cell, in accordance with some embodiments. Timing diagram 1400 is same as timing diagram 1200 but for a multi-element FE gain bit-cell. Here, the selected word-line (e.g., WL0) toggles in the read phase and the read cure phase. In some embodiments, when the read phase begins, WL0 is pulsed or toggled between 0V and Vdd (or boosted Vdd). This is shown as a one cycle pulse between t0 and t1. In some embodiments, during this pulse, the select line (SL) may be precharged. In some embodiments, the length of the cycle of the selected WL pulsing (e.g., WL0 pulsing) may be more than one cycle to enable more time to pre-charge. In some embodiments, the length of the cycle of the selected WL pulsing (e.g., WL0 pulsing) may be less than one cycle.

In some embodiments, in the read phase, PL for the selected capacitor of the bit-cell is asserted for a time period long enough for the sense amplifier to sense the value stored on the storage node coupled to the capacitor. In various embodiments, sense amplifier enable signal (SAE) is asserted within the pulse width of the PL. In some embodiments, to read data from the storage node, BL is set or forced to zero volts. In some embodiments, storage node SN of the selected bit-cell SNx is precharged via BL and then floated. Here, "floating" means that there is no active driver for the node. In this case, the precharged voltage value acts as the initial bias voltage, which can then go down or up depending upon leakage characteristics at that node, or due to ferroelectric capacitors on the SNx node interacting with the read mechanism associated with PL pulsing. In some embodiments, SLx is precharged to a certain voltage or a programmable voltage Vpch during the WL0 pulse (e.g., between t0 and t1). SLx is then driven to a high impedance state Z (HiZ). For example, between t1 and t2, SLx is allowed to float.

At that point the PL for the desired FE capacitor is toggled, which results in voltage buildup on the SNx node. The voltage build-up on the SNx node may be different voltage levels depending upon whether the FE capacitor state was logic 0 or logic 1. The time-sampling of this voltage relative to a reference expected value results in detection of the state in which the FE capacitor was programmed. After the read phase, the read cure phase begins, which is same as the read cure phase discussed with reference to timing diagram 1200. In some embodiments, between the read phase and the read cure phase, the selected WL (e.g., WL0) is pulsed from 0V to Vdd (or boosted Vdd). For example, WL0 is toggled or pulsed between t4 and t5. The duration of this pulse width between the read phase and the read cure phase can be any suitable width. For example, the pulse width can be 1 cycle wide, 2 cycle wide, more than 2 cycle wide, less than 1 cycle wide, etc. In various embodiments, the read cure phase is similar to the read cure phase of FIG. 11. In some embodiments, there is no time gap or substantially zero time gap between the read phase and the read cure phase. For instance, the word-line pulsing for the read cure phase happens immediately (or substantially immediately) after the read phase completes. In this example, the gap of t4 to t5 can be removed.

After the read cure phase, the write-back operation begins which comprises a write phase and a write cure phase. In some embodiments, before the write-back operation, the selected word-line (e.g., WL0) is toggled. For example, WL0 is toggled or pulsed between 19 and t10. The duration of this pulse width between the read cure phase and the start of the write-back operation can be any suitable width. For example, the pulse width can be 1 cycle wide, 2 cycle wide, more than 2 cycle wide, less than 1 cycle wide, etc. In some embodiments, prior to the write-base operation, and when the selected WL is pulsed (e.g., between t9 and t10), BLx (and by association, SNx), SLx, column multiplexed SNx and SLx, plate-lines (of selected and unselected bit-cells), and unselected word-lines are set to 0V.

Figure 15:
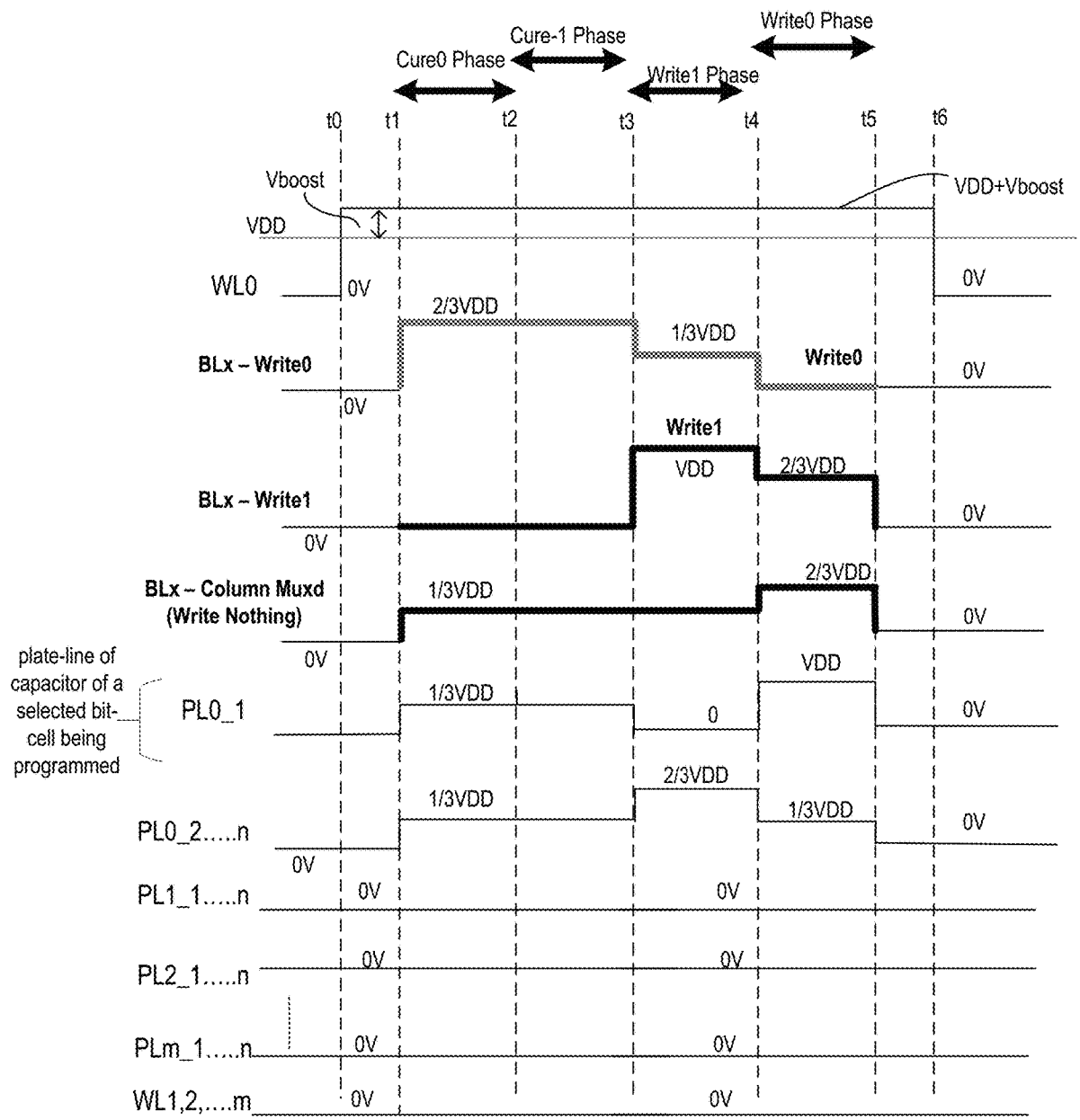
FIG. 15 illustrates a timing diagram of a write disturb mitigation scheme with column multiplexing, in accordance with some embodiments.

FIG. 15 illustrates timing diagram 1500 of a write disturb mitigation scheme with column multiplexing, in accordance with some embodiments. In this case, the plate-line is parallel to the word-line. The write disturb mitigation scheme of FIG. 15 is an alternate embodiment to the write disturb described with reference to FIGS. 9A-B and FIGS. 13A-B. Here, the voltage on the selected plate-line (and plate-lines of unselected capacitors of the same bit-cell) use 4-level signaling. These four levels are 0V, ⅓ Vdd, ⅔ Vdd, and Vdd. The same four levels are also applicable to bit-lines for write 0 and write 1 operations. In the write disturb described with reference to FIGS. 9A-B and FIGS. 13A-B, the plate-line applies 3-level signaling. These three levels include 0V, Vdd/2, and Vdd. In the write disturb described with reference to FIGS. 9A-B and FIGS. 13A-B, the bit-line applies 2-level signaling. These two levels are 0V and Vdd.

Timing diagram 1500 shows a case where the cure phase is applied before the respective write phase. For example, cure 0 phase is applied before write 0 phase, and cure 1 phase is applied before write 1 phase. However, the write phase can be applied before the respective cure phase, in accordance with some embodiments. Timing diagram 1500 shows both cure 0 and cure 1 for illustration. However, in practice, for writing a logic 0, cure 0 phase is followed by write 0 phase. Likewise, for writing a logic 1, cure 1 phase is followed by write 1 phase.

In the write 0 operation, the selected word-line (e.g., WL0) is pulsed to Vdd or boosted Vdd during the write operation. Within the pulse of the WL, the selected BL (e.g., BLx) which is pulsed from 0V to ⅔ Vdd during the cure 0 phase. In the write 0 phase, the selected BL is set back to 0V within the WL pulse. The column multiplexed bit-lines for unselected bit-cells are set to ⅓ Vdd during the cure 0 phase and raised to ⅔ Vdd in the write 0 phase. In various embodiments, the selected PL (e.g., PL1_0) is pulsed to ⅓Vdd during the cure 0 phase, and then pulsed to Vdd for the write 0 phase. The plate-lines of the same bit-cell that are not selected for writing are pulsed to ⅓Vdd during cure 0 phase and the write 0 phase. The unselected plate-lines and word-lines for other unselected bit-cells are set to 0V during cure 0 phase and write 0 phase. After the write operation, the voltages on the plate-lines, bit-lines, and word-lines are set to 0V.

In the write 1 operation, the selected word-line (e.g., WL0) is pulsed to Vdd or boosted Vdd during the write operation. Within the pulse of the WL, the selected BL (e.g., BLx) which is set to 0V during the cure 1 phase. In the write 1 phase, the selected BL is pulsed to Vdd within the WL pulse. The column multiplexed bit-lines for unselected bit-cells are set to ⅓ Vdd during the cure 1 phase and raised to ⅔ Vdd in the write 1 phase. In various embodiments, the selected PL (e.g., PL1_0) is pulsed to ⅓Vdd during the cure 1 phase, and then pulsed to Vdd for the write 1 phase. The plate-lines of the same bit-cell that are not selected for writing are pulsed to ⅓Vdd during cure 1 phase and the write 1 phase. The unselected plate-lines and word-lines for other unselected bit-cells are set to 0V during cure 1 phase and write 1 phase. After the write operation, the voltages on the plate-lines, bit-lines, and word-lines are set to 0V.

Assuming Vdd to be 1V, Table 1 illustrates that the net disturb voltage on the unselected plate-lines of the same bit-cell are zero by the cure 0 and cure 1 phases in association with the write 0 and write 1 phases.

TABLE 1

|  | Cure 0 (V) | Cure 1 (V) | Write 1 (V) | Write 0 (V) | Net Disturb voltage |
|---|---|---|---|---|---|
| BL0 | 0.667 | 0.667 | 0.333 | 0 V |  |
| BL1 | 0 | 0 | 1 | 0.667 |  |
| BLx Column Multiplexed | 0.33 | 0.33 | 0.33 | 0.667 |  |
| PL0_1 | 0.33 | 0.33 | 0 | 1 |  |
| PL0 others | 0.33 | 0.33 | 0.667 | 0.33 |  |
| BL0-PL0_1 | 0.33 | 0.33 | 0.33 | −1 | 0 |
| BL1-PL0_1 | −0.33 | −0.33 | 1 | −0.33 | 0 |
| BLx-PL0_1 (column multiplexed) | 0 | 0 | 0.33 | −0.33 | 0 |
| BL0-PL others | 0.33 | 0.33 | −0.33 | −0.33 | 0 |
| BL1-PL others | −0.33 | −0.33 | 0.33 | 0.33 | 0 |
| BLx-PL0_1 column multiplexed | 0 | 0 | −0.33 | 0.33 | 0 |

In the example of BL1-PL0_1, as indicated by Table 1, after the bit-cell has been written logic 1 (with BL1=1 and PL0_1=0), there may be a net disturb of −0.33 V on the PL0_1. This net disturb may not be an issue because since the cell was just written to. Net disturb across BL1-PL0_1 is 0 if the 4 stages are added. Note, disturb is meant to be avoided for the bit-cells that are not intended to be written or read from. As shown in Table 1, this condition of net zero disturb voltage on the plate-lines (and hence the associated capacitors) is satisfied for all of the BLx cells and the BL0/1-PL of other bit-cells, in accordance with various embodiments.

In some embodiments, the same column multiplex write operation is applicable to multi-element FE gain bit-cell. In multi-element FE gain bit-cell, additional sense line (SL) and bias voltage Vs is added. In various embodiments, during the overall write phase, sense-lines (SL) for all bit-cells are set to 0V, high-impedance, or Vs during the write operation. In various embodiments, Vs for all bit-cells is set to 0V, high-impedance, or a bias voltage (Vbias) during the write operation.

Figure 16:
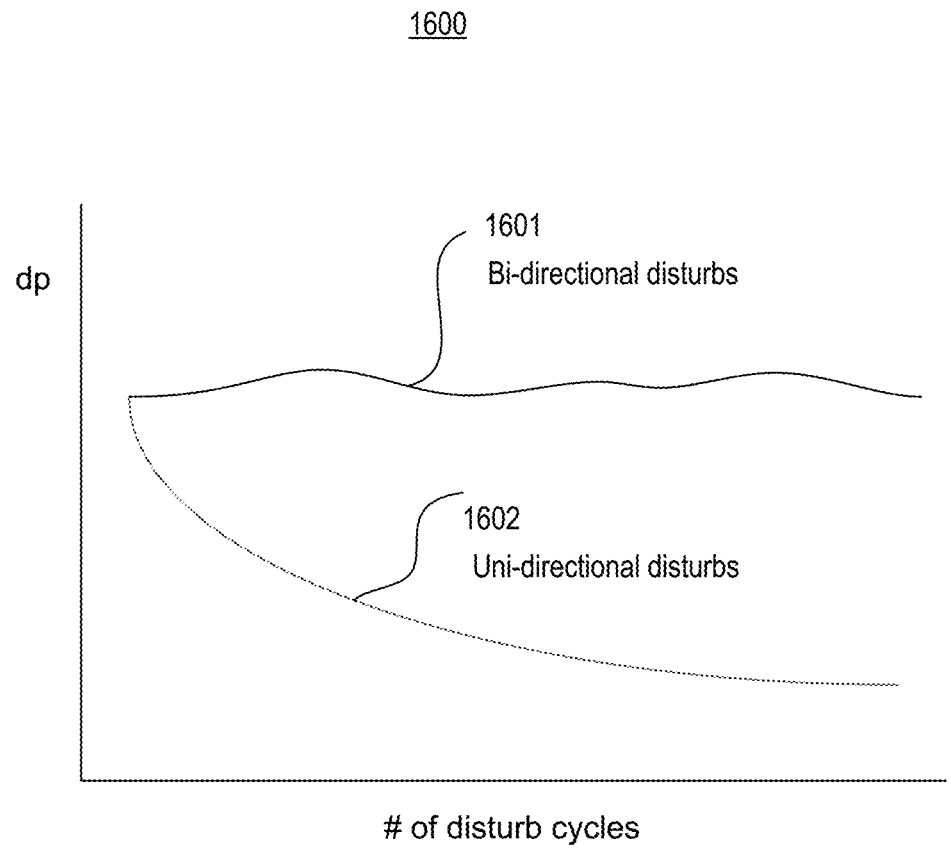
FIG. 16 illustrates a plot showing the charge retention by the bi-directional disturb scheme compared to a uni-directional disturb scheme, in accordance with some embodiments.

FIG. 16 illustrates plot 1600 showing the charge retention by the bi-directional disturb scheme compared to uni-directional disturb scheme, in accordance with some embodiments. Here, x-axis is number of disturb cycles while the y-axis is "dp", which refers to capacitor polarization density. Plot 1600 shows two cures 1601 and 1602. Curve 1601 shows that the scheme of bi-directional disturbs where a write operation comprises a write phase and a write cure phase, and where a read operation includes a read cure phase after a read phase. In the scheme of bi-directional disturbs, the charge on the unselected capacitors of the same bit-cell remains largely undisturbed. Conversely, curve 1602 illustrates the scheme of uni-directional disturbs where there is no write cure phase or read cure phase. In that case, the charge on the unselected capacitors of the same bit-cell is disturb as the number of disturb cycles (e.g., read or write cycles) increases.

Figure 17:
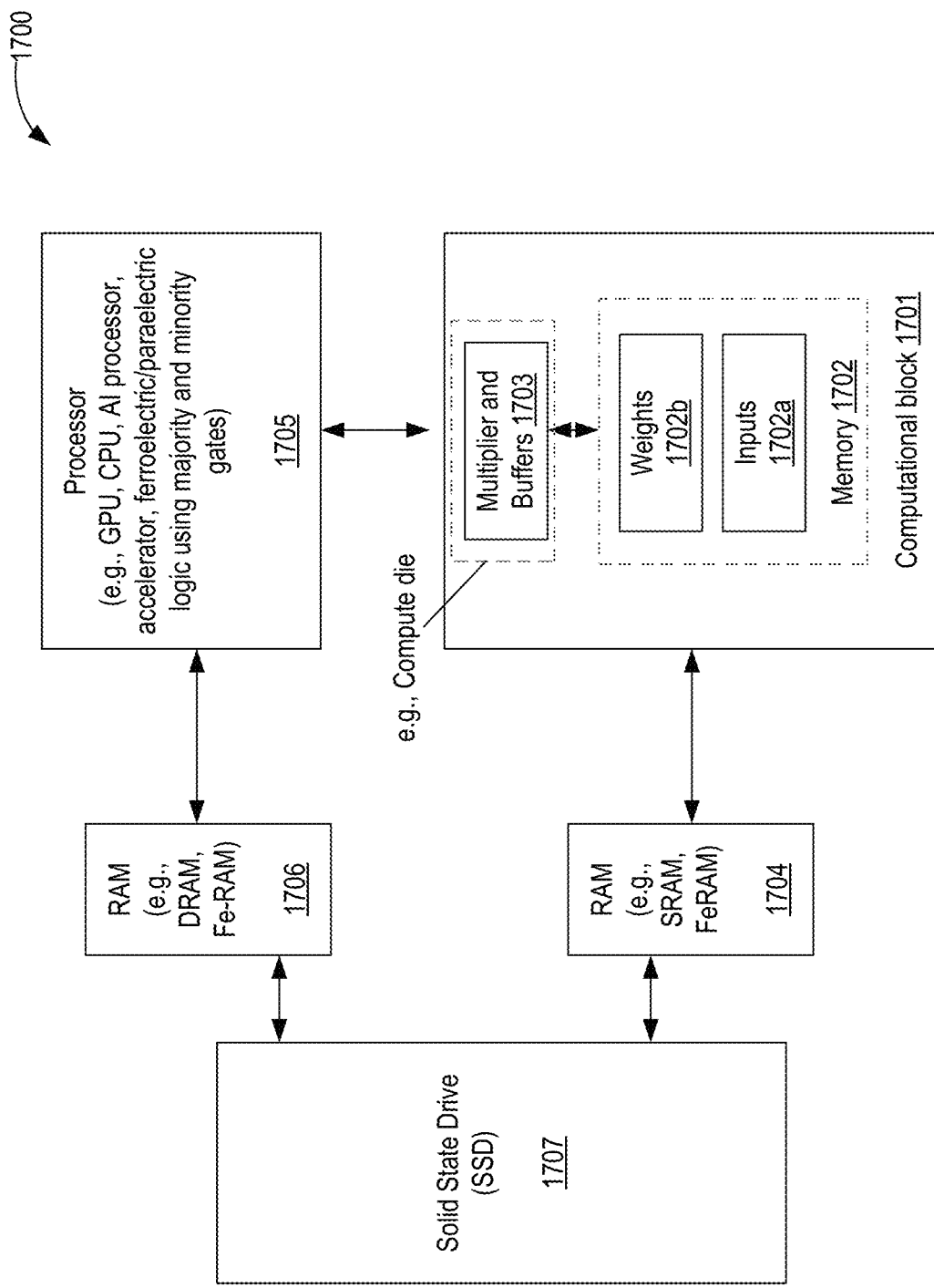
FIG. 17 illustrates a high-level architecture of an artificial intelligence (AI) machine comprising a compute die stacked with a memory die, wherein the compute die includes 1TnC or multi-element FE gain bit-cell with disturb mitigation scheme, in accordance with some embodiments.

FIG. 17 illustrates a high-level architecture of an artificial intelligence (AI) machine 1700 comprising a compute die stacked with a memory die, wherein the compute die includes 1TnC or multi-element FE gain bit-cell with disturb mitigation scheme, in accordance with some embodiments. AI machine 1700 comprises computational block 1701 or processor having random-access memory (RAM) 1702, and multiplier and buffers 1703; first random-access memory 1704 (e.g., static RAM (SRAM), ferroelectric or paraelectric RAM (FeRAM), ferroelectric or paraelectric static random-access memory (FeSRAM)), main processor 1705, second random-access memory 1706 (dynamic RAM (DRAM), FeRAM), and solid-state memory or drive (SSD) 1707. In some embodiments, some, or all components of AI machine 1700 are packaged in a single package forming a system-on-chip (SoC). The SoC can be configured as a logic-on-logic configuration, which can be in a 3D configuration or a 2.5D configuration.

In some embodiments, computational block 1701 is packaged in a single package and then coupled to processor 1705 and memories 1704, 1706, and 1707 on a printed circuit board (PCB). In some embodiments, computational block 1701 is configured as a logic-on-logic configuration, which can be in a 3D configuration or a 2.5D configuration. In some embodiments, computational block 1701 comprises a special purpose compute die 1703 or microprocessor. For example, compute die 1703 is a compute chiplet that performs a function of an accelerator or inference. In some embodiments, memory 1702 is DRAM which forms a special memory/cache for the special purpose compute die 1703. The DRAM can be embedded DRAM (eDRAM) such as 1T1C (one transistor and one capacitor) based memories. In some embodiments, RAM 1702 is ferroelectric or paraelectric RAM (Fe-RAM).

In some embodiments, compute die 1703 is specialized for applications such as Artificial Intelligence, graph processing, and algorithms for data processing. In some embodiments, compute die 1703 further has logic computational blocks, for example, for multipliers and buffers, a special data memory block (e.g., buffers) comprising DRAM, FeRAM, or a combination of them. In some embodiments, RAM 1702 has weights and inputs stored to improve the computational efficiency. The interconnects between processor 1705 (also referred to as special purpose processor), first RAM 1704 and compute die 1703 are optimized for high bandwidth and low latency. The architecture of FIG. 17 allows efficient packaging to lower the energy, power, or cost and provides for ultra-high bandwidth between RAM 1704 and compute chiplet 1703 of computational block 1701.

In some embodiments, RAM 1702 is partitioned to store input data (or data to be processed) 1702a and weight factors 1702b. In some embodiments, input data 1702a is stored in a separate memory (e.g., a separate memory die) and weight factors 1702b are stored in a separate memory (e.g., separate memory die).

In some embodiments, computational logic, or compute chiplet 1703 comprises matrix multiplier, adder, concatenation logic, buffers, and combinational logic. In various embodiments, compute chiplet 1703 performs multiplication operation on inputs 1702a and weights 1702b. In some embodiments, weights 1702b are fixed weights. For example, processor 1705 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 1702. In various embodiments, the input data that is to be analyzed using a trained model is processed by computational block 1701 with computed weights 1702b to generate an output (e.g., a classification result).

In some embodiments, first RAM 1704 is ferroelectric or paraelectric based SRAM. For example, a six transistor (6T)

SRAM bit-cells having ferroelectric or paraelectric transistors are used to implement a non-volatile FeSRAM. In some embodiments, SSD 1707 comprises NAND flash cells. In some embodiments, SSD 1707 comprises NOR flash cells. In some embodiments, SSD 1707 comprises multi-threshold NAND flash cells.

In various embodiments, the non-volatility of FeRAM is used to introduce new features such as security, functional safety, and faster reboot time of AI machine 1700. The non-volatile FeRAM is a low power RAM that provides fast access to data and weights. FeRAM 1704 can also serve as a fast storage for computational block 1701 (which can be an inference die or an accelerator), which typically has low capacity and fast access requirements.

In various embodiments, FeRAM (FeDRAM or FeSRAM) includes ferroelectric or paraelectric material. The ferroelectric or paraelectric material may be in a transistor gate stack or in a capacitor of the memory. The ferroelectric material can be any suitable low voltage FE material discussed with reference to various embodiments. While embodiments here are described with reference to ferroelectric material, the embodiments are applicable to any of the nonlinear polar materials described herein.

Figure 18:
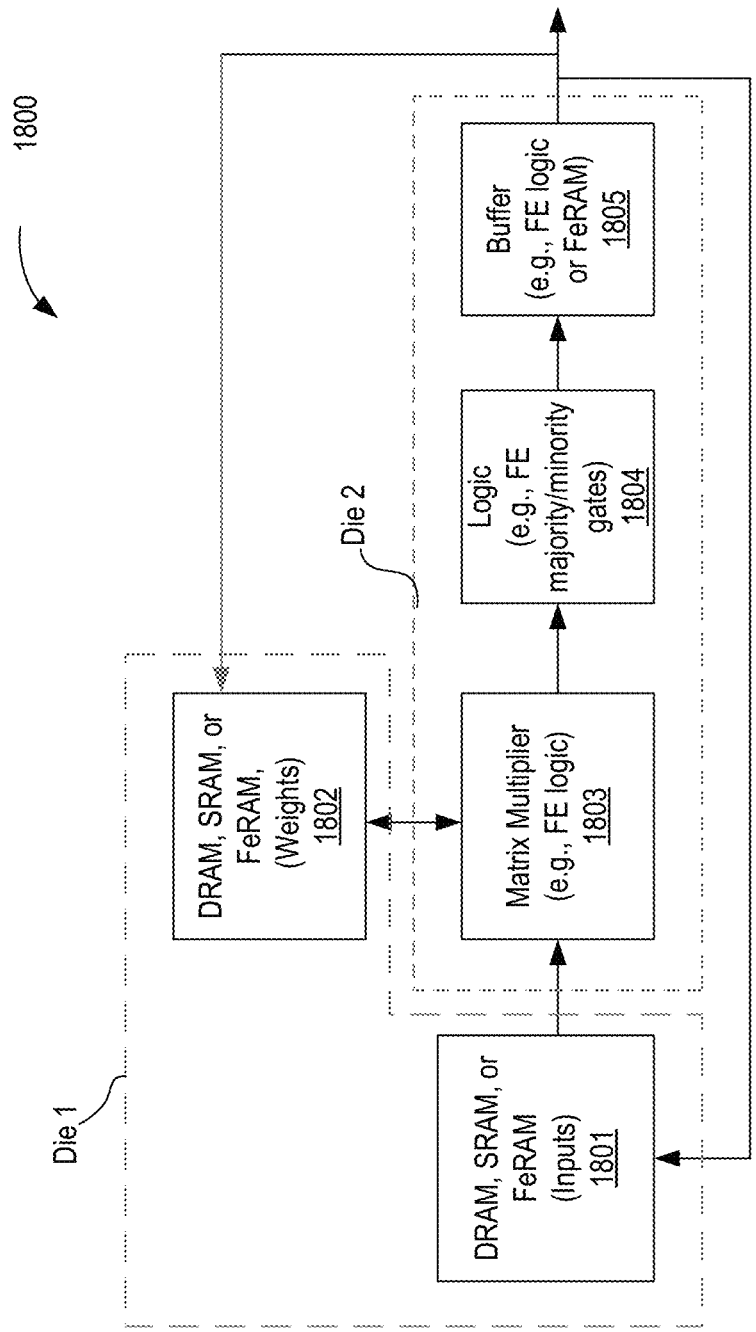
FIG. 18 illustrates an architecture of a computational block comprising a compute die stacked with a memory die, wherein the compute die includes 1TnC or multi-element FE gain bit-cell with disturb mitigation scheme, in accordance with some embodiments.

FIG. 18 illustrates an architecture of a computational block 1800 comprising a compute die stacked with a memory die, wherein the compute die includes 1TnC or multi-element FE gain bit-cell with disturb mitigation scheme, in accordance with some embodiments. The architecture of FIG. 18 illustrates an architecture for a special purpose compute die where RAM memory buffers for inputs and weights are split on die-1 and logic and optional memory buffers are split on die-2.

In some embodiments, memory die (e.g., Die 1) is positioned below a compute die (e.g., Die 2) such that a heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 1801 to store input data and a second die 1802 to store weight factors. In some embodiments, the memory die is a single die that is partitioned such that first partition 1801 of the memory die is used to store input data and second partition 1802 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 1801 and 1802, or memory dies 1801 and 1802 include one or more of: DRAM, FE-SRAM, FE-DRAM, SRAM, and/or MRAM. In some embodiments, the input data stored in memory partition or die 1801 is the data to be analyzed by a trained model with fixed weights stored in memory partition or die 1802.

In some embodiments, the compute die comprises ferroelectric or paraelectric logic (e.g., majority, minority, and/or threshold gates) to implement matrix multiplier 1803, logic 1804, and temporary buffer 1805. Matrix multiplier 1803 performs multiplication operation on input data 'X' and weights 'W' to generate an output 'Y'. This output may be further processed by logic 1804. In some embodiments, logic 1804 performs a threshold operation, pooling and drop out operations, and/or concatenation operations to complete the AI logic primitive functions.

In some embodiments, the output of logic 1804 (e.g., processed output 'Y') is temporarily stored in buffer 1805. In some embodiments, buffer 1805 is memory such as one or more of: DRAM, Fe-SRAM, Fe-DRAM, MRAM, resistive RAM (Re-RAM), and/or SRAM. In some embodiments, buffer 1805 is part of the memory die (e.g., Die 1). In some embodiments, buffer 1805 performs the function of a re-timer. In some embodiments, the output of buffer 1805 (e.g., processed output 'Y') is used to modify the weights in memory partition or die 1802. In one such embodiment, computational block 1800 not only operates as an inference circuitry, but also as a training circuitry to train a model. In some embodiments, matrix multiplier 1803 includes an array of multiplier cells, wherein DRAMs 1801 and 1802 include arrays of memory bit-cells, respectively, wherein each multiplier cell is coupled to a corresponding memory bit-cell of DRAM 1801 and/or DRAM 1802. In some embodiments, computational block 1800 comprises an interconnect fabric coupled to the array of multiplier cells such that each multiplier cell is coupled to the interconnect fabric.

Architecture 1800 provides reduced memory access for the compute die (e.g., die 2) by providing data locality for weights, inputs, and outputs. In one example, data from and to the AI computational blocks (e.g., matrix multiplier 1803) is locally processed within a same packaging unit. Architecture 1800 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 19:
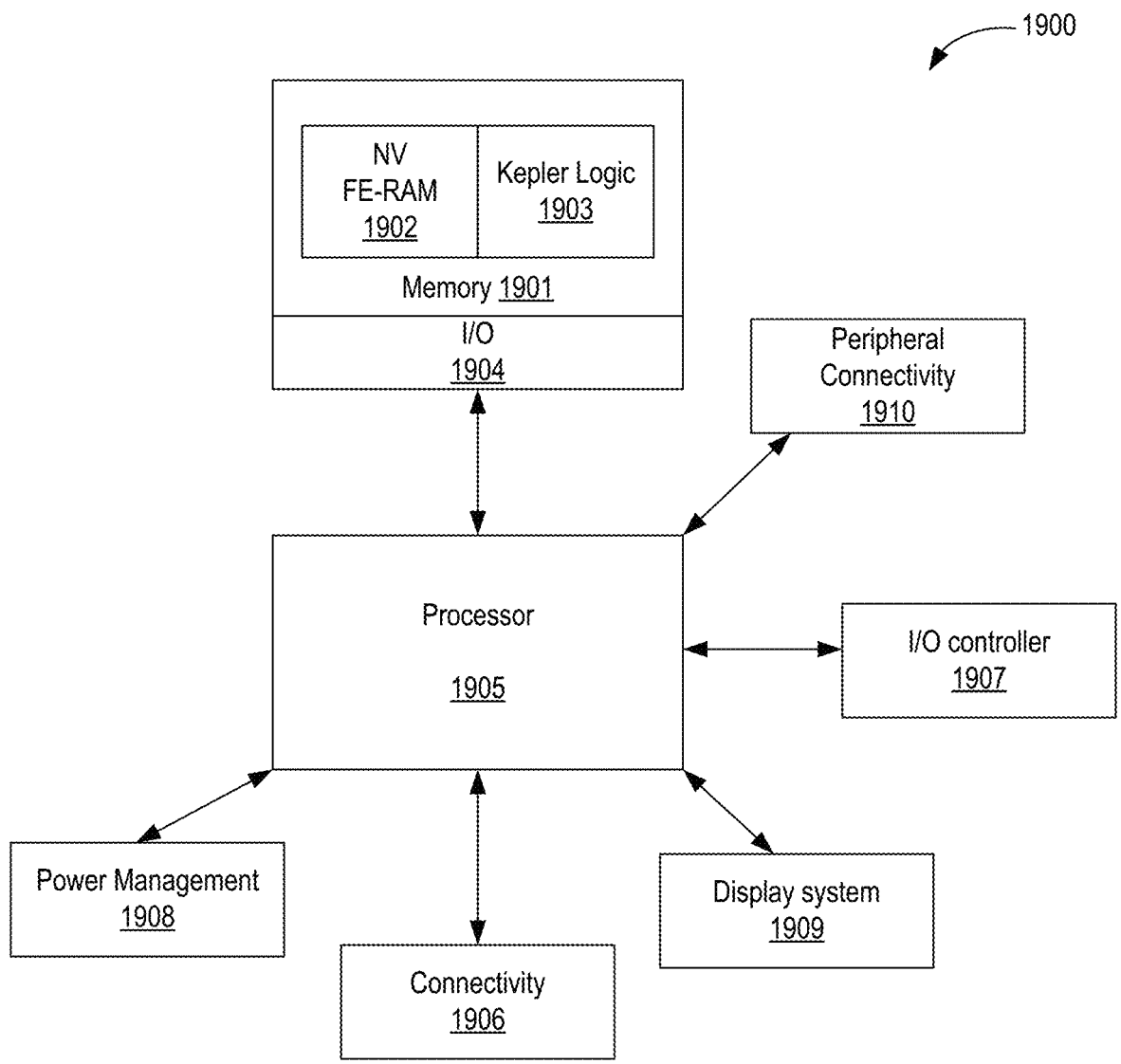
FIG. 19 illustrates a system-on-chip (SOC) that uses 1TnC or multi-element FE gain bit-cell with disturb mitigation scheme, in accordance with some embodiments.

FIG. 19 illustrates a system-on-chip (SOC) 1900 that uses 1TnC or multi-element FE gain bit-cell with disturb mitigation scheme, in accordance with some embodiments. SoC 1900 comprises memory 1901 having static random-access memory (SRAM) or FE based random-access memory FE-RAM, or any other suitable memory. The memory can be non-volatile (NV) or volatile memory. Memory 1901 may also comprise logic 1903 to control memory 1902. For example, write and read drivers are part of logic 1903. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 1904. The interface may be a double-data rate (DDR) compliant interface or any other suitable interface to communicate with a processor. Processor 1905 of SoC 1900 can be a single core or multiple core processor. Processor 1905 can be a general-purpose processor (CPU), a digital signal processor (DSP), or an Application Specific Integrated Circuit (ASIC) processor. In some embodiments, processor 1905 is an artificial intelligence (AI) processor (e.g., a dedicated AI processor, a graphics processor configured as an AI processor). In various embodiments, processor 1905 executes instructions that are stored in memory 1901.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 1905 may be coupled to a number of other chiplets that can be on the same die as SoC 1900 or on separate dies. These chiplets include connectivity circuitry 1906, I/O controller 1907, power management 1908, display system 1909, and peripheral connectivity 1906.

Connectivity 1906 represents hardware devices and software components for communicating with other devices. Connectivity 1906 may support various connectivity circuitries and standards. For example, connectivity 1906 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1906 may support non-cellular standards such as WiFi.

I/O controller 1907 represents hardware devices and software components related to interaction with a user. I/O controller 1907 is operable to manage hardware that is part of an audio subsystem and/or display subsystem. For example, input through a microphone or other audio device can provide input or commands for one or more applications or functions of SoC 1900. In some embodiments, I/O controller 1907 illustrates a connection point for additional devices that connect to SoC 1900 through which a user might interact with the system. For example, devices that can be attached to the SoC 1900 might include microphone devices, speaker or stereo systems, video systems or other display devices, keyboard or keypad devices, or other I/O devices for use with specific applications such as card readers or other devices.

Power management 1908 represents hardware or software that performs power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1908 may accordingly put such logic into low power state without the worry of losing data. Power management may select a power state according to Advanced Configuration and Power Interface (ACPI) specification for one or all components of SoC 1900.

Display system 1909 represents hardware (e.g., display devices) and software (e.g., drivers) components that provide a visual and/or tactile display for a user to interact with the processor 1905. In some embodiments, display system 1909 includes a touch screen (or touch pad) device that provides both output and input to a user. Display system 1909 may include a display interface, which includes the particular screen or hardware device used to provide a display to a user. In some embodiments, the display interface includes logic separate from processor 1905 to perform at least some processing related to the display.

Peripheral connectivity 1910 may represent hardware devices and/or software devices for connecting to peripheral devices such as printers, chargers, cameras, etc. In some embodiments, peripheral connectivity 1910 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 1900 includes a coherent cache or memory-side buffer chiplet (not shown) which includes ferroelectric or paraelectric memory. The coherent cache or memory-side buffer chiplet can be coupled to processor 1905 and/or memory 1901 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis, or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Here, the term "stack and fold" generally refers to a configuration of devices that are stacked vertically (substantially directly above or with a horizontal offset) such that one terminal of the devices is shared to a common node, and further the capacitors are placed along both sides of the common node. The common node thus becomes a point of fold. In various embodiments, the devices here are capacitors. The embodiments are not limited to capacitors and are applicable to any devices with a common node. In some embodiments, N number of capacitors can be divided in L number of stack layers such that there are N/L capacitors in each stacked layer. The N/L capacitor's one terminal can be shorted together with an electrode (e.g., bottom electrode). In some embodiments, the electrode can be metal, a conducting oxide, or a combination of a conducting oxide and a barrier (or insulative material). In some embodiments, the capacitors are stacked and folded, and also vertically offset relative to lower capacitors in the stack. The offset allows for routing metal electrodes coupled to the top electrodes of the capacitors through space created by the offset while reducing parasitic to the capacitor(s) underneath. As such, the various metal electrodes are parallel to one another with limited jogs, for example. In some embodiments, the capacitors are staggered while sharing a same bottom electrode or shared metal layer. The capacitors are staggered by having offsets in the x-direction and a y-direction relative to one another. The offsets allow for routing metal electrodes coupled to the top electrodes of the capacitors through space created by the offset. As such, the various metal electrodes are parallel to one another with limited jogs, for example. The various embodiments here can be combined with other embodiments. Hence, all possible permutations of combinations are not shown, but are within the scope of this disclosure.

Here the term "staggered configuration" or "staggered" generally refers to placement of devices (e.g., capacitors) relative to one another such that the devices are offset from one another in a horizontal plane and/or a vertical plane. When devices are offset in a horizontal plane, the devices may be diagonally away from one another (e.g., having an x-offset and a y-offset in a x-y horizontal plane). When devices are offset in a vertical plane, the devices may be diagonally away from one another (e.g., having an x-offset and a z-offset in a x-z vertical plane). In some examples, the devices can be staggered both horizontally and vertically. In some examples, the devices are staggered horizontally. In some embodiments, the devices are staggered vertically.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method(s) of forming those structures or apparatuses, and method(s) of operation of these structures or apparatuses. Following examples are provided that illustrate the various embodiments. The examples can be combined with other examples. As such, various embodiments can be combined with other embodiments without changing the scope of the invention.

Example 1: An apparatus comprising: a transistor having a gate terminal coupled to a word-line, a source terminal couple to a bit-line, and a drain terminal coupled to a storage node; a plurality of capacitors having a first terminal coupled to the storage node, wherein a second terminal of an individual capacitor of the plurality of capacitors is coupled to an individual plate-line; and a circuitry to perform a first write operation during a first phase on a selected capacitor of the plurality of capacitors, wherein the circuitry is to perform a second write operation during a second phase, wherein the second write operation mitigates write disturb effects on unselected capacitors of the plurality of capacitors.

Example 2: The apparatus of example 1, wherein second write operation is complementary or inverted form of the first write operation.

Example 3: The apparatus of example 1, wherein the first write operation and the second write operation are separated by zero or more cycles where the word-line, the bit-line, and the individual plate-line are pulled to ground.

Example 4: The apparatus of example 1, wherein the first phase is before the second phase.

Example 5: The apparatus of example 1, wherein the second phase is before the first phase.

Example 6: The apparatus of example 1, wherein the word-line is boosted in the first phase and the second phase.

Example 7: The apparatus of example 1, wherein a plate-line, in the second phase, coupled to the selected capacitor is set to substantially half of a voltage on a power supply rail.

Example 8: The apparatus of example 7, wherein the plate-line of the selected capacitor is pulsed to the voltage on the power supply rail in the first phase to program the selected capacitor.

Example 9: The apparatus of example 1, wherein the individual plate-line coupled to the individual capacitor is set to substantially half of a voltage on a power supply rail in the second phase.

Example 10: The apparatus of example 1, wherein the individual capacitor includes a top electrode which is coupled to the individual plate-line.

Example 11: The apparatus of example 10, wherein the top electrode is coupled to the individual plate-line using a pedestal.

Example 12: The apparatus of example 1, wherein the individual capacitor includes: a first layer coupled to a bottom electrode which is coupled to the storage node, wherein the first layer comprises a first refractive inter-metallic material; a second layer on the first layer, wherein the second layer comprises a first conductive oxide; a third layer comprising non-linear polar material, wherein the third layer is on the second layer; a fourth layer on the third layer, wherein the fourth layer comprises a second conductive oxide; and a fifth layer on the fourth layer, wherein the fifth layer comprises a second refractive inter-metallic material, wherein the individual plate-line is coupled to the fifth layer.

Example 13: The apparatus of example 12, wherein: the first refractive inter-metallic material and the second refractive inter-metallic material include one or more of Ta, Ti, Al, W, Ni, Ga, Mn, Fe, B, C, N, or Co; and the first conductive oxide and the second conductive oxide include one or more of: Ir, In, Fe, Ru, Pd, Os, or Re, wherein the apparatus comprises a sixth layer adjacent to side walls of the first layer, the second layer, the third layer, and the fourth layer, wherein the sixth layer includes one of: Ti—Al—O, $Al_2O_3$, or MgO.

Example 14: The apparatus of example 1, wherein the individual capacitor includes: a first layer coupled to a bottom electrode which is coupled to the storage node, wherein the first layer comprises a first conductive oxide; a second layer comprising non-linear polar material, wherein the second layer is on the first layer; and a third layer on the second layer, wherein the third layer comprises a second conductive oxide, wherein the individual plate-line is coupled to the third layer.

Example 15: The apparatus of example 1, wherein the individual plate-line is parallel to the word-line.

Example 16: The apparatus of example 1, wherein the plurality of capacitors comprises non-linear polar material.

Example 17: The apparatus of example 16, wherein the non-linear polar material includes one of: bismuth ferrite (BFO), BFO with a doping material wherein the doping material is one of lanthanum, or elements from lanthanide series of periodic table; lead zirconium titanate (PZT), or PZT with a doping material, wherein the doping material is one of La or Nb; a relaxor ferroelectric which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite which includes one of: $BaTiO_3$, $PbTiO_3$, $KNbO_3$, or $NaTaO_3$; a hexagonal ferroelectric which includes one of: $YMnO_3$, or $LuFeO_3$; hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; hafnium oxides as $Hf_{(1-x)}E_xO_y$, where E can be Al, Ca, Ce, Dy, Er, Gd, Ge, La, Sc, Si, Sr, Sn, or Y; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, y doped $HfO_2$, where x includes one of: Al, Ca, Ce, Dy, Er, Gd, Ge, La, Sc, Si, Sr, Sn, or Y, wherein 'x' is a fraction; Niobate type compounds $LiNbO_3$, $LiTaO_3$, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

Example 18: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; a plurality of capacitors having a first terminal coupled to the storage node, wherein a second terminal of an individual capacitor of the plurality of capacitors is coupled to an individual plate-line; and a circuitry to perform a first write operation during a first phase on a selected capacitor of the plurality of capacitors, wherein the circuitry is to perform a second write operation during a second phase, and wherein second write operation is complementary or inverted form of the first write operation.

Example 19: The apparatus of example 18, wherein the first write operation and the second write operation are separated by zero or more cycles where the word-line, the bit-line, and the individual plate-line are pulled to ground.

Example 20: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes: a transistor having a gate terminal coupled to a word-line, a source terminal couple to a bit-line, and a drain terminal coupled to a storage node; a plurality of capacitors having a first terminal coupled to the storage node, wherein a second terminal of an individual capacitor of the plurality of capacitors is coupled to an individual plate-line; and a circuitry to perform a first write operation during a first phase on a selected capacitor of the plurality of capacitors, wherein the circuitry is to perform a second write operation during a second phase, wherein the second write operation mitigates write disturb effects on unselected capacitors of the plurality of capacitors.

Example 1a: An apparatus comprising: a transistor having a gate terminal coupled to a word-line, a source terminal couple to a bit-line, and a drain terminal coupled to a storage node; a plurality of capacitors having a first terminal coupled to the storage node, wherein a second terminal of an individual capacitor of the plurality of capacitors is coupled to an individual plate-line; and one or more circuitries to perform a first read operation during a first phase on a selected capacitor of the plurality of capacitors, wherein the one or more circuitries is to perform a second read operation during a second phase, wherein the second read operation mitigates read disturb effects on unselected capacitors of the plurality of capacitors.

Example 2a: The apparatus of example 1a, wherein the one or more circuitries is to ramp a voltage on a plate-line coupled to the selected capacitor in a staircase fashion on a supply voltage level during the first phase, and to set the voltage on the plate-line of the selected capacitor to a ground voltage level in the second phase.

Example 3a: The apparatus of example 2a, wherein the one or more circuitries is to set the bit-line to a high-impedance state during a time when the voltage on the plate-line of the selected capacitor is between the supply voltage level and the ground voltage level.

Example 4a: The apparatus of example 2a, wherein the one or more circuitries is to set voltages on plate-lines coupled to the unselected capacitors to be between the supply voltage level and the ground voltage level during the first phase and the second phase.

Example 5a: The apparatus of example 1a, wherein a voltage on the word-line is set to a supply voltage level or a boosted supply voltage level during the first phase and the second phase.

Example 6a: The apparatus of example 1a, wherein the one or more circuitries is to perform a writeback operation after the second read operation.

Example 7a: The apparatus of example 6a, wherein the writeback operation and the second read operation are separated by one or more cycles where the word-line, the bit-line, and the individual plate-line are pulled to ground.

Example 8a: The apparatus of example 6a, wherein the one or more circuitries is to perform a first write operation during a third phase on the selected capacitor of the plurality of capacitors, wherein the one or more circuitries is to perform a second write operation during a fourth phase, wherein the second write operation mitigates write disturb effects on unselected capacitors of the plurality of capacitors.

Example 9a: The apparatus of example 8a, wherein the first write operation or the second write operation is after the second read operation.

Example 10a: The apparatus of example 8a, wherein the first write operation and the second write operation are separated by one or more cycles where the word-line, the bit-line, and the individual plate-line are pulled to ground.

Example 11a: The apparatus of example 8a, wherein the third phase is before the fourth phase.

Example 12a: The apparatus of example 8a, wherein the fourth phase is before the third phase.

Example 13a: The apparatus of example 8a, wherein the word-line is boosted in the third phase and the fourth phase.

Example 14a: The apparatus of example 13a, wherein a plate-line, in the fourth phase, coupled to the selected capacitor is set to substantially half of a voltage on a power supply rail.

Example 15a: The apparatus of example 14a, wherein the plate-line of the selected capacitor is pulsed to the voltage on the power supply rail in the third phase to program the selected capacitor.

Example 16a: The apparatus of example 8a, wherein the individual plate-line coupled to the individual capacitor is set to substantially half of a voltage on a power supply rail in the fourth phase.

Example 17a: The apparatus of example 1a, wherein the individual capacitor includes non-polar linear material.

Example 18a: An apparatus comprising: a first transistor having a first gate terminal coupled to a word-line, a first source terminal couple to a bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; a plurality of capacitors having a first terminal coupled to the storage node, wherein a second terminal of an individual capacitor of the plurality of capacitors is coupled to an individual plate-line; and one or more circuitries to perform a first read operation during a first phase on a selected capacitor of the plurality of capacitors, wherein the one or more circuitries is to perform a second read operation during a second phase, wherein the second read operation mitigates read disturb effects on unselected capacitors of the plurality of capacitors.

Example 19a: The apparatus of example 18a, wherein the one or more circuitries is to provide a first pulse on the word-line during the first phase, and to provide a second pulse on the word-line during the second phase, wherein the first pulse and the second pulse have a voltage level substantially equal to a supply voltage level or a boosted supply voltage level.

Example 20a: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes: a transistor having a gate terminal coupled to a word-line, a source terminal couple to a bit-line, and a drain terminal coupled to a storage node; a plurality of capacitors having a first terminal coupled to the storage node, wherein a second terminal of an individual capacitor of the plurality of capacitors is coupled to an individual plate-line; and one or more circuitries to perform a first read operation during a first phase on a selected capacitor of the plurality of capacitors, wherein the one or more circuitries is to perform a second read operation during a second phase, wherein the second read operation mitigates read disturb effects on unselected capacitors of the plurality of capacitors.

Example 1b: An apparatus comprising: a transistor having a gate terminal coupled to a word-line, a source terminal couple to a bit-line, and a drain terminal coupled to a storage node; a plurality of capacitors having a first terminal coupled to the storage node, wherein a second terminal of an individual capacitor of the plurality of capacitors is coupled to an individual plate-line; and a circuitry to perform a first write operation during a first phase on a selected capacitor of the plurality of capacitors, wherein the circuitry is to perform a second write operation during a second phase, wherein the second write operation mitigates write disturb effects on unselected capacitors of the plurality of capacitors, wherein a voltage on the bit-line is set to between a power supply level and a ground voltage level during the first phase.

Example 2b: The apparatus of example 1b, wherein the voltage on the bit-line is set to be at substantially the ground voltage level during the second phase, wherein the second write operation is a logic 0 write operation.

Example 3b: The apparatus of example 1b, wherein the voltage on the bit-line is set to ⅔ of the power supply level during the first phase.

Example 4b: The apparatus of example 1b, wherein the first phase is before the second phase.

Example 5b: The apparatus of example 1b, wherein the second phase is before the first phase.

Example 6b: The apparatus of example 1b, wherein the word-line is boosted in the first phase and the second phase.

Example 7b: The apparatus of example 1b, wherein a plate-line, in the second phase, coupled to the selected capacitor is set to substantially the power supply level.

Example 8b: The apparatus of example 7b, wherein the plate-line, in the first phase, coupled to the selected capacitor is set to substantially one-third of the power supply level.

Example 9b: The apparatus of example 1b, wherein the individual plate-line coupled to the individual capacitor is set to substantially one-third of the power supply level in the first phase and the second phase.

Example 10b: The apparatus of example 1b, wherein the individual plate-line coupled to the individual capacitor is set to substantially a voltage between the power supply level and the ground voltage level in the first phase and the second phase.

Example 11b: The apparatus of example 1b, wherein the bit-line is column multiplexed.

Example 12b: The apparatus of example 1b, wherein the plurality of capacitors comprise non-linear polar material.

Example 13b: The apparatus of example 12b, wherein the non-linear polar material includes any of the materials discussed herein with reference to the non-linear polar material (e.g., ferroelectric, paraelectric, or non-linear dielectric materials).

Example 14b: The apparatus of example 1b, wherein the individual capacitor includes: a first layer coupled to a bottom electrode which is coupled to the storage node, wherein the first layer comprises a first refractive inter-metallic material; a second layer on the first layer, wherein the second layer comprises a first conductive oxide; a third layer comprising non-linear polar material, wherein the third layer is on the second layer; a fourth layer on the third layer, wherein the fourth layer comprises a second conductive oxide; and a fifth layer on the fourth layer, wherein the fifth layer comprises a second refractive inter-metallic material, wherein the individual plate-line is coupled to the fifth layer.

Example 15b: The apparatus of example 14b, wherein: the first refractive inter-metallic material and the second refractive inter-metallic material include one or more of Ta, Ti, Al, W, Ni, Ga, Mn, Fe, B, C, N, or Co; and the first conductive oxide and the second conductive oxide include one or more of: Ir, In, Fe, Ru, Pd, Os, or Re, wherein the apparatus comprises a sixth layer adjacent to side walls of the first layer, the second layer, the third layer, and the fourth layer, wherein the sixth layer includes one of: Ti—Al—O, $Al_2O_3$, or MgO.

Example 16b: The apparatus of example 1b, wherein the individual capacitor includes: a first layer coupled to a bottom electrode which is coupled to the storage node, wherein the first layer comprises a first conductive oxide; a second layer comprising non-linear polar material, wherein the second layer is on the first layer; and a third layer on the second layer, wherein the third layer comprises a second conductive oxide, wherein the individual plate-line is coupled to the third layer.

Example 17b: The apparatus of example 1b, wherein the individual plate-line is parallel to the word-line.

Example 18b: An apparatus comprising: a transistor having a gate terminal coupled to a word-line, a source terminal couple to a bit-line, and a drain terminal coupled to a storage node; a plurality of capacitors having a first terminal coupled to the storage node, wherein a second terminal of an individual capacitor of the plurality of capacitors is coupled to an individual plate-line; and a circuitry to perform a first write operation during a first phase on a selected capacitor of the plurality of capacitors, wherein the circuitry is to perform a second write operation during a second phase, wherein the second write operation mitigates write disturb effects on unselected capacitors of the plurality of capacitors, wherein a voltage on the bit-line is higher in the first phase than in the second phase.

Example 19b: The apparatus of example 18b, wherein the bit-line is column multiplexed.

Example 20b: A system comprising: a processor circuitry to execute one or more instructions; a memory circuitry to store the one or more instructions; and a communication interface to allow the processor circuitry to communicate with another device, wherein the memory circuitry includes a plurality of bit-cells organized in a memory array, wherein an individual bit-cell of the plurality of bit-cells includes: a transistor having a gate terminal coupled to a word-line, a source terminal couple to a bit-line, and a drain terminal coupled to a storage node; a plurality of capacitors having a first terminal coupled to the storage node, wherein a second terminal of an individual capacitor of the plurality of capacitors is coupled to an individual plate-line; and a circuitry to perform a first write operation during a first phase on a selected capacitor of the plurality of capacitors, wherein the circuitry is to perform a second write operation during a second phase, wherein the second write operation mitigates write disturb effects on unselected capacitors of the plurality of capacitors, wherein a voltage on the bit-line is set to between a power supply level and a ground voltage level during the first phase.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a transistor having a gate terminal coupled to a word-line, a source terminal couple to a bit-line, and a drain terminal coupled to a storage node;
a plurality of capacitors having a first terminal coupled to the storage node, wherein a second terminal of an individual capacitor of the plurality of capacitors is coupled to an individual plate-line; and
one or more circuitries to perform a first read operation during a first phase on a selected capacitor of the plurality of capacitors, wherein the one or more circuitries is to perform a second read operation during a second phase, wherein the second read operation mitigates read disturb effects on unselected capacitors of the plurality of capacitors, wherein the one or more circuitries is to ramp a voltage on a plate-line coupled to the selected capacitor in a staircase fashion to a supply voltage level during the first phase, wherein the one or more circuitries is to perform a writeback operation after the second read operation, and wherein the writeback operation and the second read operation are separated by one or more cycles where the word-line, the bit-line, and the individual plate-line are pulled to ground.

2. The apparatus of claim 1, wherein the one or more circuitries is to set the voltage on the plate-line of the selected capacitor to a ground voltage level in the second phase.

3. The apparatus of claim 2, wherein the one or more circuitries is to set the bit-line to a high-impedance state during a time when the voltage on the plate-line of the selected capacitor is between the supply voltage level and the ground voltage level.

4. The apparatus of claim 2, wherein the one or more circuitries is to set voltages on plate-lines coupled to the unselected capacitors to be between the supply voltage level and the ground voltage level during the first phase and the second phase.

5. The apparatus of claim 1, wherein a voltage on the word-line is set to the supply voltage level or a boosted supply voltage level during the first phase and the second phase.

6. The apparatus of claim 1, wherein the one or more circuitries is to perform a first write operation during a third phase on the selected capacitor of the plurality of capacitors, wherein the one or more circuitries is to perform a second write operation during a fourth phase, and wherein the second write operation mitigates write disturb effects on the unselected capacitors of the plurality of capacitors.

7. The apparatus of claim 6, wherein the first write operation or the second write operation is after the second read operation.

8. The apparatus of claim 6, wherein the first write operation and the second write operation are separated by one or more cycles where the word-line, the bit-line, and the individual plate-line are pulled to the ground.

9. The apparatus of claim 6, wherein the third phase is before the fourth phase.

10. The apparatus of claim 6, wherein the fourth phase is before the third phase.

11. The apparatus of claim 6, wherein the word-line is boosted in the third phase and the fourth phase.

12. The apparatus of claim 11, wherein a plate-line, in the fourth phase, coupled to the selected capacitor is set to substantially half of a voltage on a power supply rail.

13. The apparatus of claim 12, wherein the plate-line of the selected capacitor is pulsed to the voltage on the power supply rail in the third phase to program the selected capacitor.

14. The apparatus of claim 6, wherein the individual plate-line coupled to the individual capacitor is set to substantially half of a voltage on a power supply rail in the fourth phase.

15. The apparatus of claim 1, wherein the individual capacitor includes non-polar linear material.

16. An apparatus comprising:
- a first transistor having a first gate terminal coupled to a word-line, a first source terminal couple to a bit-line, and a first drain terminal coupled to a storage node;
- a second transistor coupled to the first transistor, wherein the second transistor includes a second gate terminal coupled to the storage node, a second source terminal couple to a sense line, and a second drain terminal coupled to a bias;
- a plurality of capacitors having a first terminal coupled to the storage node, wherein a second terminal of an individual capacitor of the plurality of capacitors is coupled to an individual plate-line; and
- one or more circuitries to perform a first read operation during a first phase on a selected capacitor of the plurality of capacitors, wherein the one or more circuitries is to perform a second read operation during a second phase, wherein the second read operation mitigates read disturb effects on unselected capacitors of the plurality of capacitors, wherein the one or more circuitries is to ramp a voltage on a plate-line coupled to the selected capacitor in a staircase fashion to a supply voltage level during the first phase, wherein the one or more circuitries is to set the voltage on the plate-line of the selected capacitor to a ground voltage level in the second phase, and wherein the one or more circuitries is to set the bit-line to a high-impedance state during a time when the voltage on the plate-line of the selected capacitor is between the supply voltage level and the ground voltage level.

17. The apparatus of claim 16, wherein the one or more circuitries is to provide a first pulse on the word-line during the first phase, and to provide a second pulse on the word-line during the second phase, and wherein the first pulse and the second pulse have a voltage level substantially equal to the supply voltage level or a boosted supply voltage level.

18. A system comprising:
- a processor circuitry to execute one or more instructions;
- a memory circuitry to store the one or more instructions; and
- a communication interface to allow the processor circuitry to communicate with another device, wherein the memory circuitry includes a plurality of bit-cells organized in a memory array, and wherein an individual bit-cell of the plurality of bit-cells includes:
  - a transistor having a gate terminal coupled to a word-line, a source terminal couple to a bit-line, and a drain terminal coupled to a storage node;
  - a plurality of capacitors having a first terminal coupled to the storage node, wherein a second terminal of an individual capacitor of the plurality of capacitors is coupled to an individual plate-line; and
  - one or more circuitries to perform a first read operation during a first phase on a selected capacitor of the plurality of capacitors, wherein the one or more circuitries is to perform a second read operation during a second phase, wherein the second read operation mitigates read disturb effects on unselected capacitors of the plurality of capacitors, wherein the one or more circuitries is to ramp a voltage on a plate-line coupled to the selected capacitor in a staircase fashion to a supply voltage level during the first phase, wherein the one or more circuitries is to set the voltage on the plate-line of the selected capacitor to a ground voltage level in the second phase, and wherein the one or more circuitries is to set voltages on plate-lines coupled to the unselected capacitors to be between the supply voltage level and the ground voltage level during the first phase and the second phase.

* * * * *